(12) United States Patent
Cheung et al.

(10) Patent No.: US 10,104,754 B2
(45) Date of Patent: *Oct. 16, 2018

(54) OSCILLATOR GENERATORS AND METHODS OF USING THEM

(71) Applicant: PERKINELMER HEALTH SCIENCES, INC., Waltham, MA (US)

(72) Inventors: Tak Shun Cheung, Toronto (CA); Chui Ha Cindy Wong, Markham (CA)

(73) Assignee: PerkinElmer Health Sciences, Inc., Waltham, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/476,092

(22) Filed: Mar. 31, 2017

(65) Prior Publication Data

US 2017/0339775 A1    Nov. 23, 2017

Related U.S. Application Data

(63) Continuation of application No. 15/140,294, filed on Apr. 27, 2016, now Pat. No. 9,635,750, which is a (Continued)

(51) Int. Cl.
*H01J 37/32* (2006.01)
*H05H 1/30* (2006.01)
*H05H 1/46* (2006.01)

(52) U.S. Cl.
CPC .............. *H05H 1/30* (2013.01); *H01J 37/321* (2013.01); *H01J 37/32174* (2013.01); *H05H 2001/4652* (2013.01); *H05H 2001/4682* (2013.01)

(58) Field of Classification Search
CPC .... H05H 1/30; H05H 2001/4682; H05H 1/46; H01J 37/32; H01J 37/321; H01J 37/32183; H01J 37/244; H01J 2237/05
(Continued)

(56) References Cited

U.S. PATENT DOCUMENTS

| 4,818,916 A | 4/1989 | Morrisroe |
| 5,155,547 A | 10/1992 | Casper |

(Continued)

FOREIGN PATENT DOCUMENTS

| EP | 0851572 | 7/1998 |
| WO | 2007134363 | 11/2007 |
| WO | 2015061391 | 4/2015 |

OTHER PUBLICATIONS

Extended European Search Report for EP14856677 dated Mar. 9, 2017.
(Continued)

*Primary Examiner* — Jimmy Vu
(74) *Attorney, Agent, or Firm* — Rhodes IP PLC; Christopher R. Rhodes

(57) ABSTRACT

Certain embodiments described herein are directed to generators that can be used to sustain a plasma. In some embodiments, the generator comprises an oscillation circuit configured to electrically couple to an induction device and provide power to the induction device in an oscillation mode to sustain the inductively coupled plasma in a torch body, the circuit configured to provide harmonic emission control during sustaining of the inductively coupled plasma in the torch body in the oscillation mode of the generator.

20 Claims, 32 Drawing Sheets

Related U.S. Application Data continuation-in-part of application No. 14/520,446, filed on Oct. 22, 2014, now Pat. No. 9,420,679.

(60) Provisional application No. 61/894,560, filed on Oct. 23, 2013.

(58) Field of Classification Search
USPC .......................................... 315/111.01–111.91
See application file for complete search history.

(56) References Cited

U.S. PATENT DOCUMENTS

| | | |
|---|---|---|
| 5,747,935 A | 5/1998 | Porter |
| 6,222,186 B1 | 4/2001 | Li |
| 7,459,899 B2 | 12/2008 | Mattaboni |
| 7,678,339 B2 | 3/2010 | Wira |
| 8,624,502 B2 * | 1/2014 | Rosenthal ............... H01J 27/18 |
| | | 250/423 R |
| 9,420,679 B2 | 8/2016 | Cheung |
| 9,635,750 B2 * | 4/2017 | Cheung ................... H05H 1/30 |
| 2002/0149445 A1 | 10/2002 | Chawla |
| 2006/0017388 A1 | 1/2006 | Stevenson |
| 2012/0277739 A1 | 1/2012 | Daw |

OTHER PUBLICATIONS

ISR/WO for PCT/US14/61682 dated Mar. 13, 2015.
ISR/WO for PCT/US2017/029596 dated Aug. 16, 2017.

* cited by examiner

| Parameters | NexION B86 Tube RFG | Hybrid Generator | Hybrid Generator |
|---|---|---|---|
| Load Coil | Original NexION Copper Helix Load Coil | | |
| RFG Mode | Oscillation 38MHz | Driven 34.82MHz | Oscillation 34.96 MHz |
| Be (9) | 8241.3 | 6653.2 | 10683.8 |
| Mg (24) | 66285.7 | 51242.4 | 60100.3 |
| In (114.9) | 57969.2 | 131660.9 | 132909.5 |
| U (238.1) | 43385.9 | 84380.4 | 99824.9 |
| CeO (155.9) | 767.7 (2.15%) | 2236.7 (2.02%) | 2238.1 (2.06%) |
| Ce (139.9) | 35646.4 | 110790.5 | 108568.2 |
| Ce++ (70.0) | 1605.2 (4.50%) | 1961.5 (1.78%) | 3113.6 (2.87%) |
| Bkgd (220) | 1.2 | 0.9 | 2 |
| Neb Gas Flow | 1.105 L/min | 1.020 L/min | 1.13 L/min |
| Aux Gas Flow | | 1.2 L/min | |
| Plasma Gas Flow | | 17 L/min | |

FIG. 35

OSCILLATOR GENERATORS AND METHODS OF USING THEM

PRIORITY APPLICATIONS

This application is related to, and is a continuation-in-part of, U.S. application Ser. No. 14/520,446 filed on Oct. 22, 2014. U.S. application Ser. No. 14/520,446 claims priority to U.S. Provisional Application No. 61/894,560 filed on Oct. 23, 2013. The entire disclosure of each of these applications is hereby incorporated herein by reference for all purposes.

TECHNOLOGICAL FIELD

This application is related to generators and methods of using them. More particularly, certain embodiments described herein are directed to a generator that is operative in one or more oscillations modes to sustain a plasma or other atomization/ionization device.

BACKGROUND

Generators are commonly used to sustain a plasma within a torch body. A plasma includes charged particles. Plasmas have many uses including atomizing and/or ionizing chemical species.

SUMMARY

Certain aspects, attributes and features are directed to generators that may be operated in one or more oscillation modes. The generator may be used to power many different types of devices including, but not limited to, induction devices.

In a first aspect, a generator configured to sustain an inductively coupled plasma in a torch body is provided. In certain configurations, the generator comprises a processor and an oscillation circuit electrically coupled to the processor, the oscillation circuit configured to electrically couple to an induction device and provide power to the induction device in an oscillation mode to sustain the inductively coupled plasma in the torch body, the circuit configured to provide harmonic emission control during sustaining of the inductively coupled plasma in the torch body in the oscillation mode of the generator is provided.

In certain examples, the circuit comprises a first transistor configured to electrically couple to the induction device. In other examples, the circuit further comprises a first driver electrically coupled to the first transistor and configured to electrically couple to the induction device. In some embodiments, the first driver is configured to electrically couple to the induction device through a first low pass filter. In other embodiments, the circuit further comprises a second driver electrically coupled to the second transistor and configured to electrically couple to the induction device. In some instances, the second driver is configured to electrically couple to the induction device through a second low pass filter. In other instances, each of the first low pass filter and the second low pass filter is configured to filter a feedback signal provided to the first power transistor and the second power transistor. In further examples, each of the first low pass filter and the second low pass filter comprise a high order ceramic low-pass filter. In some embodiments, the high order ceramic low pass filter is configured to provide at least a 20 dB cut off at 200 MHz or higher frequencies. In other examples, the circuit is configured to provide impedance matching within about three RF cycles. In some instances, the generator may comprise a detector electrically coupled to the processor and configured to determine when the plasma is ignited. In some examples, the processor is configured to disable the oscillation circuit if the plasma is extinguished. In other embodiments, the generator may comprise a signal converter between the processor and the detector. In certain instances, the oscillation circuit is configured to electrically couple to an induction device that comprises an induction coil or a plate electrode. In some examples, the oscillation circuit is configured to divide power evenly to the first transistor and the second transistor. In other examples, the oscillation circuit is configured to cross couple feedback signals from the induction device to the first transistor and the second transistor to divide the power evenly. In certain embodiments, the oscillation circuit comprises a first feedback resistor electrically coupled to the first transistor. In some examples, the oscillation circuit comprises a second feedback resistor electrically coupled to the second transistor. In certain configurations, the oscillation circuit comprises a first DC block capacitor electrically coupled to the first transistor. In other configurations, the oscillation circuit comprises a second DC block capacitor electrically coupled to the second transistor. In some examples, the generator comprises a circuit as shown in FIG. 37, FIG. 38 or FIG. 40.

In another aspect, an oscillation generator configured to provide power to an induction device surrounding at least some portion of a torch body is described. For example, the oscillation generator can be configured to provide power to the induction device to ignite an inductively coupled plasma in the torch body in a first state of the oscillation generator and to provide power to the induction device to sustain the inductively coupled plasma in the torch body in a second state of the oscillation generator, in which the oscillation generator comprises: an oscillation circuit configured to provide a first frequency to the induction device in the first state of the generator. In certain configurations, the oscillation circuit is configured to provide a second frequency to the induction device in the second state, wherein the second frequency is higher than the first frequency, and a processor configured to switch the generator from the first state to the second state after ignition of the inductively coupled plasma.

In some embodiments, the oscillator circuit is configured to provide harmonic emission control. In other embodiments, the circuit comprises a first transistor configured to electrically couple to an induction device. In additional examples, the circuit further comprises a first driver electrically coupled to the first transistor and configured to electrically couple to the induction device. In further examples, the first driver is configured to electrically couple to the induction device through a first low pass filter. In some embodiments, the circuit further comprises a second driver electrically coupled to the second transistor and configured to electrically couple to the induction device. In other examples, the second driver is configured to electrically couple to the induction device through a second low pass filter. In certain instances, each of the first low pass filter and the second low pass filter is configured to filter a feedback signal provided to the first power transistor and the second power transistor. In some examples, each of the first low pass filter and the second low pass filter comprises a high order ceramic low-pass filter. In other examples, the high order ceramic low pass filter is configured to provide a 20 dB cut off at 200 MHz or higher frequencies. In certain embodiments, the circuit is configured to provide impedance matching within about three RF cycles after the generator is switched from the first state to the second state. In other embodiments, the generator may comprise a detector electrically coupled to the processor and configured to determine when the plasma is ignited. In some instances, the processor is configured to disable the oscillation circuit if the plasma is extinguished. In certain examples, the generator comprises a signal converter between the processor and the detector. In some embodiments, the oscillation circuit is configured to electrically couple to an induction device that comprises an induction coil or a plate electrode. In other embodiments, the oscillation circuit is configured to divide power evenly to the first transistor and the second transistor. In further examples, the oscillation circuit is configured to cross couple feedback signals from the induction device to the first transistor and the second transistor to divide the power evenly. In some examples, the oscillation circuit comprises a first feedback resistor electrically coupled to the first transistor and a second feedback resistor electrically coupled to the second transistor. In other configurations, the oscillation circuit comprises a first DC block capacitor electrically coupled to the first transistor. In some examples, the oscillation circuit comprises a second DC block capacitor electrically coupled to the second transistor. In some examples, the generator comprises a circuit as shown in FIG. 37, FIG. 38 or FIG. 40.

In an additional aspect, a radio frequency generator configured to power an induction device is disclosed. In some configurations, the generator comprises a circuit configured to provide power to the induction device in a first oscillation mode and to provide power to the induction device in a second oscillation mode.

In some instances, the circuit comprises a first transistor configured to electrically couple to the induction device to provide power to the induction device. In other instances, the circuit further comprises a first driver electrically coupled to the first transistor and configured to electrically couple to the induction device. In some configurations, the first driver is configured to electrically couple to the induction device through a first low pass filter. In other configurations, the circuit further comprises a second driver electrically coupled to the second transistor and configured to electrically couple to the induction device. In some examples, the second driver is configured to electrically couple to the induction device through a second low pass filter. In certain examples, each of the first low pass filter and the second low pass filter is configured to filter a feedback signal provided to the first power transistor and the second power transistor. In some embodiments, each of the first low pass filter and the second low pass filter comprise a high order ceramic low-pass filter. In certain examples, the high order ceramic low pass filter is configured to provide at least a 20 dB cut off at 200 MHz or higher frequencies. In some examples, the circuit is configured to provide impedance matching within about three RF cycles after the generator is switched from the first state to the second state. In some examples, the generator comprises a detector electrically coupled to a processor configured to determine when the plasma is ignited. In certain embodiments, the processor is configured to disable the oscillation circuit if the plasma is extinguished. In other embodiments, the generator comprises a signal converter between the processor and the detector. In certain examples, the oscillation circuit is configured to electrically couple to an induction device that comprises an induction coil or a plate electrode. In certain embodiments, the oscillation circuit is configured to divide power evenly to the first transistor and the second transistor. In some examples, the oscillation circuit is configured to cross couple feedback signals from the induction device to the first transistor and the second transistor to divide the power evenly. In other examples, the oscillation circuit comprises a first feedback resistor electrically coupled to the first transistor. In some embodiments, the oscillation circuit comprises a second feedback resistor electrically coupled to the second transistor. In other embodiments, the oscillation circuit comprises a first DC block capacitor electrically coupled to the first transistor. In additional embodiments, the oscillation circuit comprises a second DC block capacitor electrically coupled to the second transistor. In some examples, the generator comprises a circuit as shown in FIG. 37, FIG. 38 or FIG. 40.

In another aspect, a system comprising an induction device, and a generator electrically coupled to the induction device and configured to sustain an inductively coupled plasma in a torch body, the generator comprising a processor and an oscillation circuit electrically coupled to the processor, the oscillation circuit configured to provide power to the induction device in an oscillation mode to sustain the inductively coupled plasma in the torch body, wherein the circuit is further configured to provide harmonic emission control during sustaining of the inductively coupled plasma in the torch body in the oscillation mode of the generator is provided.

In certain examples, the circuit comprises a first transistor and a second transistor each electrically coupled to the induction device. In other examples, the circuit further comprises a first driver electrically coupled to the first transistor and electrically coupled to the induction device. In further examples, the first driver is electrically coupled to the induction device through a first low pass filter. In some examples, the circuit further comprises a second driver electrically coupled to the second transistor and electrically coupled to the induction device. In other embodiments, the second driver is electrically coupled to the induction device through a second low pass filter. In some embodiments, each of the first low pass filter and the second low pass filter is configured to filter a feedback signal provided to the first power transistor and the second power transistor. In additional embodiments, each of the first low pass filter and the second low pass filter comprise a high order ceramic low-pass filter. In some configurations, the high order ceramic low pass filter is configured to provide at least a 20 dB cut off at 200 MHz or higher frequencies. In certain instances, circuit is configured to provide impedance matching within about three RF cycles. In other instances, the system comprises a detector electrically coupled to the processor and configured to determine when the plasma is ignited. In further examples, the processor is configured to disable the oscillation circuit if the plasma is extinguished. In additional examples, the system comprises a signal converter between the processor and the detector. In some embodiments, the induction device comprises an induction coil or a plate electrode. In other embodiments, the oscillation circuit is configured to divide power evenly to the first transistor and the second transistor. In some configurations, the oscillation circuit is configured to cross couple feedback signals from the induction device to the first transistor and the second transistor to divide the power evenly. In other configurations, the oscillation circuit comprises a first feedback resistor electrically coupled to the first transistor. In additional configurations, the oscillation circuit comprises a second feedback resistor electrically coupled to the second transistor. In some embodiments, the oscillation circuit comprises a first DC block capacitor electrically coupled to the first transistor. In certain embodiments, the oscillation circuit comprises a second DC block capacitor electrically coupled to the second transistor.

In another aspect, a system comprising an induction device, and an oscillation generator electrically coupled to the induction device and configured to provide power to an induction device surrounding at least some portion of a torch body, the oscillation generator configured to provide power to the induction device to ignite an inductively coupled plasma in the torch body in a first state of the oscillation generator and to provide power to the induction device to sustain the inductively coupled plasma in the torch body in a second state of the oscillation generator, in which the oscillation generator comprises an oscillation circuit configured to provide a first frequency to the induction device in the first state of the generator, in which the oscillation circuit is configured to provide a second frequency to the induction device in the second state, wherein the second frequency is higher than the first frequency, and a processor configured to switch the generator from the first state to the second state after ignition of the inductively coupled plasma is disclosed.

In certain examples, the circuit comprises a first transistor and a second transistor each electrically coupled to the induction device. In other examples, the circuit further comprises a first driver electrically coupled to the first transistor and electrically coupled to the induction device. In further examples, the first driver is electrically coupled to the induction device through a first low pass filter. In some examples, the circuit further comprises a second driver electrically coupled to the second transistor and electrically coupled to the induction device. In other embodiments, the second driver is electrically coupled to the induction device through a second low pass filter. In some embodiments, each of the first low pass filter and the second low pass filter is configured to filter a feedback signal provided to the first power transistor and the second power transistor. In additional embodiments, each of the first low pass filter and the second low pass filter comprise a high order ceramic low-pass filter. In some configurations, the high order ceramic low pass filter is configured to provide at least a 20 dB cut off at 200 MHz or higher frequencies. In certain instances, circuit is configured to provide impedance matching within about three RF cycles. In other instances, the system comprises a detector electrically coupled to the processor and configured to determine when the plasma is ignited. In further examples, the processor is configured to disable the oscillation circuit if the plasma is extinguished. In additional examples, the system comprises a signal converter between the processor and the detector. In some embodiments, the induction device comprises an induction coil or a plate electrode. In other embodiments, the oscillation circuit is configured to divide power evenly to the first transistor and the second transistor. In some configurations, the oscillation circuit is configured to cross couple feedback signals from the induction device to the first transistor and the second transistor to divide the power evenly. In other configurations, the oscillation circuit comprises a first feedback resistor electrically coupled to the first transistor. In additional configurations, the oscillation circuit comprises a second feedback resistor electrically coupled to the second transistor. In some embodiments, the oscillation circuit comprises a first DC block capacitor electrically coupled to the first transistor. In certain embodiments, the oscillation circuit comprises a second DC block capacitor electrically coupled to the second transistor.

In another aspect, a system comprising an induction device, and a radio frequency generator electrically coupled to the induction device and configured to provide power to the induction device, the generator comprising a circuit configured to provide power to the induction device in a first oscillation mode and to provide power to the induction device in a second oscillation mode is described.

In certain examples, the circuit comprises a first transistor and a second transistor each electrically coupled to the induction device. In other examples, the circuit further comprises a first driver electrically coupled to the first transistor and electrically coupled to the induction device. In further examples, the first driver is electrically coupled to the induction device through a first low pass filter. In some examples, the circuit further comprises a second driver electrically coupled to the second transistor and electrically coupled to the induction device. In other embodiments, the second driver is electrically coupled to the induction device through a second low pass filter. In some embodiments, each of the first low pass filter and the second low pass filter is configured to filter a feedback signal provided to the first power transistor and the second power transistor. In additional embodiments, each of the first low pass filter and the second low pass filter comprise a high order ceramic low-pass filter. In some configurations, the high order ceramic low pass filter is configured to provide at least a 20 dB cut off at 200 MHz or higher frequencies. In certain instances, circuit is configured to provide impedance matching within about three RF cycles. In other instances, the system comprises a detector electrically coupled to the processor and configured to determine when the plasma is ignited. In further examples, the processor is configured to disable the oscillation circuit if the plasma is extinguished. In additional examples, the system comprises a signal converter between the processor and the detector. In some embodiments, the induction device comprises an induction coil or a plate electrode. In other embodiments, the oscillation circuit is configured to divide power evenly to the first transistor and the second transistor. In some configurations, the oscillation circuit is configured to cross couple feedback signals from the induction device to the first transistor and the second transistor to divide the power evenly. In other configurations, the oscillation circuit comprises a first feedback resistor electrically coupled to the first transistor. In additional configurations, the oscillation circuit comprises a second feedback resistor electrically coupled to the second transistor. In some embodiments, the oscillation circuit comprises a first DC block capacitor electrically coupled to the first transistor. In certain embodiments, the oscillation circuit comprises a second DC block capacitor electrically coupled to the second transistor.

In another aspect, a mass spectrometer system comprising a torch configured to sustain an ionization source, an induction device comprising an aperture for receiving a portion of the torch and configure to provide radio frequency energy into the received torch portion, a generator electrically coupled to the induction device and configured to sustain an inductively coupled plasma in the torch, the generator comprising a processor and an oscillation circuit electrically coupled to the processor, the oscillation circuit configured to provide power to the induction device in an oscillation mode to sustain the inductively coupled plasma in the torch, wherein the circuit is further configured to provide harmonic emission control during sustaining of the inductively coupled plasma in the torch in the oscillation mode of the generator, and a mass analyzer fluidically coupled to the torch is described.

In certain examples, the circuit comprises a first transistor and a second transistor each electrically coupled to the induction device. In other examples, the circuit further comprises a first driver electrically coupled to the first transistor and electrically coupled to the induction device. In further examples, the first driver is electrically coupled to the induction device through a first low pass filter. In some examples, the circuit further comprises a second driver electrically coupled to the second transistor and electrically coupled to the induction device. In other embodiments, the second driver is electrically coupled to the induction device through a second low pass filter. In some embodiments, each of the first low pass filter and the second low pass filter is configured to filter a feedback signal provided to the first power transistor and the second power transistor. In additional embodiments, each of the first low pass filter and the second low pass filter comprise a high order ceramic low-pass filter. In some configurations, the high order ceramic low pass filter is configured to provide at least a 20 dB cut off at 200 MHz or higher frequencies. In certain instances, circuit is configured to provide impedance matching within about three RF cycles. In other instances, the system comprises a detector electrically coupled to the processor and configured to determine when the plasma is ignited. In further examples, the processor is configured to disable the oscillation circuit if the plasma is extinguished. In additional examples, the system comprises a signal converter between the processor and the detector. In some embodiments, the induction device comprises an induction coil or a plate electrode. In other embodiments, the oscillation circuit is configured to divide power evenly to the first transistor and the second transistor. In some configurations, the oscillation circuit is configured to cross couple feedback signals from the induction device to the first transistor and the second transistor to divide the power evenly. In other configurations, the oscillation circuit comprises a first feedback resistor electrically coupled to the first transistor. In additional configurations, the oscillation circuit comprises a second feedback resistor electrically coupled to the second transistor. In some embodiments, the oscillation circuit comprises a first DC block capacitor electrically coupled to the first transistor. In certain embodiments, the oscillation circuit comprises a second DC block capacitor electrically coupled to the second transistor.

In an additional aspect, a mass spectrometer system comprising a torch configured to sustain an ionization source, an induction device comprising an aperture for receiving a portion of the torch and configure to provide radio frequency energy into the received torch portion, an oscillation generator electrically coupled to the induction device and configured to provide power to the induction device, the oscillation generator configured to provide power to the induction device to ignite an inductively coupled plasma in the torch in a first state of the oscillation generator and to provide power to the induction device to sustain the inductively coupled plasma in the torch in a second state of the oscillation generator, in which the oscillation generator comprises an oscillation circuit configured to provide a first frequency to the induction device in the first state of the generator, in which the oscillation circuit is configured to provide a second frequency to the induction device in the second state, wherein the second frequency is higher than the first frequency, and a processor configured to switch the generator from the first state to the second state after ignition of the inductively coupled plasma, and a mass analyzer fluidically coupled to the torch is provided.

In certain examples, the circuit comprises a first transistor and a second transistor each electrically coupled to the induction device. In other examples, the circuit further comprises a first driver electrically coupled to the first transistor and electrically coupled to the induction device. In further examples, the first driver is electrically coupled to the induction device through a first low pass filter. In some examples, the circuit further comprises a second driver electrically coupled to the second transistor and electrically coupled to the induction device. In other embodiments, the second driver is electrically coupled to the induction device through a second low pass filter. In some embodiments, each of the first low pass filter and the second low pass filter is configured to filter a feedback signal provided to the first power transistor and the second power transistor. In additional embodiments, each of the first low pass filter and the second low pass filter comprise a high order ceramic low-pass filter. In some configurations, the high order ceramic low pass filter is configured to provide at least a 20 dB cut off at 200 MHz or higher frequencies. In certain instances, circuit is configured to provide impedance matching within about three RF cycles. In other instances, the system comprises a detector electrically coupled to the processor and configured to determine when the plasma is ignited. In further examples, the processor is configured to disable the oscillation circuit if the plasma is extinguished. In additional examples, the system comprises a signal converter between the processor and the detector. In some embodiments, the induction device comprises an induction coil or a plate electrode. In other embodiments, the oscillation circuit is configured to divide power evenly to the first transistor and the second transistor. In some configurations, the oscillation circuit is configured to cross couple feedback signals from the induction device to the first transistor and the second transistor to divide the power evenly. In other configurations, the oscillation circuit comprises a first feedback resistor electrically coupled to the first transistor. In additional configurations, the oscillation circuit comprises a second feedback resistor electrically coupled to the second transistor. In some embodiments, the oscillation circuit comprises a first DC block capacitor electrically coupled to the first transistor. In certain embodiments, the oscillation circuit comprises a second DC block capacitor electrically coupled to the second transistor.

In another aspect, a mass spectrometer system comprising a torch configured to sustain an ionization source, an induction device comprising an aperture for receiving a portion of the torch and configure to provide radio frequency energy into the torch, a radio frequency generator electrically coupled to the induction device and configured to provide power to the induction device, the generator comprising a circuit configured to provide power to the induction device in a first oscillation mode and to provide power to the induction device in a second oscillation mode and a mass analyzer fluidically coupled to the torch is described.

In certain examples, the circuit comprises a first transistor and a second transistor each electrically coupled to the induction device. In other examples, the circuit further comprises a first driver electrically coupled to the first transistor and electrically coupled to the induction device. In further examples, the first driver is electrically coupled to the induction device through a first low pass filter. In some examples, the circuit further comprises a second driver electrically coupled to the second transistor and electrically coupled to the induction device. In other embodiments, the second driver is electrically coupled to the induction device through a second low pass filter. In some embodiments, each of the first low pass filter and the second low pass filter is configured to filter a feedback signal provided to the first power transistor and the second power transistor. In additional embodiments, each of the first low pass filter and the second low pass filter comprise a high order ceramic low-pass filter. In some configurations, the high order ceramic low pass filter is configured to provide at least a 20 dB cut off at 200 MHz or higher frequencies. In certain instances, circuit is configured to provide impedance matching within about three RF cycles. In other instances, the system comprises a detector electrically coupled to the processor and configured to determine when the plasma is ignited. In further examples, the processor is configured to disable the oscillation circuit if the plasma is extinguished. In additional examples, the system comprises a signal converter between the processor and the detector. In some embodiments, the induction device comprises an induction coil or a plate electrode. In other embodiments, the oscillation circuit is configured to divide power evenly to the first transistor and the second transistor. In some configurations, the oscillation circuit is configured to cross couple feedback signals from the induction device to the first transistor and the second transistor to divide the power evenly. In other configurations, the oscillation circuit comprises a first feedback resistor electrically coupled to the first transistor. In additional configurations, the oscillation circuit comprises a second feedback resistor electrically coupled to the second transistor. In some embodiments, the oscillation circuit comprises a first DC block capacitor electrically coupled to the first transistor. In certain embodiments, the oscillation circuit comprises a second DC block capacitor electrically coupled to the second transistor.

In an additional aspect, a system for detecting optical emission comprising a torch configured to sustain an ionization source, an induction device comprising an aperture for receiving a portion of the torch and configure to provide radio frequency energy into the torch, a generator electrically coupled to the induction device and configured to sustain an inductively coupled plasma in the torch, the generator comprising a processor and an oscillation circuit electrically coupled to the processor, the oscillation circuit configured to provide power to the induction device in an oscillation mode to sustain the inductively coupled plasma in the torch, wherein the circuit is further configured to provide harmonic emission control during sustaining of the inductively coupled plasma in the torch in the oscillation mode of the generator, and an optical detector configured to detect optical emissions in the torch.

In certain examples, the circuit comprises a first transistor and a second transistor each electrically coupled to the induction device. In other examples, the circuit further comprises a first driver electrically coupled to the first transistor and electrically coupled to the induction device. In further examples, the first driver is electrically coupled to the induction device through a first low pass filter. In some examples, the circuit further comprises a second driver electrically coupled to the second transistor and electrically coupled to the induction device. In other embodiments, the second driver is electrically coupled to the induction device through a second low pass filter. In some embodiments, each of the first low pass filter and the second low pass filter is configured to filter a feedback signal provided to the first power transistor and the second power transistor. In additional embodiments, each of the first low pass filter and the second low pass filter comprise a high order ceramic low-pass filter. In some configurations, the high order ceramic low pass filter is configured to provide at least a 20 dB cut off at 200 MHz or higher frequencies. In certain instances, circuit is configured to provide impedance matching within about three RF cycles. In other instances, the system comprises a detector electrically coupled to the processor and configured to determine when the plasma is ignited. In further examples, the processor is configured to disable the oscillation circuit if the plasma is extinguished. In additional examples, the system comprises a signal converter between the processor and the detector. In some embodiments, the induction device comprises an induction coil or a plate electrode. In other embodiments, the oscillation circuit is configured to divide power evenly to the first transistor and the second transistor. In some configurations, the oscillation circuit is configured to cross couple feedback signals from the induction device to the first transistor and the second transistor to divide the power evenly. In other configurations, the oscillation circuit comprises a first feedback resistor electrically coupled to the first transistor. In additional configurations, the oscillation circuit comprises a second feedback resistor electrically coupled to the second transistor. In some embodiments, the oscillation circuit comprises a first DC block capacitor electrically coupled to the first transistor. In certain embodiments, the oscillation circuit comprises a second DC block capacitor electrically coupled to the second transistor.

In another aspect, a system for detecting optical emission comprising a torch configured to sustain an ionization source, an induction device comprising an aperture for receiving a portion of the torch and configure to provide radio frequency energy into the torch, an oscillation generator electrically coupled to the induction device and configured to provide power to the induction device, the oscillation generator configured to provide power to the induction device to ignite an inductively coupled plasma in the torch in a first state of the oscillation generator and to provide power to the induction device to sustain the inductively coupled plasma in the torch in a second state of the oscillation generator, in which the oscillation generator comprises an oscillation circuit configured to provide a first frequency to the induction device in the first state of the generator, in which the oscillation circuit is configured to provide a second frequency to the induction device in the second state, wherein the second frequency is higher than the first frequency, and a processor configured to switch the generator from the first state to the second state after ignition of the inductively coupled plasma, and an optical detector configured to detect optical emissions in the torch.

In certain examples, the circuit comprises a first transistor and a second transistor each electrically coupled to the induction device. In other examples, the circuit further comprises a first driver electrically coupled to the first transistor and electrically coupled to the induction device. In further examples, the first driver is electrically coupled to the induction device through a first low pass filter. In some examples, the circuit further comprises a second driver electrically coupled to the second transistor and electrically coupled to the induction device. In other embodiments, the second driver is electrically coupled to the induction device through a second low pass filter. In some embodiments, each of the first low pass filter and the second low pass filter is configured to filter a feedback signal provided to the first power transistor and the second power transistor. In additional embodiments, each of the first low pass filter and the second low pass filter comprise a high order ceramic low-pass filter. In some configurations, the high order ceramic low pass filter is configured to provide at least a 20 dB cut off at 200 MHz or higher frequencies. In certain instances, circuit is configured to provide impedance matching within about three RF cycles. In other instances, the system comprises a detector electrically coupled to the processor and configured to determine when the plasma is ignited. In further examples, the processor is configured to disable the oscillation circuit if the plasma is extinguished. In additional examples, the system comprises a signal converter between the processor and the detector. In some embodiments, the induction device comprises an induction coil or a plate electrode. In other embodiments, the oscillation circuit is configured to divide power evenly to the first transistor and the second transistor. In some configurations, the oscillation circuit is configured to cross couple feedback signals from the induction device to the first transistor and the second transistor to divide the power evenly. In other configurations, the oscillation circuit comprises a first feedback resistor electrically coupled to the first transistor. In additional configurations, the oscillation circuit comprises a second feedback resistor electrically coupled to the second transistor. In some embodiments, the oscillation circuit comprises a first DC block capacitor electrically coupled to the first transistor. In certain embodiments, the oscillation circuit comprises a second DC block capacitor electrically coupled to the second transistor.

In another aspect, a system for detecting optical emission comprising a torch configured to sustain an ionization source, an induction device comprising an aperture for receiving a portion of the torch and configured to provide radio frequency energy into the torch, a radio frequency generator electrically coupled to the induction device and configured to provide power to the induction device, the generator comprising a circuit configured to provide power to the induction device in a first oscillation mode and to provide power to the induction device in a second oscillation mode, and an optical detector configured to detect optical emissions in the torch is described.

In certain examples, the circuit comprises a first transistor and a second transistor each electrically coupled to the induction device. In other examples, the circuit further comprises a first driver electrically coupled to the first transistor and electrically coupled to the induction device. In further examples, the first driver is electrically coupled to the induction device through a first low pass filter. In some examples, the circuit further comprises a second driver electrically coupled to the second transistor and electrically coupled to the induction device. In other embodiments, the second driver is electrically coupled to the induction device through a second low pass filter. In some embodiments, each of the first low pass filter and the second low pass filter is configured to filter a feedback signal provided to the first power transistor and the second power transistor. In additional embodiments, each of the first low pass filter and the second low pass filter comprise a high order ceramic low-pass filter. In some configurations, the high order ceramic low pass filter is configured to provide at least a 20 dB cut off at 200 MHz or higher frequencies. In certain instances, circuit is configured to provide impedance matching within about three RF cycles. In other instances, the system comprises a detector electrically coupled to the processor and configured to determine when the plasma is ignited. In further examples, the processor is configured to disable the oscillation circuit if the plasma is extinguished. In additional examples, the system comprises a signal converter between the processor and the detector. In some embodiments, the induction device comprises an induction coil or a plate electrode. In other embodiments, the oscillation circuit is configured to divide power evenly to the first transistor and the second transistor. In some configurations, the oscillation circuit is configured to cross couple feedback signals from the induction device to the first transistor and the second transistor to divide the power evenly. In other configurations, the oscillation circuit comprises a first feedback resistor electrically coupled to the first transistor. In additional configurations, the oscillation circuit comprises a second feedback resistor electrically coupled to the second transistor. In some embodiments, the oscillation circuit comprises a first DC block capacitor electrically coupled to the first transistor. In certain embodiments, the oscillation circuit comprises a second DC block capacitor electrically coupled to the second transistor.

In an additional aspect, a system for detecting atomic absorption emission, the system comprising a torch configured to sustain an ionization source, an induction device comprising an aperture for receiving a portion of the torch and configured to provide radio frequency energy into the torch, a generator electrically coupled to the induction device and configured to sustain an inductively coupled plasma in the torch, the generator comprising a processor and an oscillation circuit electrically coupled to the processor, the oscillation circuit configured to provide power to the induction device in an oscillation mode to sustain the inductively coupled plasma in the torch, wherein the circuit is further configured to provide harmonic emission control during sustaining of the inductively coupled plasma in the torch in the oscillation mode of the generator, a light source configured to provide light to the torch, and an optical detector configured to measure the amount of provided light transmitted through the torch is disclosed.

In certain examples, the circuit comprises a first transistor and a second transistor each electrically coupled to the induction device. In other examples, the circuit further comprises a first driver electrically coupled to the first transistor and electrically coupled to the induction device. In further examples, the first driver is electrically coupled to the induction device through a first low pass filter. In some examples, the circuit further comprises a second driver electrically coupled to the second transistor and electrically coupled to the induction device. In other embodiments, the second driver is electrically coupled to the induction device through a second low pass filter. In some embodiments, each of the first low pass filter and the second low pass filter is configured to filter a feedback signal provided to the first power transistor and the second power transistor. In additional embodiments, each of the first low pass filter and the second low pass filter comprise a high order ceramic low-pass filter. In some configurations, the high order ceramic low pass filter is configured to provide at least a 20 dB cut off at 200 MHz or higher frequencies. In certain instances, circuit is configured to provide impedance matching within about three RF cycles. In other instances, the system comprises a detector electrically coupled to the processor and configured to determine when the plasma is ignited. In further examples, the processor is configured to disable the oscillation circuit if the plasma is extinguished. In additional examples, the system comprises a signal converter between the processor and the detector. In some embodiments, the induction device comprises an induction coil or a plate electrode. In other embodiments, the oscillation circuit is configured to divide power evenly to the first transistor and the second transistor. In some configurations, the oscillation circuit is configured to cross couple feedback signals from the induction device to the first transistor and the second transistor to divide the power evenly. In other configurations, the oscillation circuit comprises a first feedback resistor electrically coupled to the first transistor. In additional configurations, the oscillation circuit comprises a second feedback resistor electrically coupled to the second transistor. In some embodiments, the oscillation circuit comprises a first DC block capacitor electrically coupled to the first transistor. In certain embodiments, the oscillation circuit comprises a second DC block capacitor electrically coupled to the second transistor.

In another aspect, a system for detecting atomic absorption emission comprising a torch configured to sustain an ionization source, an induction device comprising an aperture for receiving a portion of the torch and configured to provide radio frequency energy into the torch, an oscillation generator electrically coupled to the induction device and configured to provide power to the induction device, the oscillation generator configured to provide power to the induction device to ignite an inductively coupled plasma in the torch in a first state of the oscillation generator and to provide power to the induction device to sustain the inductively coupled plasma in the torch in a second state of the oscillation generator, in which the oscillation generator comprises an oscillation circuit configured to provide a first frequency to the induction device in the first state of the generator, in which the oscillation circuit is configured to provide a second frequency to the induction device in the second state, wherein the second frequency is higher than the first frequency, and a processor configured to switch the generator from the first state to the second state after ignition of the inductively coupled plasma, a light source configured to provide light to the torch, and an optical detector configured to measure the amount of provided light transmitted through the torch is disclosed.

In certain examples, the circuit comprises a first transistor and a second transistor each electrically coupled to the induction device. In other examples, the circuit further comprises a first driver electrically coupled to the first transistor and electrically coupled to the induction device. In further examples, the first driver is electrically coupled to the induction device through a first low pass filter. In some examples, the circuit further comprises a second driver electrically coupled to the second transistor and electrically coupled to the induction device. In other embodiments, the second driver is electrically coupled to the induction device through a second low pass filter. In some embodiments, each of the first low pass filter and the second low pass filter is configured to filter a feedback signal provided to the first power transistor and the second power transistor. In additional embodiments, each of the first low pass filter and the second low pass filter comprise a high order ceramic low-pass filter. In some configurations, the high order ceramic low pass filter is configured to provide at least a 20 dB cut off at 200 MHz or higher frequencies. In certain instances, circuit is configured to provide impedance matching within about three RF cycles. In other instances, the system comprises a detector electrically coupled to the processor and configured to determine when the plasma is ignited. In further examples, the processor is configured to disable the oscillation circuit if the plasma is extinguished. In additional examples, the system comprises a signal converter between the processor and the detector. In some embodiments, the induction device comprises an induction coil or a plate electrode. In other embodiments, the oscillation circuit is configured to divide power evenly to the first transistor and the second transistor. In some configurations, the oscillation circuit is configured to cross couple feedback signals from the induction device to the first transistor and the second transistor to divide the power evenly. In other configurations, the oscillation circuit comprises a first feedback resistor electrically coupled to the first transistor. In additional configurations, the oscillation circuit comprises a second feedback resistor electrically coupled to the second transistor. In some embodiments, the oscillation circuit comprises a first DC block capacitor electrically coupled to the first transistor. In certain embodiments, the oscillation circuit comprises a second DC block capacitor electrically coupled to the second transistor.

In another aspect, a system for detecting atomic absorption emission, the system comprising a torch configured to sustain an ionization source, an induction device comprising an aperture for receiving a portion of the torch and configure to provide radio frequency energy into the torch, a radio frequency generator electrically coupled to the induction device and configured to provide power to the induction device, the generator comprising a circuit configured to provide power to the induction device in a first oscillation mode and to provide power to the induction device in a second oscillation mode, a light source configured to provide light to the torch, and an optical detector configured to measure the amount of provided light transmitted through the torch is described.

In certain examples, the circuit comprises a first transistor and a second transistor each electrically coupled to the induction device. In other examples, the circuit further comprises a first driver electrically coupled to the first transistor and electrically coupled to the induction device. In further examples, the first driver is electrically coupled to the induction device through a first low pass filter. In some examples, the circuit further comprises a second driver electrically coupled to the second transistor and electrically coupled to the induction device. In other embodiments, the second driver is electrically coupled to the induction device through a second low pass filter. In some embodiments, each of the first low pass filter and the second low pass filter is configured to filter a feedback signal provided to the first power transistor and the second power transistor. In additional embodiments, each of the first low pass filter and the second low pass filter comprise a high order ceramic low-pass filter. In some configurations, the high order ceramic low pass filter is configured to provide at least a 20 dB cut off at 200 MHz or higher frequencies. In certain instances, circuit is configured to provide impedance matching within about three RF cycles. In other instances, the system comprises a detector electrically coupled to the processor and configured to determine when the plasma is ignited. In further examples, the processor is configured to disable the oscillation circuit if the plasma is extinguished. In additional examples, the system comprises a signal converter between the processor and the detector. In some embodiments, the induction device comprises an induction coil or a plate electrode. In other embodiments, the oscillation circuit is configured to divide power evenly to the first transistor and the second transistor. In some configurations, the oscillation circuit is configured to cross couple feedback signals from the induction device to the first transistor and the second transistor to divide the power evenly. In other configurations, the oscillation circuit comprises a first feedback resistor electrically coupled to the first transistor. In additional configurations, the oscillation circuit comprises a second feedback resistor electrically coupled to the second transistor. In some embodiments, the oscillation circuit comprises a first DC block capacitor electrically coupled to the first transistor. In certain embodiments, the oscillation circuit comprises a second DC block capacitor electrically coupled to the second transistor.

In another aspect, a chemical reactor comprising a reaction chamber, an induction device comprising an aperture configured to receive some portion of the reaction chamber, and any generator as described herein electrically coupled to the induction device and configured to provide power into the received portion of the reaction chamber using the induction device is disclosed.

In an additional aspect, a material deposition device comprising an atomization chamber, an induction device comprising an aperture configured to receive some portion of the atomization chamber, any generator ad described herein electrically coupled to the induction device and configured to provide power into the received portion of the atomization chamber using the induction device, and a nozzle fluidically coupled to the atomization chamber and configured to receive atomized species from the chamber and provide the received, atomized species towards a substrate is disclosed.

In another aspect, a system comprises a torch, a first induction device comprising an aperture configured to receive a portion of the torch, a second induction device comprising an aperture configured to receive a second portion of the torch, a first generator electrically coupled to the first induction device and a second generator electrically coupled to the second induction device, in which at least one of the first generator and the second generator is any one of the generators described herein. In some instances, each of the first generator and the second generator is any one of the generators described herein.

In an additional aspect, a method of igniting and sustaining a plasma with a single generator comprising igniting a plasma in a torch body by providing power to an induction device from the generator in a first oscillation mode, and switching the generator from the first oscillation mode to a second oscillation mode any time after the plasma is ignited is provided. The method may use a generator comprising the circuit of FIG. 37 or FIG. 38 or FIG. 40.

In another aspect, a method of igniting and sustaining a plasma with a single generator comprising igniting a plasma in a torch body by providing power to an induction device from a generator configured to provide power to the induction device in a first oscillation mode and in an second oscillation mode, and sustaining the plasma using the second oscillation mode of the generator. In some instances, the plasma is ignited by providing power from the generator in the first oscillation mode. In other instances, the method comprises switching the generator to the first oscillation mode after the plasma is sustained for some period using the second oscillation mode.

In an additional aspect, a method of sustaining an inductively coupled plasma, the method comprising providing power to a torch in an oscillation mode using a generator circuit as shown in one of FIGS. 37, 38 and 40.

In another aspect, a generator configured to sustain an inductively coupled plasma in a torch body comprising a processor and an oscillation circuit electrically coupled to the processor, the oscillation circuit configured to electrically couple to an induction device and provide power to the induction device in an oscillation mode to sustain the inductively coupled plasma in the torch body, the oscillation circuit configured to provide independent control of voltage and current provided to a transistor of the oscillation circuit is provided.

In an additional aspect, an oscillation generator configured to provide power to an induction device surrounding at least some portion of a torch body, the oscillation generator configured to provide power to the induction device to ignite an inductively coupled plasma in the torch body in a first state of the oscillation generator and to provide power to the induction device to sustain the inductively coupled plasma in the torch body in a second state of the oscillation generator, in which the oscillation generator comprises an oscillation circuit configured to provide a first frequency to the induction device in the first state of the generator, in which the oscillation circuit is configured to provide a second frequency to the induction device in the second state, wherein the second frequency is higher than the first frequency, the oscillation circuit further configured to provide independent control of voltage and current provided to a transistor of the oscillation circuit, and a processor configured to switch the generator from the first state to the second state after ignition of the inductively coupled plasma is disclosed.

In another aspect, a radio frequency generator configured to power an induction device comprises a circuit configured to provide power to the induction device in a first oscillation mode and to provide power to the induction device in a second oscillation mode, wherein the circuit is further configured to provide independent control of voltage and current provided to a transistor of the oscillation circuit that provides power to the induction device.

In an additional aspect, a generator configured to sustain an inductively coupled plasma in a torch body comprises a processor and a circuit electrically coupled to the processor, the circuit configured to electrically couple to an induction device and provide power to the induction device in an oscillation mode to sustain the inductively coupled plasma in the torch body, wherein the circuit does not include a driven mode circuit.

In another aspect, an oscillation generator configured to provide power to an induction device surrounding at least some portion of a torch body is configured to provide power to the induction device to ignite an inductively coupled plasma in the torch body in a first state of the oscillation generator and to provide power to the induction device to sustain the inductively coupled plasma in the torch body in a second state of the oscillation generator, in which the oscillation generator comprises an oscillation circuit configured to provide a first frequency to the induction device in the first state of the generator, in which the oscillation circuit is configured to provide a second frequency to the induction device in the second state, wherein the second frequency is higher than the first frequency, in which the oscillation generator does not include a driven mode circuit, and a processor configured to switch the generator from the first state to the second state after ignition of the inductively coupled plasma.

In another aspect, a radio frequency generator configured to power an induction device comprises a circuit configured to provide power to the induction device in a first oscillation mode and to provide power to the induction device in a second oscillation mode, wherein the circuit does not include a driven mode circuit.

Additional features, aspects, examples, configurations and embodiments are described in more detail below.

BRIEF DESCRIPTION OF THE DRAWINGS

Certain embodiments of the devices and systems are described with reference to the accompanying figures in which:

FIG. 35 is a table showing the measurement of several elements using a standard NexION instrument and a hybrid generator in both a driven mode and in an oscillation mode, in accordance with certain examples;

Figure 1:
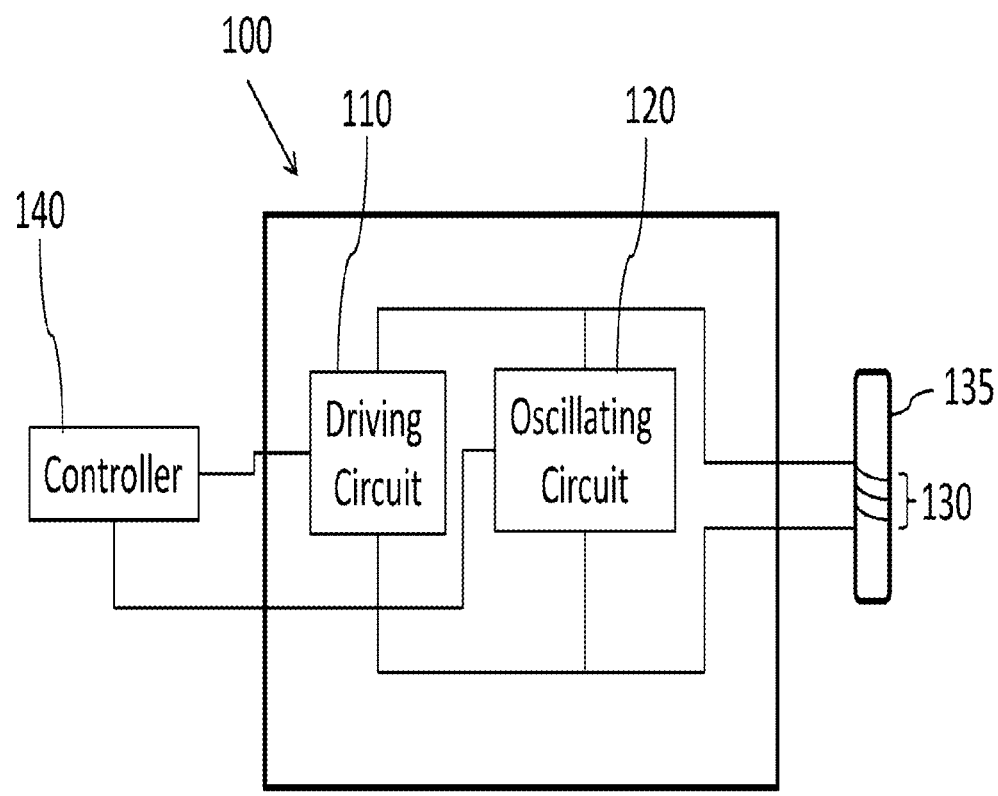
FIG. 1 is a block diagram of a generator, in accordance with certain examples.

It will be recognized by the person of ordinary skill in the art, given the benefit of this disclosure, that certain dimensions or features of the components of the systems may have been enlarged, distorted or shown in an otherwise unconventional or non-proportional manner to provide a more user friendly version of the figures. In addition, the exact length, width, geometry, aperture size, etc. of the torch body, the plasmas generated and other components herein may vary.

DETAILED DESCRIPTION

Certain embodiments are described below with reference to singular and plural terms in order to provide a user friendly description of the technology disclosed herein. These terms are used for convenience purposes only and are not intended to limit the devices, methods and systems described herein. Certain examples are described herein with reference to the terms driven mode and oscillation mode. While the exact parameters used in the driven mode and in the oscillation mode may vary, the RF generator frequency for plasma generation is usually from 10 MHz to 90 MHz, more particularly between 20 MHz and 50 MHz, for example about 40 MHz. The RF generator output power is typically about 500 Watts to 50 kW. As described in more detail herein, in the driven mode of operation, the feedback loop can be disabled and the voltage can be selected to provide a desired power to the induction device. In the oscillation mode, the feedback loop can be enabled to permit rapid changing of the impedance. If desired, the generator can operate entirely in the driven mode, which can achieve a higher sensitivity for mass spectrometry in certain applications, compared to the oscillation mode. In some embodiments, the driven+oscillator hybrid generator may be part of ICP-OES or ICP-MS or other similar instruments as described herein. In certain embodiments, generator operation can be controlled with a processor or master controller in or electrically coupled to the generator to control the generator, e.g., to enable or terminate the plasma generation. While two modes are possible with the generators described herein, if desired, the generator can be operated in only a single mode, e.g., in only the drive mode or in only the oscillation mode.

Certain embodiments are also described below that use a generator to generate and/or sustain an inductively coupled plasma. If desired, however, the same generator can be used to generate and/or sustain a capacitively coupled plasma, a flame or other atomization/ionization devices that can be used, for example, to atomize and/or ionize chemical species. Certain configurations are provided below using inductively coupled plasmas to illustrate various aspects and attributes of the technology described herein.

In certain examples, the generators described herein can be used to sustain a high-energy plasma to atomize and/or ionize samples for chemical analysis, to provide ions for deposition or other uses. To ignite and sustain the plasma, RF power, typically in the range of 0.5 kW to 100 kW, from a RF generator (RFG) is inductively coupled to the plasma by a load coil, plate electrode or other suitable induction devices. The plasma exhibits different RF impedance during the ignition phase and when the plasma is subject to different chemical samples. To facilitate optimal power transfer, the RF generator can be configured to adapt the impedance matching to the varying plasma impedance.

In certain embodiments, existing RF generators are configured to operate using only one of the two methods: the oscillator method (or mode) or the driven method (or mode). Each of these methods has advantages and weaknesses. In the oscillation method, the RF generator is a power oscillator circuit. The oscillation frequency is determined by the oscillator's resonant circuit. In many instances, the plasma impedance and the induction device are part of the resonator and feedback path, so that the oscillating frequency can be rapidly changed to adapt to the varying plasma impedance. This attribute facilitates the analysis of different unknown samples at a high throughput rate. When the oscillation method is implemented during plasma ignition, the RF impedance of the induction device can change substantially and abruptly from no plasma to successful plasma generation. Prior to ignition, the induction device behaves like an inductor such that all the RF power provided to the inductor is substantially reactive power (i.e., no real power). After successful plasma ignition, the inductive device inductively couples real power to the plasma. The feedback signals of the oscillator, which are derived from the induction device, to drive the power transistors change abruptly as well. As a result, during plasma ignition the feedback signals are poorly controlled, and there is a substantial risk in damaging the power electronics when the oscillation method is implemented for plasma ignition. The breakdown of silicon power transistors, which are most commonly used for RF power generation at the aforementioned frequency range, is about −6V to +12V at the gate (input), and about +150V for drain breakdown. Older but slower silicon transistors may have gate breakdown limits from −40V to +40V. Damage prevention of the electronics is particularly desirable because advancements in semiconductor technologies is often achieved by device scaling (e.g., to a smaller gate length), such that the transistor speed (e.g., unity gain frequency Ft, or the maximum oscillation frequency Fmax) is increased at the expense of a lower device breakdown voltage limit. The increase in the transistor speed facilitates the design of a high efficiency power amplifier (e.g., class C, class D, class E, class F, etc.), because the available power gain at the higher harmonics above the fundamental frequency can used to optimize the signal waveform and current conduction angle. Implementation of these high speed, lower breakdown devices can be weighed against the not well controlled feedback signal during ignition. A rapid increase in the feedback signal amplitude can rapidly reinforce an uncontrolled positive feedback loop such that the transistors of the generator are destroyed. The excessive signals can be difficult to suppress or control because of the high frequency, high power and the inherent instability in an oscillator for plasma ignition. If the feedback signal is suppressed too much to safeguard the transistor, the plasma may fail to ignite. Furthermore, the oscillator design can manifest higher RF spurious signals and higher phase noise. Such imperfections may compromise the equipment sensitivity. To overcome these issues, a generator configured to implement only the oscillation method would typically include higher breakdown transistors that are more expensive and/or lower speed and efficiency to avoid potential damage to the circuitry components.

Generators configured to implement only the driven method (or mode) typically utilize a stable RF source which operates at a controlled frequency and amplitude, e.g., a frequency that is adjustable or fixed (but can vary) and is predetermined or preselected. Typical examples of signal sources are small signal, e.g., less than 10 Watt, RF synthesizers or voltage-controlled oscillators (VCO) comprising high-quality crystal, RLC or RC resonators. A RF power amplifier magnifies the small controlled RF signal to a high power level for plasma generation. The driven method is advantageous for plasma ignition because the controlled frequency and signal amplitude can be selected to avoid transistor breakdown. In addition, in many instances, the driven method can produce a spectrally purer RF signal, e.g., a signal spectrum with a strong signal tone at the intended signal frequency and less RF spurious signals. In some configurations, it is easier to use a driven mode RF generator to achieve higher sensitivity for mass spectrometry, compared to an oscillation mode RF generator. However, impedance matching in generators configured to implement the driven method is often much slower than those implementing the oscillation method. A driven RF generator adjusts the controlled frequency (or phase) and/or the amplitude by monitoring the RF impedance change, so that a feedback (or error) signal can be generated to adjust the frequency or phase of the RF source, typically by means of a phase-locked loop (PLL). In the oscillator method, the change is often within a couple of RF cycles, whereas the change in the driven method is at a rate of tens to thousands of RF cycles or at least 10-1000× slower than the oscillation method. As a result, it is more difficult to design a driven RF generator for high throughput mass spectrometry analysis. RF power amplifiers used in the driven method are often designed to drive standard 50 Ohm or 75 Ohm loads. Additional impedance matching between a 50 Ohm (or 75 Ohm) load to the transistors further complicates the design, increases components and footprint area, and can cause unwanted power loss.

In certain configurations of the generators described herein, the generators may include suitable components to permit operation in the driven mode and in the oscillation mode. The generator may switch (if desired) between the two modes during different periods of operation of the plasma to provide optimum power to the plasma at different periods. For example, during ignition of the plasma, the generator may be operated in the driven mode to provide better control of the frequency and signal amplitude to avoid transistor breakdown. After ignition of the plasma, the generator can remain in the driven mode, if desired, or may be switched to the oscillation mode to permit more rapid impedance matching with changes in the plasma that may occur during introduction of samples. The ability to implement both the driven mode and the oscillation mode using a single generator permits the use of lower breakdown transistors that are more inexpensive and/or provide higher speeds and efficiency. While various embodiments are described herein as using the hybrid generator in the driven mode to ignite the plasma, if desired, the generator may be operated in the oscillation mode during plasma ignition and/or after plasma ignition.

In certain examples, the generators described herein may include suitable components and circuitry to permit operation in both the driven mode and the oscillation mode and to permit rapid switching between the two modes. For example, the generator may comprise power transistors, driver amplifiers, various switches, e.g., an RF switch, and an impedance matching network. Feedback signals derived from the induction device outputs can be used to drive the power transistors by a switch (or a variable-gain circuit). The feedback signals can be enabled, disabled or adjusted in amplitude by the switch, typically implemented with an adjustable gain circuit element (e.g., single-stage transistor, multi-stage amplifier, variable gain amplitude, variable digital or analog attenuator, variable capacitor or other adjustable coupling devices, etc.). The saturated output power of the switch or "switching" circuit can be selected to limit or control the physical power of the feedback signal. For example, if a single-stage transistor is used as a switch, the power supply, e.g., a VDD power supply, can be reduced such that the saturated (maximum) output power of the switch is always lower than the maximum input power allowed by the power transistors. In this configuration, the transistors are protected in the oscillation mode of operation. In addition, a RF driver amplifier can be used to amplify the RF source to drive the power transistors. When these components are implemented together, the RF generator can be operated in the driven mode, an oscillation mode and an injection-locked mode, which is a hybrid mode with characteristics of both the driven mode and the oscillation mode and is present during the transition from the driven mode to the oscillation mode or vice versa. In certain embodiments when the driven mode is implemented, the feedback signals are disabled by the switches and the RF driver amplifier is enabled. To switch from the driven mode to the oscillation mode, the feedback signal switches are enabled and the RF driver amplifier is disabled. The RF generator can also be in the injection-locked mode, for example, when both the feedback signals and the RF driver amplifiers are enabled. In this case, the RF generator is running in the oscillation mode, but its operating frequency is locked to the RF source frequency of the driven mode. The ability to switch between the various modes using a single generator provides desirable attributes including, but not limited to, minimizing transistor breakdown in the driven mode during ignition, being able to rapidly change the impedance in the oscillation mode during sample introduction and/or analysis, and the ability to use cheaper and faster transistors while reducing the likelihood of transistor failure. If desired, the generator may be rapidly switched between the driven mode and the oscillation mode and back to the driven mode to sustain a plasma using an almost continuous injection-locked mode.

In certain examples and referring to FIG. 1, a simplified block diagram of a generator is shown. The generator 100 comprises a driving circuit 110 that is configured to be enabled during operation of the generator 100 in the driven mode. The driving circuit 110 is shown as being electrically coupled to a load coil 130, though as described herein, the load coil 130 may be replaced with other induction devices including plate electrodes, for example. The generator 100 also comprises an oscillating circuit 120 electrically coupled to the load coil 130. Each of the circuits 110, 120 are electrically coupled to a power source (not shown). The driving circuit 110 and the oscillating circuit 120 may each be electrically coupled to a controller or processor 140 to permit operation of the different circuits 110, 120 at selected periods. In one method of operating the generator 100, a plasma is ignited by introducing a gas into the torch body 135, which is surrounded by the load coil 130. The plasma can be ignited with a spark or arc and sustained by enabling the driving circuit 110 to provide a controlled, driven RF signal to the plasma in the driven mode. When the plasma impedance stabilizes (or after a desired or selected time), the generator may be switched over from the driven mode to the oscillation mode. During the switch over process, both the driving circuit 110 and the oscillating circuit 120 may be enabled for some period, which provides an injection-locked mode. The driving circuit 110 can be disabled while keeping the oscillating circuit 120 enabled to switch the generator 100 over to the oscillation mode. Sample may then be introduced into the plasma, and the oscillation mode permits rapid adjustment of the impedance as the plasma becomes loaded with sample/solvent. If desired, and for certain samples, the generator 100 may be switched back to the driven mode for analysis. As described herein, for certain analyses, the driven mode may provide higher sensitivities compared to the oscillation mode. While the circuits 110, 120 are shown as separate circuits in FIG. 1 for illustration, the components of the driving circuit 110 and oscillating circuit 120 may be combined together as noted in more detail below.

Figure 2A:
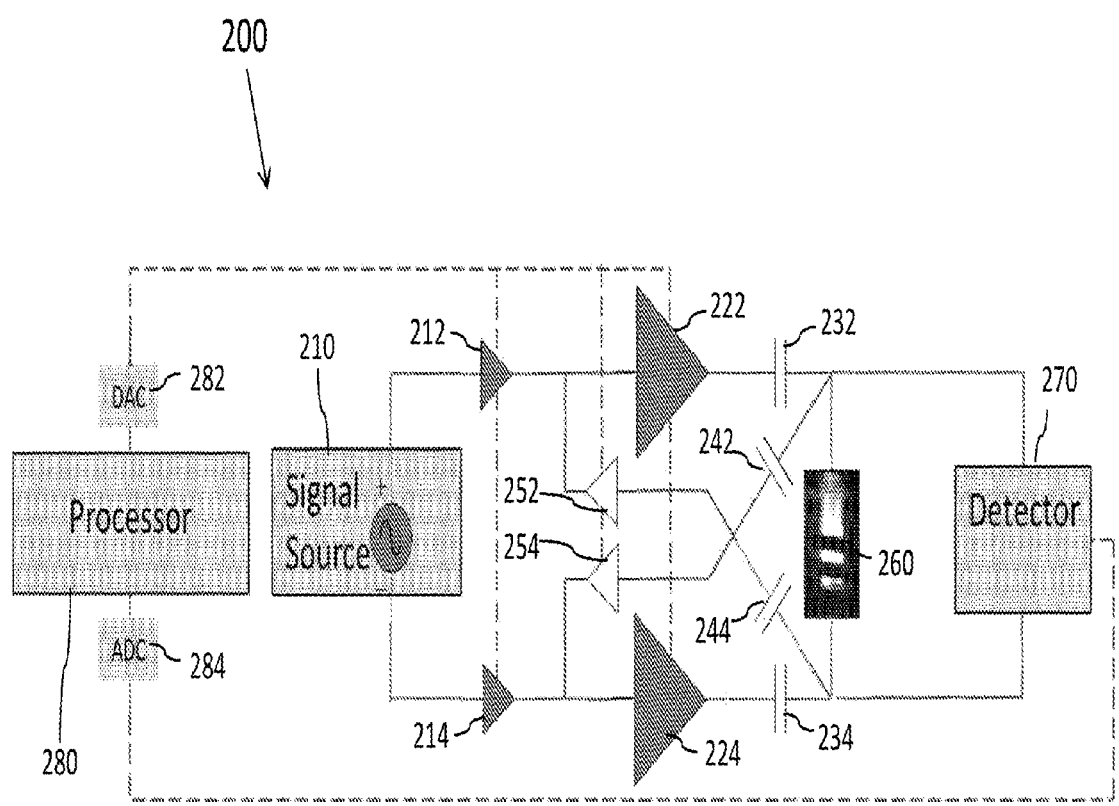
FIG. 2A is a circuit suitable for powering an induction device in a driven mode, in accordance with certain examples.

In certain embodiments and referring to FIG. 2A, a schematic of certain active components of a circuit suitable for implementing the driven mode and the oscillation mode is shown. In the schematic shown in FIG. 2A various components are active to permit operation of the circuit in the driven mode. The circuit 200 comprises a signal source 210, e.g., a frequency synthesizer or other suitable components as described herein, electrically coupled to a pair of amplifiers 212, 214. The amplifiers 212, 214 are each electrically coupled to another set of amplifiers 222, 224, respectively, and a load coil 260 through capacitors 232, 234, respectively. Additional components, e.g., resistors, amplifiers, etc. may also be present but are not shown to simplify this illustration. In use of the generator in the driven mode, a feedback loop (see FIG. 2B below, for example) is disabled, and the power provided to the load coil is selected to be below a threshold value where the transistors will fail. The frequency provided to the load coil 260 is scanned and tuned to a frequency which permits successful plasma ignition, e.g., a frequency which may maximize the coil voltage if desired. A detector 270, which is electrically coupled to a processor 280 through signal converters 282, 284, may be used to monitor the plasma. For example, the detector 270 may be configured as an RF detector that can be used to monitor RF signals provided to the load coil 260. In other configurations, the detector 270 may be configured as an optical detector, e.g., a light sensor, fiber optic sensor or other device, that can receive light emissions from the plasma once the plasma is ignited. In some embodiments, the detector 270 may be omitted and the power levels for a particular load coil (or other induction device) may be fixed and be set at a level to avoid transistor breakdown. The amplifiers 252, 254 are disabled in the driven mode. In operation, the determined power level is provided to the load coil 260, which surrounds some portion of a torch body (not shown), and plasma gas provided to the torch body is ignited while the power is being applied. A plasma is generated and sustained by continued application of RF power from the load coil 260. In certain embodiments, the generator may remain in the driven mode and sample may be introduced into the plasma. During sample introduction, sample is typically sprayed or nebulized into the plasma along with a carrier such as a solvent. The plasma is operative to desolvate the sample and atomize and/or ionize the chemical species in the plasma.

Figure 2B:
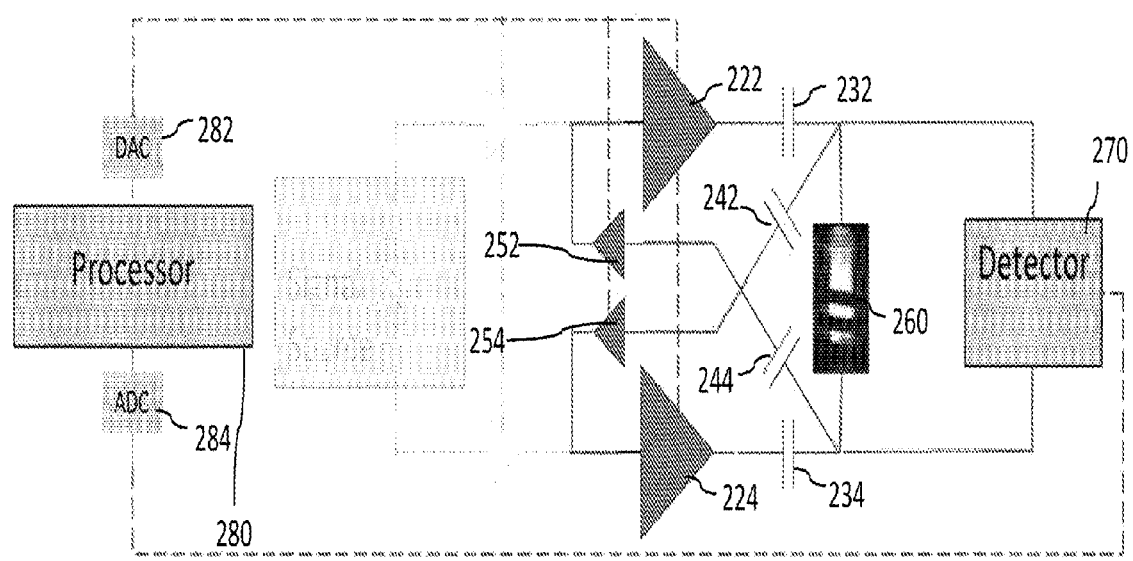
FIG. 2B is a circuit suitable for powering an induction device in an oscillation mode, in accordance with certain examples.

In certain examples, once the plasma is ignited and stabilizes, it may be desirable to switch to the oscillation mode by enabling the oscillating circuit and disabling the driving circuit. As noted herein, the oscillation mode provides feedback which can be used to rapidly adjust the impedance of the circuit to provide impedance matching and a more stable plasma in the torch. A schematic of certain active components of a circuit suitable for implementing the oscillation mode is shown in FIG. 2B. Components in FIG. 2B with similar reference numbers are the same as the components in FIG. 2A. To switch from the driven mode to the oscillation mode, amplifiers 252, 254, which are electrically coupled to the load coil 260 through capacitors 242, 244, are enabled to provide feedback. For some period, the amplifiers 212, 214, 252, 254 and the frequency synthesizer 210 are all enabled, which is referred to in certain instances herein as an injection-locked or hybrid mode (see FIG. 2C and below). The amplifiers 212, 214 and the frequency synthesizer 210 (see FIG. 2A) are then switched off to switch the generator from the driven mode to the oscillation mode. Once in the oscillation mode, sample may be introduced into the plasma. The oscillation mode can provide desirable attributes over the driven mode during sample introduction. As sample is introduced, the solvent may cool the plasma and quickly alter the plasma impedance. To avoid extinguishing of the plasma, the impedance desirably is adjusted quickly. The feedback provided by the amplifiers 252, 254 permits rapid adjustment of the impedance to maintain the plasma under the varying conditions present from the time sample is introduced, desolvated and atomized/ionized. While not described, it is possible to ignite the plasma using the oscillation mode described herein. For example, if the plasma is extinguished, the plasma may be reignited without having to switch the circuit back to the driven mode (though the circuit may be switched back to the driven mode if desired to reignite the plasma).

Figure 2C:
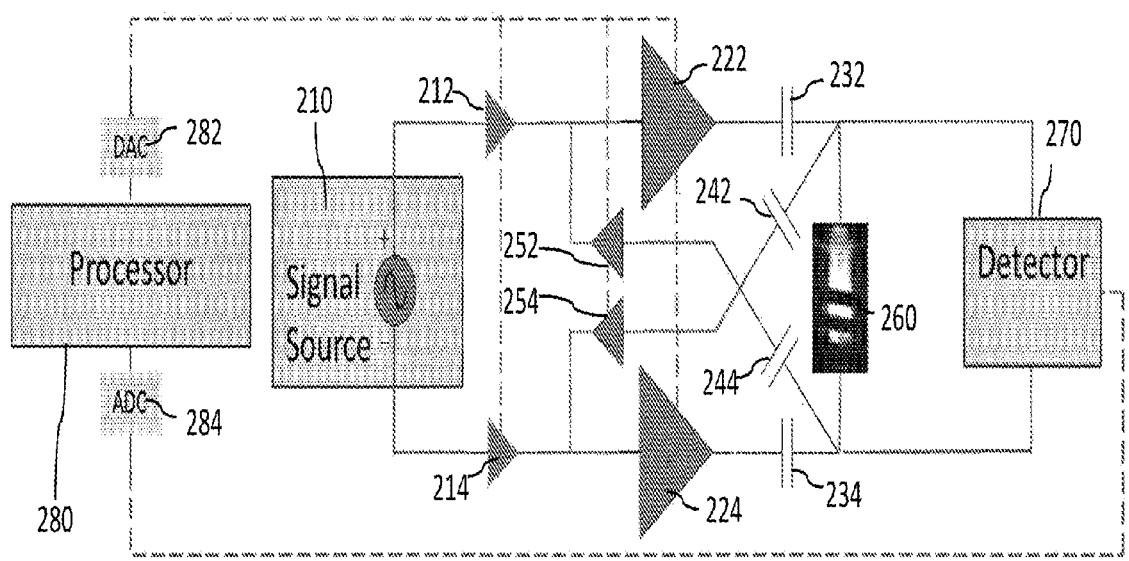
FIG. 2C is another circuit suitable for powering an induction device in a hybrid mode, in accordance with certain examples.

In certain configurations, during the transition from driven mode to oscillation mode, components of both modes may be enabled for some period to provide a hybrid mode. Referring to FIG. 2C, the feedback loop is enabled while components of the driven mode are also enabled. In particular, amplifiers 212, 214, 222, 224, 252 and 254 are all enabled in the hybrid mode. As such, power provided to the induction device 260 is a combination or hybrid of the driven mode and the oscillation mode. This hybrid mode may occur during the transition from driven mode to oscillation mode or oscillation mode or driven mode, or in other configurations, it may be desirable to operate the generator in the hybrid mode for certain analyses or tests. For example, the hybrid mode may reduce plasma phase noise so as to increase the plasma stability. Without wishing to be bound by any one particular theory, in the hybrid mode the plasma generator is in the oscillation mode, but the frequency is no longer free-running depending on the plasma impedance. Instead, the oscillator follows a relatively small signal injected to it at a controlled frequency. As a result, the plasma frequency results in a lower phase noise, and it can be controlled and optimized (if desired) by the controller or processor as desired. The plasma amplitude is generally still dependent on the positive feedback path of the oscillator because the injected signal at a controlled frequency is only a small signal. For instance, if methanol is loaded into the plasma, the plasma impedance will change. The plasma will look dimmer because methanol absorbs large amounts of energy from the plasma. For this reason, the plasma load coil voltages will increase because there is less plasma to the load coil. This result provides a larger feedback signal which will drive the oscillation-mode driver amplifiers harder to sustain the plasma. As a result, in the hybrid mode, the plasma energy can still react quickly to different samples with solvents and heavy matrices, but the frequency can be controlled by the optimization algorithm in the controller and is unaffected by the samples.

Figure 3A:
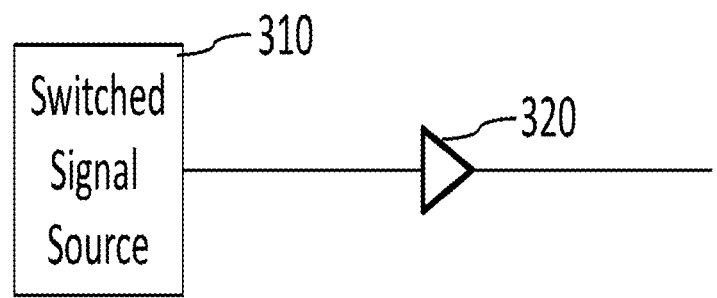
FIGS. 3A and 3B are illustrations of alternative configurations for use in the circuit of FIGS. 2A-2C, in accordance with certain configurations.
Figure 3B:
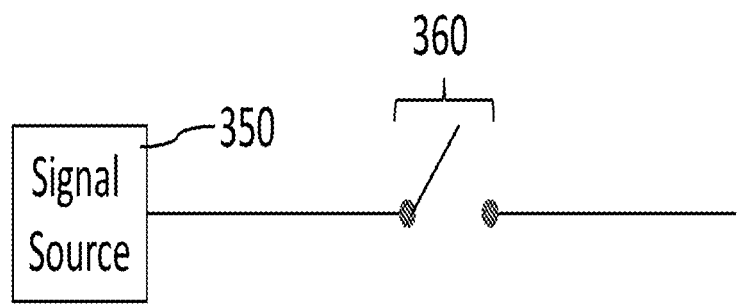
Figure 4A:
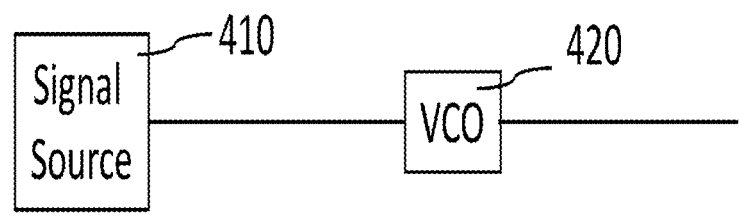
FIGS. 4A and 4B are additional illustrations of alternative configurations for use in the circuit of FIGS. 2A-2C, in accordance with certain configurations.
Figure 4B:
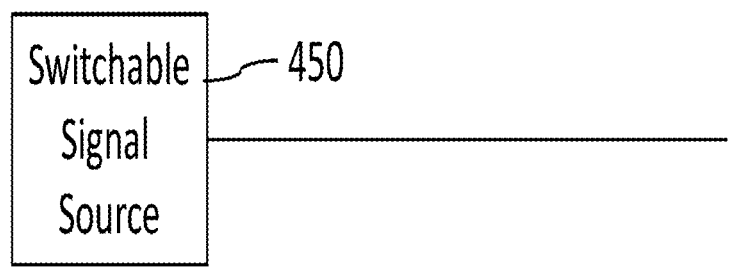

In certain embodiments, the amplifiers 212, 214 can be replaced with other components to permit switching of the generator from the driven mode to an oscillation mode or operation of the generator in a hybrid mode. Referring to FIG. 3A, a switched signal source 310, e.g., an RF source, VCO, phase locked loop or other components, may be electrically coupled to a drive amplifier 320. The source 310 may be switched on, for example, to provide power using the driven mode of the generator or may be switched off to disconnect the driving circuit from the generator. An alternative embodiment is shown in FIG. 3B where a signal source 350, e.g., RF signal source, VCO, etc. is electrically coupled to a switch 360. The signal source 350 may be operated in an "on" state continuously when the generator is switched on, and the switch 360 may electrically connect the signal source 350 to the other components in the generator or may electrically disconnect the signal source 350 to the other components in the generator depending on the state of the switch 360. In additional configurations (see FIG. 4A), a signal source 410 can be electrically coupled to a voltage controlled oscillator 420 to provide (or not provide) a signal to the other components of the system. For example, depending on the voltage applied to the VCO, a measurable signal may or may not be provided to the other components of the generator. If desired, the amplifiers may be omitted entirely and instead a switchable signal source 450 (see FIG. 4B) can be used. The signal source 450 may be a high power signal source such that no signal amplification is needed. Additional configurations where a signal source is electrically coupled to an induction device will be readily selected by the person of ordinary skill in the art, given the benefit of this disclosure.

Figure 5:
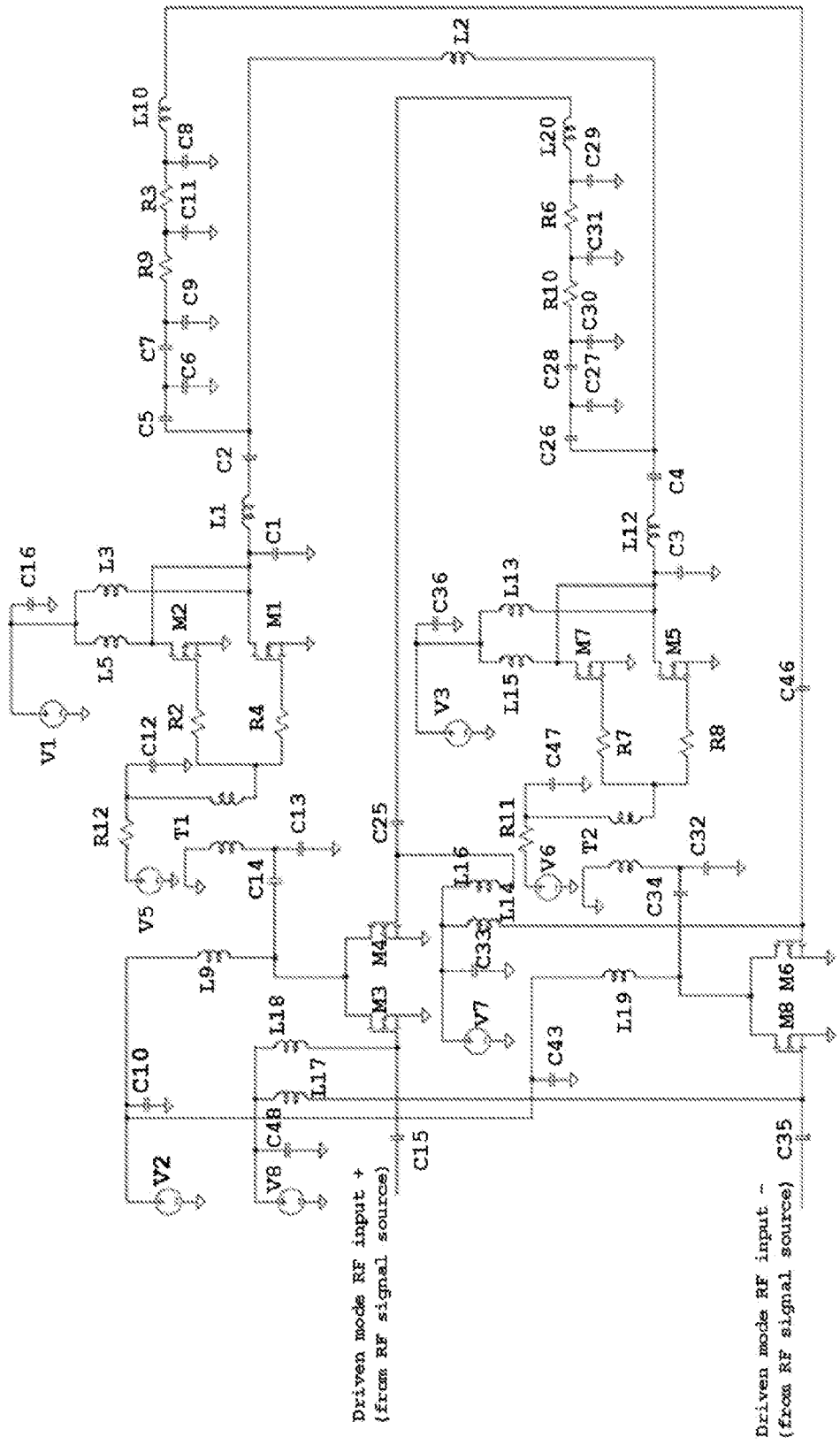
FIG. 5 is a schematic of an illustrative generator circuit suitable for use in powering an induction device in a driven mode, an oscillation mode and a hybrid mode, in accordance with certain configurations.

In certain examples, a simplified schematic of certain components of a generator is shown in FIG. 5. The induction coil is represented by the inductor L2. A first feedback path comprises capacitors C5, C6, C7, C9, resistor R9, capacitor C11, resistor R3, capacitor C8, and low pass filter L10. A second feedback path comprises capacitors C26, C27, C28, and C30, resistor R10, capacitor C31, resistor R6, capacitor C29, and low pass filter L20. The feedback paths couple induction device (L2) voltages (i.e., generator output) back to the input capacitors C25, C46 of the oscillation mode driver amplifier M4, M6. Capacitors C11, C8, C31 and C29 can be, for example, a combination of fixed-value ceramic capacitors and electronically tunable varactor diodes. The free-running frequency of the oscillator mode is also adjustable by a processor or controller (not shown). Capacitors C1 and C3 are present for impedance matching. Transistors M1 and M2 (and M5 and M7) may each be present in a single integrated circuit package, e.g., a power field effect transistor (FET) or LDMOS transistors, bipolar transistors, a Darlington pair or other commercially available transistors or components including transistors. M1+M2, M5+M7 are the main 1 kilo-Watt power MOSFET to generate RF power for the induction device L2. M3, M4, M6, M8 can be, for example, 25 Watt (lower power than 1 kilo-Watt) power FETs. M3 and M8 are the driven-mode driver amplifiers, and M4 and M6 are the oscillation-mode driver amplifiers. In using the circuit of FIG. 5 in the driven mode, the DC voltage source V8 is switched on (e.g., to 2.7V) to turn on the gate bias of M3 & M8, and the DC voltage V7 is set to 0V to disable M4 & M6. In the oscillation mode, the DC voltage source V7 is switched on (e.g., to 2.7V) to turn on the gate bias of M4 & M6, and the DC voltage V8 is set to 0V to disable M3 & M8. For the hybrid mode, the DC voltage is set for sources V7 and V8 (e.g., to 2.7V) to turn on the gate bias of M3, M4, M6 & M8. V5 and V6 are the DC voltage sources to turn on the gate bias of the power FETs M1, M2, M5 and M7 (regardless of driven, oscillation or injection locked mode). V5, V6, V7 and V8 are generated by an ADC (analog-to-digital converter), which is controlled by a processor or controller (not shown). T1, T2 can be ferrite-core 3:1 turns-ratio, step-down transformers. C13 and C32 can be capacitors to tune the frequency response of transformer T1 and T2. T1, T2, C13 and C32 can be omitted if desired. C2 and C4 are the high-voltage, high-power capacitors. L3, L5, L15, L13, L9, L19 can be the RF chokes for the VDD supply of the power MOSFETs. L14, L16, L17, L18 can be the RF chokes for the gate (VGG) supply of the power MOSFETs. Gate protection diodes for M1, M2, M5 and M7 are not shown though they may be present if desired. V1, V3 are the VDD DC supply for the 1-kiloWatt power FETs M1, M2, M5 and M7. V2 is the VDD DC supply for the driven-mode and oscillation-mode driver amplifiers M3, M4, M6 and M8. While the components shown in FIG. 5 are provided for illustration purposes, it is possible to omit or substitute other components into the circuit and still provide an operable generator capable of operation in the driven mode, the oscillation mode and the hybrid mode. In addition, suitable circuits comprising fewer transistors, e.g., one or two transistors, may be provided to operate the generator in the driven mode, the oscillation mode and the hybrid mode.

Figure 6A:
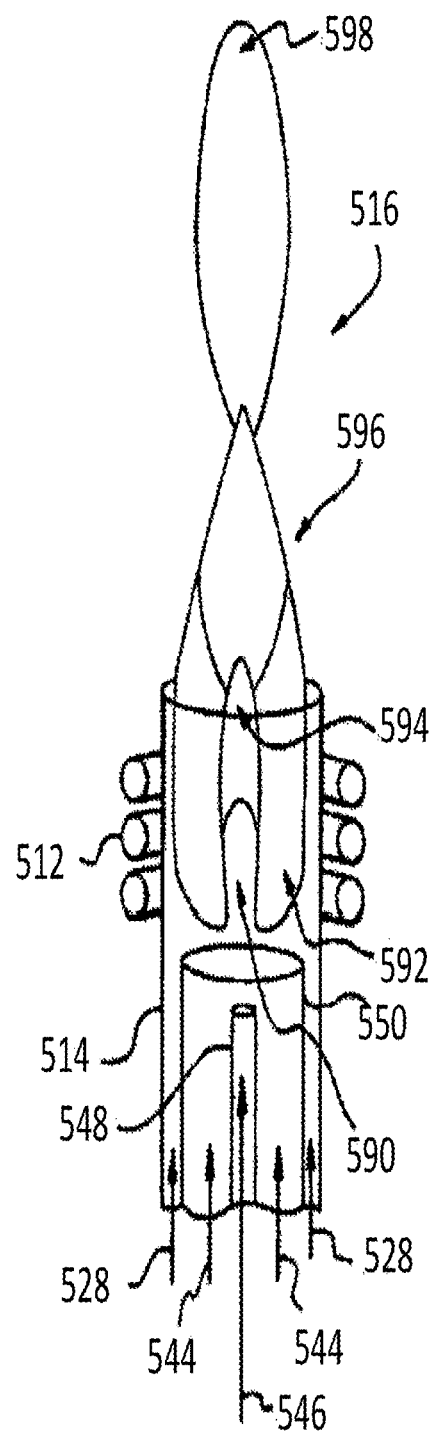
FIG. 6A is an illustration of a torch and load coil device that can be used to sustain an inductively coupled plasma, in accordance with certain examples.

In certain examples, induction devices suitable for use with the generators described herein may vary. In some embodiments, the induction device may comprises a load coil comprising a wire coiled a selected number of turns, e.g., 3-10 turns. The coiled wire provides RF energy into the torch to sustain the plasma. For example and referring to FIG. 6A, a torch 514 and load coil 512 is shown that would electrically couple to one of the generators described herein, e.g., the load coil 512 would be L2 in the schematic of FIG. 5. The torch 514 includes three generally concentric tubes 514, 550, and 548. The innermost tube 548 provides atomized flow 546 of the sample into the plasma 516. The middle tube 550 provides auxiliary gas flow 544 to the plasma 516. The outermost tube 514 provides carrier gas flow 528 for sustaining the plasma. The carrier gas flow 528 may be directed to the plasma 516 in a laminar flow about the middle tube 550. The auxiliary gas flow 544 may be directed to the plasma 516 within the middle tube 550 and the sample flow 546 may be directed to the plasma 516 from a spray chamber (not shown) or other sample introduction device along the innermost tube 548. RF current provided to the load coil 512 from the generator may form a magnetic field within the load coil 512 so as to confine the plasma 516 therein. A plasma tail 598 is shown that exits the torch 514. In certain examples, the plasma 516 comprises a preheating zone 590, an induction zone 592, an initial radiation zone 594, an analytic zone 596 and a plasma tail 598. In operation of the load coil 512, a plasma gas may be introduced into the torch 512 and ignited. RF power from the generator electrically coupled to the load coil 512 may be provided in the driven mode to sustain the plasma 516 during ignition. In a typical plasma, argon gas may be introduced into the torch at flow rates of about 15-20 Liters per minute. The plasma 516 may be generated using a spark or an arc to ignite the argon gas. The toroidal magnetic field from the induction coil 512 causes argon atoms and ions to collide, which results in a superheated environment, e.g., about 5,000-10,000 K or higher, that forms the plasma 516. Once the plasma 516 stabilizes, the generator may be switched from the driven mode to the oscillation mode to permit rapid adjustment of the impedance as the impedance of the plasma 516 changes during sample introduction through the tube 546. If desired, the generator may be switched back to the driven mode or to the hybrid mode for analysis of certain samples. While the load coil 512 is shown in FIG. 6A as including about three turns, it will be recognized by the person of ordinary skill in the art, given the benefit of this disclosure, that fewer or more than three turns may be present in the load coil 512.

Figure 6B:
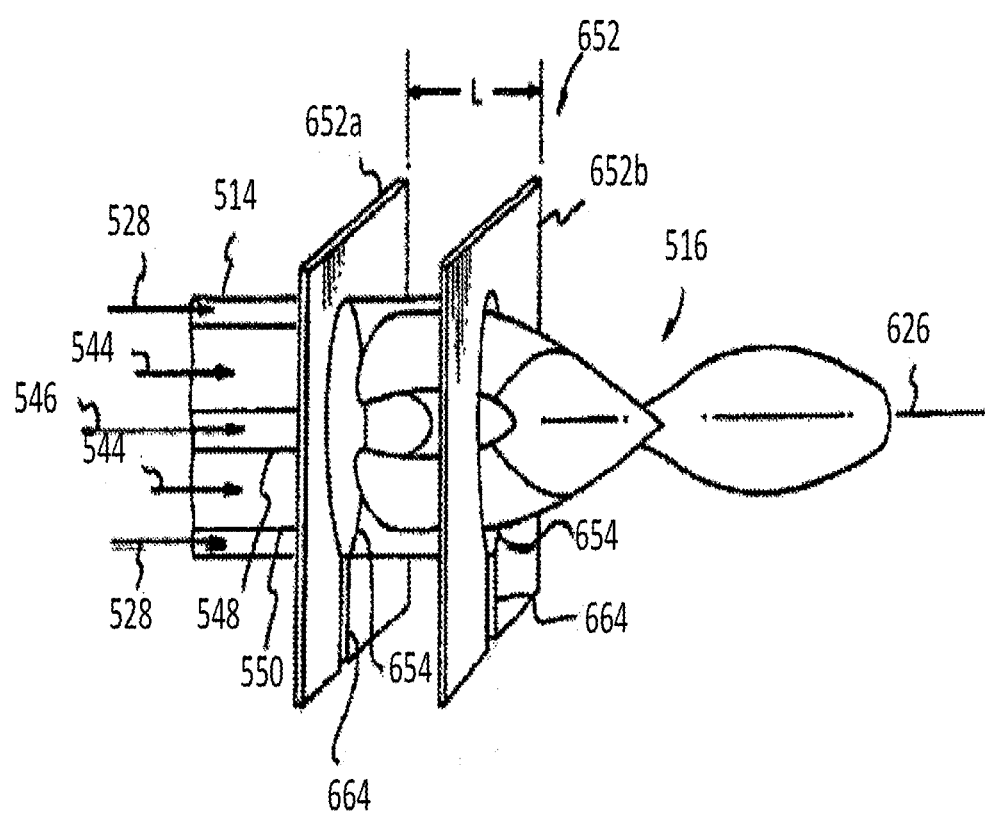
FIG. 6B is an illustration of a torch and plate electrodes that can be used to sustain an inductively coupled plasma, in accordance with certain examples.

In some embodiments, one or more plate electrodes may be electrically coupled to the generators described herein. In certain examples, the planar nature of the plate electrodes permits generation of a loop current in the torch body which is substantially perpendicular to the longitudinal axis of the torch body. The plate electrodes may be spaced symmetric from each other where more than two plate electrodes are present, or the plates electrodes may be asymmetrically spaced from each other, if desired. An illustration of two plate electrodes that can be electrically coupled to a generator to permit operation of the plate electrodes when the generator is in a driven mode and an oscillation mode is shown in FIG. 6B. The electrode 652 comprises two substantially parallel plates 652a, 652b positioned at a distance 'L' from one another. Each of the parallel plates 652a, 652b includes an aperture 654 through which the torch 514 may be positioned such that the torch 514, the innermost tube 548, the middle tube 550 and the aperture 654 are aligned along a longitudinal axis 626, which is generally parallel to the longitudinal axis of the torch 514. The exact dimensions and shapes of the aperture may vary and may be any suitable dimensions and shapes that can accept a torch. For example, the aperture 654 may be generally circular, may be square or rectangular shaped or may have other shapes, e.g., may be triangular, oval, ovoid, or other suitable geometries. In certain examples, the aperture may be sized such that it is about 0-50% or typically about 3% larger than the outer diameter of the torch 514, whereas in other examples, the torch 514 may contact the plates 652a, 652b, e.g., some portion of the torch may contact a surface of a plate, without any substantial operational problems. The aperture 654 of the electrode 552 may also include a slot 564 such that the aperture 554 is in communication with its surroundings. In use of the plates 652a, 652b, a generator as described herein is electrically coupled to the plates 652a, 652b. RF current is supplied to the plates 652a, 652b in the driven mode, oscillation mode or injection-locked mode to provide a planar loop current, which generates a toroidal magnetic field through the aperture 654. To ignite the plasma, the generator is desirably set to the driven mode (though the oscillation mode or hybrid mode could be used to ignite the plasma as well) and provides an RF current which generates a planar current loop that is substantially parallel to a radial plane, which is substantially perpendicular to the longitudinal axis of the torch 514. After ignition of the plasma 516, the generator may be switched over from the driven mode to the oscillation mode prior to introduction of sample into the torch 514. If desired, the generator may be switched back to the driven mode or the hybrid mode for analysis of certain samples. Though two plate electrodes 652a, 652b are shown in FIG. 6B, a single plate electrode can be used, three plate electrodes can be used or more than three plate electrodes can be used. As discussed in more detail below, each of the plates may be electrically coupled to the same generator or may be electrically coupled to a different generator if desired.

Figure 7:
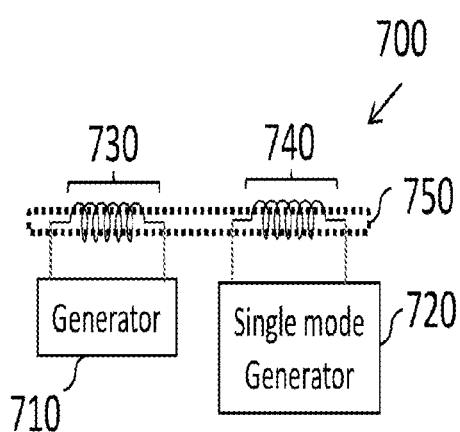
FIGS. 7-9 are block diagrams of two load coils separately powered by two generators, in accordance with certain examples.

In certain embodiments, the generators described herein may be used in combination with another generator, which may be the same or may be different. For ease of illustration, block diagrams of several configurations are included herein. The term "single mode generator" refers to a generator which can operate in a driven mode or in an oscillation mode but is generally not switchable between the modes. Referring to FIG. 7, a system 700 comprising a hybrid generator 710 as described herein and a single mode generator 720 each coupled to a load coil 730, 740, respectively is shown. Torch 750 is positioned in the apertures of each of the load coils 730, 740. In operation of the system 700, the generator 710 may be used to provide power to the coil 730 in a driven mode, an oscillation mode or a hybrid mode. Plasma gas enters at the left of the tube 750 and arrives axially at the coil 730 first. The generator 720 may be configured as either a driven mode generator or an oscillation mode generator. In some embodiments, generator 710 is operated in the driven mode to ignite a plasma in the torch 750 and then generator 720 is switched on subsequent to plasma ignition. In other embodiments, both the generators 710, 720 may be switched on during plasma ignition. In some instances, generator 720 may not be switched on until the generator 710 is switched from a driven mode to an oscillation mode. For example, the generator 720 may be configured as an oscillating generator that is switched on simultaneously when the generator 710 is switched from a driven mode to an oscillation mode. In some embodiments, the generator 710 may be used in an oscillation mode to desolvate sample, and the generator 720 may be a driven mode generator used to atomize/ionize the sample. In other embodiments, the generator 710 may be used in an oscillation mode to desolvate sample, and the generator 720 may be an oscillation generator used to atomize/ionize the sample. In additional embodiments, the generator 710 may be used in a driven mode to desolvate sample, and the generator 720 may be a driven mode generator used to atomize/ionize the sample. In certain embodiments, the generator 710 may be used in a driven mode to desolvate sample, and the generator 720 may be an oscillation generator used to atomize/ionize the sample. If desired, the number of coils in the load coils 730, 740 may be different or may be the same.

Figure 8:
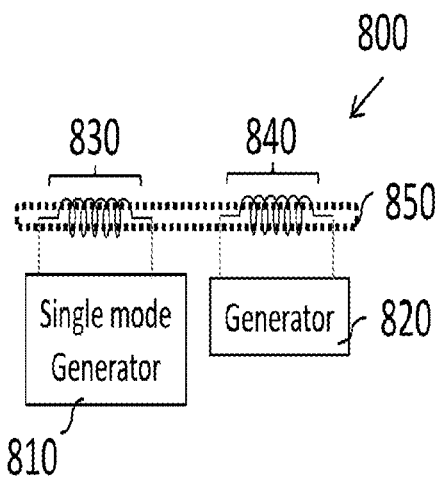

In certain examples, another system is shown in FIG. 8 where a single mode generator is positioned upstream of a hybrid generator, e.g., one that can be operated in a driven mode, an oscillation mode and/or a hybrid mode, as described herein. The system 800 comprises a single mode generator 810 and a hybrid generator 820 each coupled to a load coil 830, 840, respectively. Torch 850 is positioned in the apertures of each of the load coils 830, 840. In operation of the system 800, the generator 820 may be used to provide power to the coil 840 in a driven mode, an oscillation mode or a hybrid mode. Plasma gas enters at the left of the tube 850 and arrives axially at the coil 830 first. The generator 810 may be configured as either a driven mode generator or an oscillation mode generator. In some embodiments, generator 820 is operated in the driven mode to ignite a plasma in the torch 850 and then generator 810 is switched on subsequent to plasma ignition. In other embodiments, both the generators 810, 820 may be switched on during plasma ignition. In some instances, generator 810 may not be switched on until the generator 820 is switched from a driven mode to an oscillation mode. For example, the generator 810 may be configured as an oscillating generator that is switched on simultaneously when the generator 820 is switched from a driven mode to an oscillation mode. In some embodiments, the generator 810 may be an oscillation generator to desolvate sample, and the generator 820 may be operated in a driven mode to atomize/ionize the sample. In certain embodiments, the generator 810 may be an oscillation generator to desolvate sample, and the generator 820 may be operated in an oscillation mode to atomize/ionize the sample. In other embodiments, the generator 810 may be a driven mode generator, and the generator 820 may be operated in a driven mode to atomize/ionize the sample. In additional embodiments, the generator 810 may be a driven mode generator, and the generator 820 may be operated in an oscillation mode to atomize/ionize the sample. If desired, the number of coils in the load coils 830, 840 may be different or may be the same.

Figure 9:
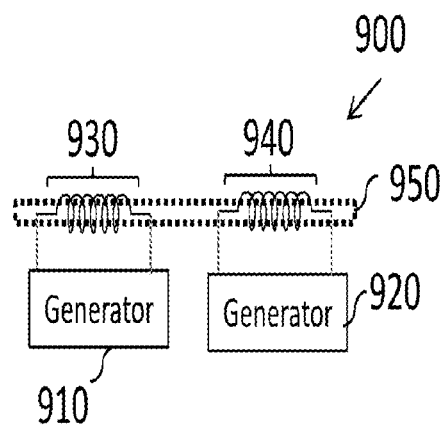

In certain examples, another system is shown in FIG. 9 where two hybrid generators, as described herein, are present. The system 900 comprises a first hybrid generator 910 and a second hybrid generator 920 each coupled to a load coil 930, 940, respectively. Torch 950 is positioned in the apertures of each of the load coils 930, 940. In operation of the system 900, each of generators 910,920 may be used to provide power to the coils 930, 940, respectively, in a driven mode, an oscillation mode or a hybrid mode. Plasma gas enters at the left of the tube 950 and arrives axially at the coil 930 first. In some embodiments, each of the generators 910, 920 is operated in the driven mode during plasma ignition. In other embodiments, only one of the generators 910, 920 is operated in the driven mode during plasma ignition, and the other generator may be switched off or may be operated in the oscillation mode. Subsequent to plasma ignition, one or both of the generators 910, 920 may be switched from a driven mode to an oscillation mode. For example, generator 910 may remain operated in a driven mode and generator 920 may be switched to an oscillation mode. In a different configuration, generator 910 is switched to an oscillation mode and generator 920 remains in the driven mode. In another configuration, generators 910, 920 are each switched to an oscillation mode, though they may be switched at the same time or generator 910 may first be switched to an oscillation mode followed by switching of generator 920 to an oscillation mode (or vice versa).

Figure 10:
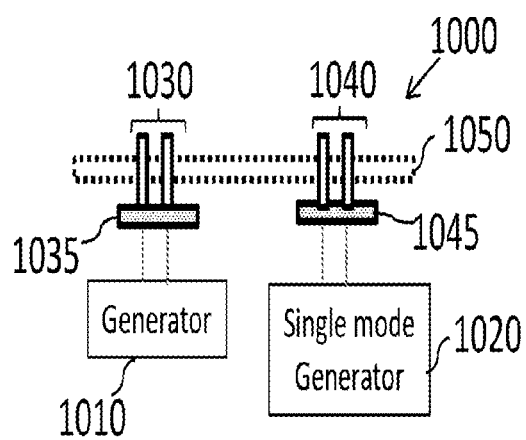
FIGS. 10-12 are block diagrams of two plate electrodes separately powered by two generators, in accordance with certain examples.
Figure 11:
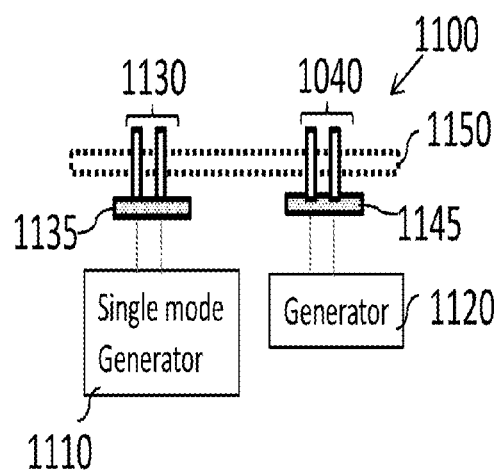
Figure 12:
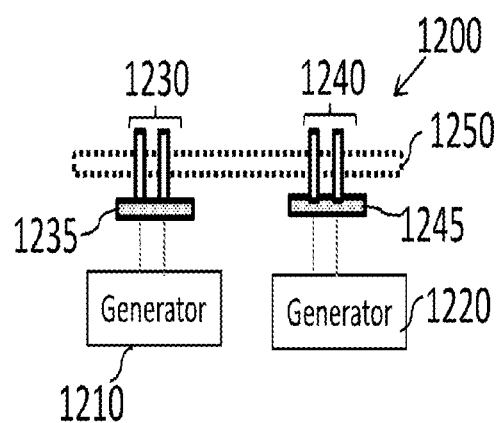

In certain embodiments where more than a single generator is present, each generator may be independently electrically coupled to one, two, three or more plate electrodes. Illustrations using two plate electrodes for convenience purposes are shown in FIGS. 10-12. Referring to FIG. 10, a system 1000 comprising a hybrid generator 1010 as described herein and a single mode generator 1020 each coupled to a pair of plate electrodes 1030, 1040, respectively is shown. The plate electrodes 1030, 1040 are shown coupled to a respective mounting plate 1035, 1045. Torch 1050 is positioned in the apertures of each of the plates 1030, 1040. In operation of the system 1000, the generator 1010 may be used to provide power to the plates 1030 in a driven mode, an oscillation mode or a hybrid mode. Plasma gas enters at the left of the tube 1050 and arrives axially at the plates 1030 first. The generator 1020 may be configured as either a driven mode generator or an oscillation mode generator. In some embodiments, generator 1010 is operated in the driven mode to ignite a plasma in the torch 1050 and then generator 1020 is switched on subsequent to plasma ignition. In other embodiments, both the generators 1010, 1020 may be switched on during plasma ignition. In some instances, generator 1020 may not be switched on until the generator 1010 is switched from a driven mode to an oscillation mode. For example, the generator 1020 may be configured as an oscillating generator that is switched on simultaneously when the generator 1010 is switched from a driven mode to an oscillation mode. In some embodiments, the generator 1010 may be used in an oscillation mode to desolvate sample, and the generator 1020 may be a driven mode generator used to atomize/ionize the sample. In other embodiments, the generator 1010 may be used in an oscillation mode to desolvate sample, and the generator 1020 may be an oscillation generator used to atomize/ionize the sample. In additional embodiments, the generator 1010 may be used in a driven mode to desolvate sample, and the generator 1020 may be a driven mode generator used to atomize/ionize the sample. In certain embodiments, the generator 1010 may be used in a driven mode to desolvate sample, and the generator 1020 may be an oscillation generator used to atomize/ionize the sample.

In certain embodiments, another system is shown in FIG. 11 where a single mode generator is positioned upstream of a hybrid generator as described herein. The system 1100 comprises a single mode generator 1110 and a hybrid generator 1120 each coupled to a pair of plate electrodes 1130, 1140, respectively. The plate electrodes 1130, 1140 are shown coupled to a mounting plate 1135, 1145, respectively. Torch 1150 is positioned in the apertures of each of the plate electrodes 1130, 1140. In operation of the system 1100, the generator 1120 may be used to provide power to the plates 1140 in a driven mode, an oscillation mode or a hybrid mode. Plasma gas enters at the left of the tube 1150 and arrives axially at the plates 1130 first. The generator 1110 may be configured as either a driven mode generator or an oscillation mode generator. In some embodiments, generator 1120 is operated in the driven mode to ignite a plasma in the torch 1150 and then generator 1110 is switched on subsequent to plasma ignition. In other embodiments, both the generators 1110, 1120 may be switched on during plasma ignition. In some instances, generator 1110 may not be switched on until the generator 1120 is switched from a driven mode to an oscillation mode. For example, the generator 1110 may be configured as an oscillating generator that is switched on simultaneously when the generator 1120 is switched from a driven mode to an oscillation mode. In some embodiments, the generator 1110 may be an oscillation generator to desolvate sample, and the generator 1120 may be operated in a driven mode to atomize/ionize the sample. In certain embodiments, the generator 1110 may be an oscillation generator to desolvate sample, and the generator 1120 may be operated in an oscillation mode to atomize/ionize the sample. In other embodiments, the generator 1110 may be a driven mode generator, and the generator 1120 may be operated in a driven mode to atomize/ionize the sample. In additional embodiments, the generator 1110 may be a driven mode generator, and the generator 1120 may be operated in an oscillation mode to atomize/ionize the sample.

In certain examples, another system is shown in FIG. 12 where two hybrid generators, as described herein, are present. The system 1200 comprises a first hybrid generator 1210 and a second hybrid generator 1220 each coupled to a pair of plate electrodes 1230, 1240, respectively. The plate electrodes 1230, 1240 are shown coupled to a respective mounting plate 1235, 1245. Torch 1250 is positioned in the apertures of each of the plate electrodes 1230, 1240. In operation of the system 1200, each of generators 1210, 1220 may be used to provide power to the plates 1230, 1240, respectively, in a driven mode, an oscillation mode or a hybrid mode. Plasma gas enters at the left of the torch 1250 and arrives axially at the coil 1230 first. In some embodiments, each of the generators 1210, 1220 is operated in the driven mode during plasma ignition. In other embodiments, only one of the generators 1210, 1220 is operated in the driven mode during plasma ignition, and the other generator may be switched off or may be operated in the oscillation mode. Subsequent to plasma ignition, one or both of the generators 1210, 1220 may be switched from a driven mode to an oscillation mode. For example, generator 1210 may remain operated in a driven mode and generator 1220 may be switched to an oscillation mode. In a different configuration, generator 1210 is switched to an oscillation mode and generator 1220 remains in the driven mode. In another configuration, generators 1210, 1220 are each switched to an oscillation mode, though they may be switched at the same time or generator 1210 may first be switched to an oscillation mode followed by switching of generator 1220 to an oscillation mode (or vice versa).

Figure 13:
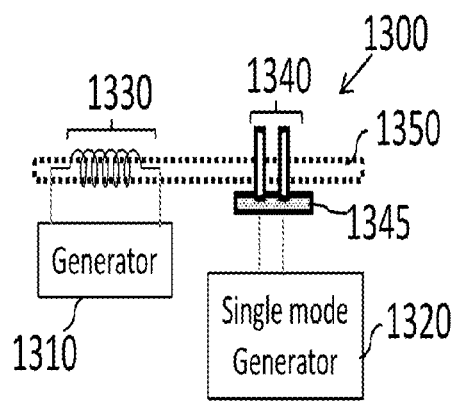
FIGS. 13-18 are block diagrams of a load coil and a set of plate electrodes separately powered by two generators, in accordance with certain examples.

In certain embodiments where more than a single generator is present, one generator may be independently electrically coupled to one, two, three or more plate electrodes and the other generator may be electrically coupled to a load coil. Illustrations using two plate electrodes for convenience purposes are shown in FIGS. 13-18. Referring to FIG. 13, a system 1300 comprising a hybrid generator 1310 as described herein and a single mode generator 1320. The generator 1310 is electrically coupled to a load coil 1330, and the generator 1320 is electrically coupled to plate electrode 1340. The plate electrodes 1340 are shown coupled to a mounting plate 1345. Torch 1350 is positioned in the apertures of the load coil 1330 and the plates 1340. In operation of the system 1300, the generator 1310 may be used to provide power to the coil 1330 in a driven mode, an oscillation mode or a hybrid mode. Plasma gas enters at the left of the tube 1350 and arrives axially at the coil 1330 first. The generator 1320 may be configured as either a driven mode generator or an oscillation mode generator. In some embodiments, the generator 1310 is operated in the driven mode to ignite a plasma in the torch 1350 and then generator 1320 is switched on subsequent to plasma ignition. In other embodiments, both the generators 1310, 1320 may be switched on during plasma ignition. In some instances, generator 1320 may not be switched on until the generator 1310 is switched from a driven mode to an oscillation mode. For example, the generator 1320 may be configured as an oscillating generator that is switched on simultaneously when the generator 1310 is switched from a driven mode to an oscillation mode. In some embodiments, the generator 1310 may be used in an oscillation mode to desolvate sample, and the generator 1320 may be a driven mode generator used to atomize/ionize the sample. In other embodiments, the generator 1310 may be used in an oscillation mode to desolvate sample, and the generator 1320 may be an oscillation generator used to atomize/ionize the sample. In additional embodiments, the generator 1310 may be used in a driven mode to desolvate sample, and the generator 1320 may be a driven mode generator used to atomize/ionize the sample. In certain embodiments, the generator 1310 may be used in a driven mode to desolvate sample, and the generator 1320 may be an oscillation generator used to atomize/ionize the sample.

Figure 14:
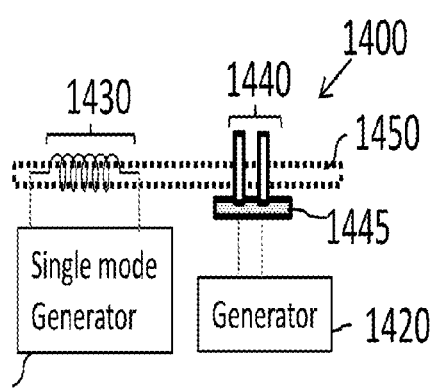

In certain examples, another system is shown in FIG. 14 where a single mode generator is positioned upstream of a hybrid generator as described herein. The system 1400 comprises a single mode generator 1410 and a hybrid generator 1420. The generator 1410 is electrically coupled to a load coil 1430, and the generator 1420 is electrically coupled to plate electrodes 1440. The plate electrodes 1440 are shown coupled to a mounting plate 1445. Torch 1150 is positioned in the apertures of each of the load coil 1430 and the plate electrodes 1440. In operation of the system 1400, the generator 1420 may be used to provide power to the plates 1440 in a driven mode, an oscillation mode or a hybrid mode. Plasma gas enters at the left of the tube 1450 and arrives axially at the coil 1430 first. The generator 1410 may be configured as either a driven mode generator or an oscillation mode generator. In some embodiments, generator 1420 is operated in the driven mode to ignite a plasma in the torch 1450 and then generator 1410 is switched on subsequent to plasma ignition. In other embodiments, both the generators 1410, 1420 may be switched on during plasma ignition. In some instances, generator 1410 may not be switched on until the generator 1420 is switched from a driven mode to an oscillation mode. For example, the generator 1410 may be configured as an oscillating generator that is switched on simultaneously when the generator 1420 is switched from a driven mode to an oscillation mode. In some embodiments, the generator 1410 may be an oscillation generator to desolvate sample, and the generator 1420 may be operated in a driven mode to atomize/ionize the sample. In certain embodiments, the generator 1410 may be an oscillation generator to desolvate sample, and the generator 1420 may be operated in an oscillation mode to atomize/ionize the sample. In other embodiments, the generator 1410 may be a driven mode generator, and the generator 1420 may be operated in a driven mode to atomize/ionize the sample. In additional embodiments, the generator 1410 may be a driven mode generator, and the generator 1420 may be operated in an oscillation mode to atomize/ionize the sample.

Figure 15:
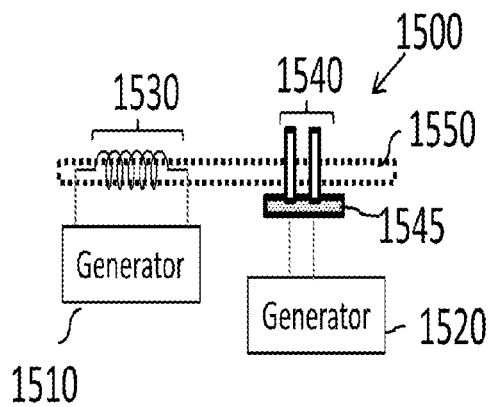

In certain examples, another system is shown in FIG. 15 where two hybrid generators, as described herein, are present. The system 1500 comprises a first hybrid generator 1510 and a second hybrid generator 1520. The generator 1510 is electrically coupled to a load coil 1530, and the generator 1520 is electrically coupled to plate electrodes 1540. The plate electrodes 1540 are shown coupled to a mounting plate 1545. Torch 1550 is positioned in the apertures of each of the load coil 1530 and the plate electrodes 1540. In operation of the system 1500, each of generators 1510, 1520 may be used to provide power to the plates 1530, 1540, respectively, in a driven mode, an oscillation mode or a hybrid mode. Plasma gas enters at the left of the torch 1550 and arrives under the coil 1530 first. In some embodiments, each of the generators 1510, 1520 is operated in the driven mode during plasma ignition. In other embodiments, only one of the generators 1510, 1520 is operated in the driven mode during plasma ignition, and the other generator may be switched off or may be operated in the oscillation mode. Subsequent to plasma ignition, one or both of the generators 1510, 1520 may be switched from a driven mode to an oscillation mode. For example, generator 1510 may remain operated in a driven mode and generator 1520 may be switched to an oscillation mode. In a different configuration, generator 1510 is switched to an oscillation mode and generator 1520 remains in the driven mode. In another configuration, generators 1510, 1520 are each switched to an oscillation mode, though they may be switched at the same time or generator 1510 may first be switched to an oscillation mode followed by switching of generator 1520 to an oscillation mode (or vice versa).

Figure 16:
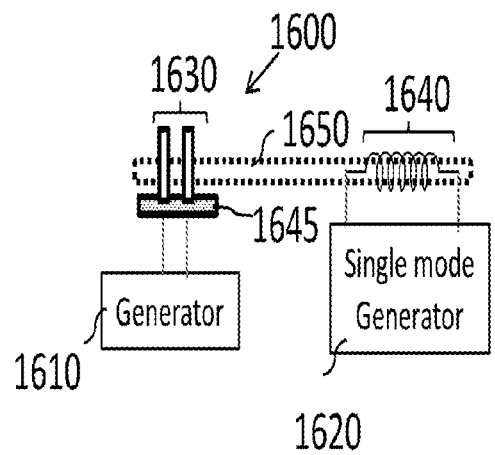

Referring to FIG. 16, a system 1600 is shown comprising a hybrid generator 1610 as described herein and a single mode generator 1620. The generator 1610 is electrically coupled to plate electrodes 1630, and the generator 1620 is electrically coupled to a load coil 1640. The plate electrodes 1630 are shown coupled to a mounting plate 1645. Torch 1650 is positioned in the apertures of the load coil 1640 and the plates 1630. In operation of the system 1600, the generator 1610 may be used to provide power to the plates 1630 in a driven mode, an oscillation mode or a hybrid mode. Plasma gas enters at the left of the tube 1650 and arrives axially at the plates 1630 first. The generator 1620 may be configured as either a driven mode generator or an oscillation mode generator. In some embodiments, the generator 1610 is operated in the driven mode to ignite a plasma in the torch 1650 and then generator 1620 is switched on subsequent to plasma ignition. In other embodiments, both the generators 1610, 1620 may be switched on during plasma ignition. In some instances, generator 1620 may not be switched on until the generator 1610 is switched from a driven mode to an oscillation mode. For example, the generator 1620 may be configured as an oscillating generator that is switched on simultaneously when the generator 1610 is switched from a driven mode to an oscillation mode. In some embodiments, the generator 1610 may be used in an oscillation mode to desolvate sample, and the generator 1620 may be a driven mode generator used to atomize/ionize the sample. In other embodiments, the generator 1610 may be used in an oscillation mode to desolvate sample, and the generator 1620 may be an oscillation generator used to atomize/ionize the sample. In additional embodiments, the generator 1610 may be used in a driven mode to desolvate sample, and the generator 1620 may be a driven mode generator used to atomize/ionize the sample. In certain embodiments, the generator 1610 may be used in a driven mode to desolvate sample, and the generator 1620 may be an oscillation generator used to atomize/ionize the sample.

Figure 17:
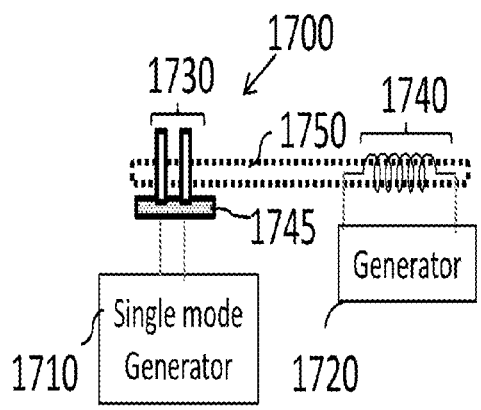

In certain examples, another system is shown in FIG. 17 where a single mode generator is positioned upstream of a hybrid generator as described herein. The system 1700 comprises a single mode generator 1710 and a hybrid generator 1720. The generator 1710 is electrically coupled to plate electrodes 1730, and the generator 1720 is electrically coupled to a load coil 1740. The plate electrodes 1730 are shown coupled to a mounting plate 1745. Torch 1750 is positioned in the apertures of each of the load coil 1740 and the plate electrodes 1730. In operation of the system 1700, the generator 1720 may be used to provide power to the load coil 1740 in a driven mode, an oscillation mode or a hybrid mode. Plasma gas enters at the left of the tube 1750 and arrives axially at the plates 1730 first. The generator 1710 may be configured as either a driven mode generator or an oscillation mode generator. In some embodiments, generator 1720 is operated in the driven mode to ignite a plasma in the torch 1750 and then generator 1710 is switched on subsequent to plasma ignition. In other embodiments, both the generators 1710, 1720 may be switched on during plasma ignition. In some instances, generator 1710 may not be switched on until the generator 1720 is switched from a driven mode to an oscillation mode. For example, the generator 1710 may be configured as an oscillating generator that is switched on simultaneously when the generator 1720 is switched from a driven mode to an oscillation mode. In some embodiments, the generator 1710 may be an oscillation generator to desolvate sample, and the generator 1720 may be operated in a driven mode to atomize/ionize the sample. In certain embodiments, the generator 1710 may be an oscillation generator to desolvate sample, and the generator 1720 may be operated in an oscillation mode to atomize/ionize the sample. In other embodiments, the generator 1710 may be a driven mode generator, and the generator 1720 may be operated in a driven mode to atomize/ionize the sample. In additional embodiments, the generator 1710 may be a driven mode generator, and the generator 1720 may be operated in an oscillation mode to atomize/ionize the sample.

Figure 18:
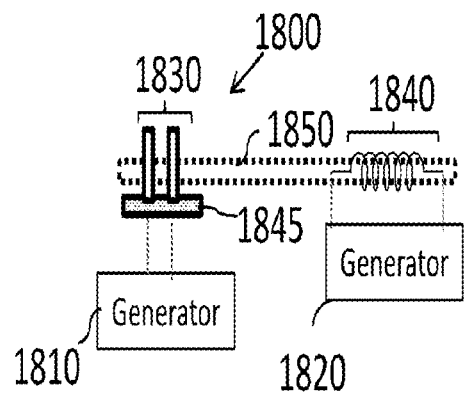

In certain examples, another system is shown in FIG. 18 where two hybrid generators, as described herein, are present. The system 1800 comprises a first hybrid generator 1810 and a second hybrid generator 1820. The generator 1810 is electrically coupled to plate electrodes 1830, and the generator 1820 is electrically coupled to a load coil 1840. The plate electrodes 1830 are shown coupled to a mounting plate 1845. Torch 1850 is positioned in the apertures of each of the load coil 1840 and the plate electrodes 1830. In operation of the system 1800, each of generators 1810, 1820 may be used to provide power to the plates 1830, and load coil 1840, respectively, in a driven mode, an oscillation mode or a hybrid mode. Plasma gas enters at the left of the torch 1850 and arrives axially at the plates 1830 first. In some embodiments, each of the generators 1810, 1820 is operated in the driven mode during plasma ignition. In other embodiments, only one of the generators 1810, 1820 is operated in the driven mode during plasma ignition, and the other generator may be switched off or may be operated in the oscillation mode. Subsequent to plasma ignition, one or both of the generators 1810, 1820 may be switched from a driven mode to an oscillation mode. For example, generator 1810 may remain operated in a driven mode and generator 1820 may be switched to an oscillation mode. In a different configuration, generator 1810 is switched to an oscillation mode and generator 1820 remains in the driven mode. In another configuration, generators 1810, 1820 are each switched to an oscillation mode, though they may be switched at the same time or generator 1810 may first be switched to an oscillation mode followed by switching of generator 1820 to an oscillation mode (or vice versa).

Figure 19:
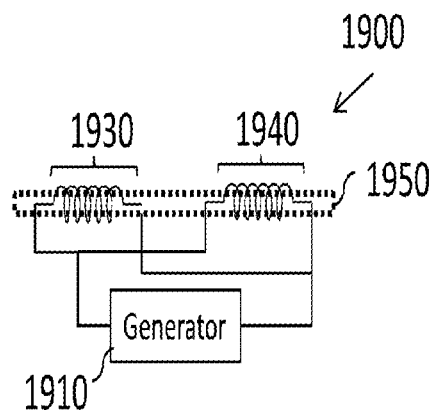
FIGS. 19-22 are block diagrams of two induction devices powered by a single generator, in accordance with certain examples.

In certain examples, a single hybrid generator as described herein may be used to provide power to two or more induction devices at the same time. Referring to FIG. 19, a system 1900 comprises a generator 1910 electrically coupled to load coils 1930, 1940. A torch 1950 is positioned in an aperture of the load coils 1930, 1940. In operation of the system 1900, one or both of the load coils 1930, 1940 may be provided power in a driven mode, an oscillation mode or both. In some examples, it may be desirable to ignite the plasma by switching on only load coil 1930 when the generator 1910 is in a driven mode. As the generator 1910 is switched to the oscillation mode, load coil 1940 may also be powered on to increase the overall length of the plasma in the torch 1950. Alternatively, it may be desirable to ignite the plasma by switching on both loads coils 1930, 1940 when the generator 1910 is in a driven mode. Once the plasma is ignited, the generator 1910 may be switched to an oscillation mode and both of load coils 1930, 1940 may be active or one of the load coils 1930, 1940 may be switched off, if desired. Suitable circuitry may be present in the generator such that different powers are provided to the load coils 1930, 1940 from the generator 1910. For example, it may be desirable to provide more power to the load coil 1930 than the load coil 1940 (or vice versa). In some embodiments, the load coil 1940 may comprise a different number of turns than the load coil 1930, whereas in other examples, the numbers of turns may be the same in each of the load coils 1930, 1940.

Figure 20:
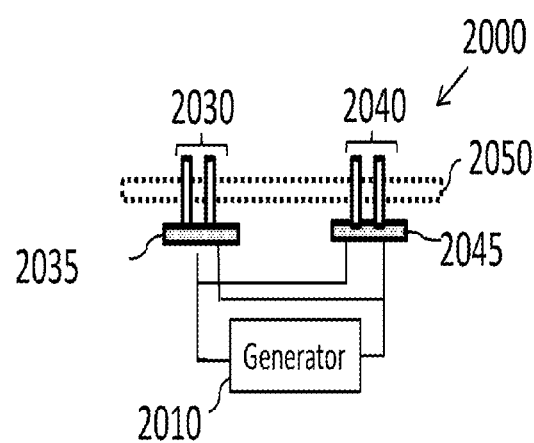

In certain embodiments, a similar system as shown in FIG. 19 but including two sets of plate electrodes is shown in FIG. 20. The system 2000 comprises a generator 2010 electrically coupled to plate electrodes 2030, 2040. A torch 2050 is positioned in an aperture of the plate electrodes 2030, 2040. In operation of the system 2000, one or both of the pairs of plate electrodes 2030, 2040 may be provided power in a driven mode, an oscillation mode or both. In some examples, it may be desirable to ignite the plasma by switching on only plate electrodes 2030 when the generator 2010 is in a driven mode. As the generator 2010 is switched to the oscillation mode, electrodes 2040 may also be powered on to increase the overall length of the plasma in the torch 2050. Alternatively, it may be desirable to ignite the plasma by switching on both sets of plate electrodes 2030, 2040 when the generator 2010 is in a driven mode. Once the plasma is ignited, the generator 2010 may be switched to an oscillation mode and both of sets of plate electrodes 2030, 2040 may be active or one of the sets of plate electrodes 2030, 2040 may be switched off, if desired. Suitable circuitry may be present in the generator such that different powers are provided to the sets of plate electrodes 2030, 2040 from the generator 2010. For example, it may be desirable to provide more power to the electrodes 2030 than the electrodes 2040 (or vice versa). In certain examples, the electrodes 2040 may comprise a different number of plates than the electrodes 2030, whereas in other examples, the numbers of plates may be the same in each of the electrodes 2030, 2040.

Figure 21:
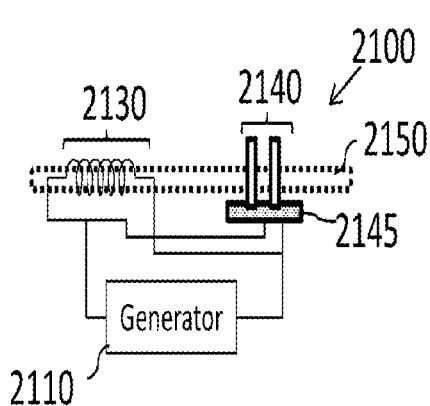

In certain examples, a similar system as shown in FIGS. 19 and 20 but including one load coil and one set of plate electrodes is shown in FIG. 21. The system 2100 comprises a generator 2110 electrically coupled to a load coil 2130 and plate electrodes 2140. A torch 2150 is positioned in an aperture of the load coil 2130 and the plate electrodes 2140. In operation of the system 2100, one or both of the load coil 2130 and the plate electrodes 2140 may be provided power in a driven mode, an oscillation mode or both. In some examples, it may be desirable to ignite the plasma by switching on only load coil 2130 when the generator 2110 is in a driven mode. As the generator 2110 is switched to the oscillation mode, plate electrodes 2140 may also be powered on to increase the overall length of the plasma in the torch 2150. Alternatively, it may be desirable to ignite the plasma by switching on both the load coil 2130 and the plate electrodes 2140 when the generator 2110 is in a driven mode. Once the plasma is ignited, the generator 2110 may be switched to an oscillation mode and both the load coil 2130 and the plate electrodes 2140 may be active or one of the load coil 2130 or the plate electrodes 2140 may be switched off, if desired. Suitable circuitry may be present in the generator such that different powers are provided to the load coil 2130 and the plate electrodes 2140 from the generator 2110. For example, it may be desirable to provide more power to the induction coil 2130 than the plate electrodes 2140 (or vice versa).

Figure 22:
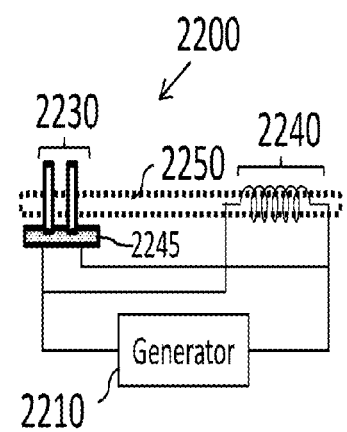

In certain examples, a similar system as shown in FIGS. 19-21 but including a set of plate electrodes upstream of a load coil is shown in FIG. 22. The system 2200 comprises a generator 2210 electrically coupled to plate electrodes 2230 and a load coil 2240. A torch 2250 is positioned in an aperture of the plate electrodes 2230 and the load coil 2240. In operation of the system 2200, one or both of the plate electrode 2230 and the load coil 2240 may be provided power in a driven mode, an oscillation mode or both. In some examples, it may be desirable to ignite the plasma by switching on only the plate electrodes 2230 when the generator 2210 is in a driven mode. As the generator 2210 is switched to the oscillation mode, the load coil 2240 may also be powered on to increase the overall length of the plasma in the torch 2250. Alternatively, it may be desirable to ignite the plasma by switching on both the plate electrodes 2230 and the load coil 2240 when the generator 2210 is in a driven mode. Once the plasma is ignited, the generator 2210 may be switched to an oscillation mode and both the plate electrodes 2230 and the load coil 2240 may be active or one of the plate electrodes 2230 or the load coil 2240 may be switched off, if desired. Suitable circuitry may be present in the generator such that different powers are provided to the plate electrodes 2230 and the load coil 2240 from the generator 2210. For example, it may be desirable to provide more power to the plate electrodes 2230 than the load coil 2240 (or vice versa).

Figure 23:
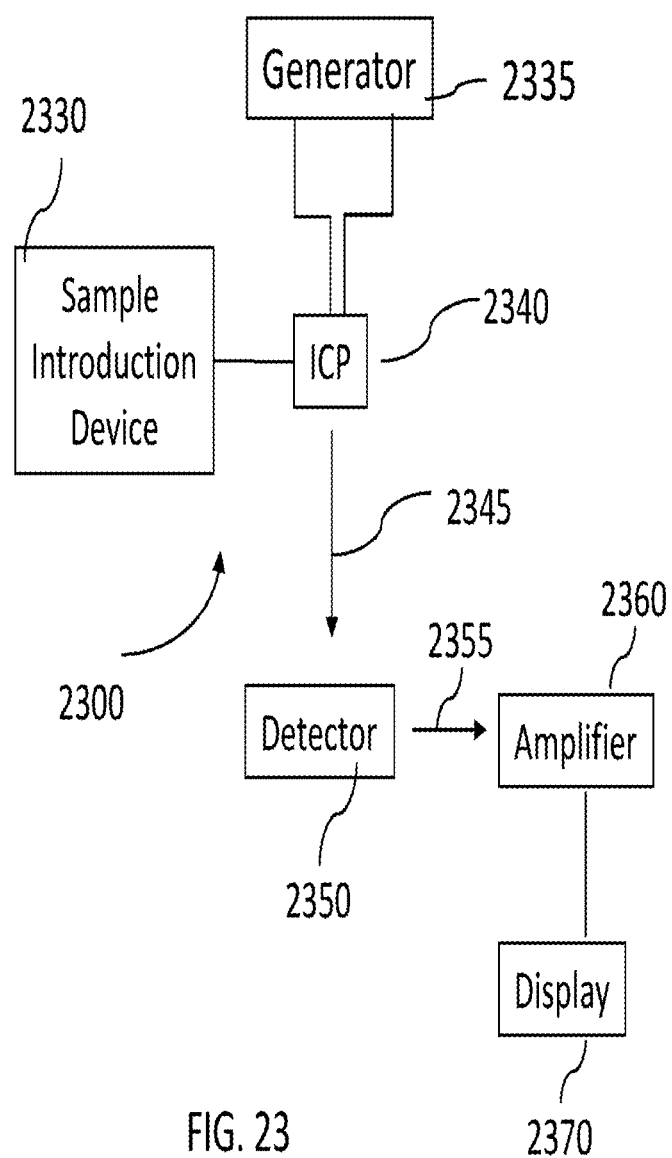
FIG. 23 is a block diagram of an optical emission system, in accordance with certain examples.

In certain examples, the hybrid generators described herein can be used to power an inductively coupled plasma (ICP) that is present in an optical emission system (OES). Illustrative components of an OES are shown in FIG. 23. The device 2300 includes a sample introduction system 2330 fluidically coupled to an ICP 2340. The ICP 2340 is electrically coupled to a generator 2335 and may be generated using a torch, load coil (or plates) or other induction devices. The generator 2335 may be any of the hybrid generators described herein. The ICP 2340 is fluidically (or optically or both) coupled to a detector 2350. The sample introduction device 2330 may vary depending on the nature of the sample. In certain examples, the sample introduction device 2330 may be a nebulizer that is configured to aerosolize liquid sample for introduction into the ICP 2340. In other examples, the sample introduction device 2330 may be configured to directly inject sample into the ICP 2340. Other suitable devices and methods for introducing samples will be readily selected by the person of ordinary skill in the art, given the benefit of this disclosure. The detector 2350 can take numerous forms and may be any suitable device that may detect optical emissions, such as optical emission 2355. For example, the detector 2350 may include suitable optics, such as lenses, mirrors, prisms, windows, band-pass filters, etc. The detector 2350 may also include gratings, such as echelle gratings, to provide a multi-channel OES device. Gratings such as echelle gratings may allow for simultaneous detection of multiple emission wavelengths. The gratings may be positioned within a monochromator or other suitable device for selection of one or more particular wavelengths to monitor. In certain examples, the detector 2350 may include a charge coupled device (CCD). In other examples, the OES device may be configured to implement Fourier transforms to provide simultaneous detection of multiple emission wavelengths. The detector 2350 can be configured to monitor emission wavelengths over a large wavelength range including, but not limited to, ultraviolet, visible, near and far infrared, etc. The OES device 2300 may further include suitable electronics such as a microprocessor and/or computer and suitable circuitry to provide a desired signal and/or for data acquisition. Suitable additional devices and circuitry are known in the art and may be found, for example, on commercially available OES devices such as Optima 2100DV series, Optima 5000 DV series and Optima 7000 series OES devices commercially available from PerkinElmer Health Sciences, Inc. (Waltham, Mass.). The optional amplifier 2360 may be operative to increase a signal 2355, e.g., amplify the signal from detected photons, and can provide the signal to a an optional display 2370, which may be a readout, computer, etc. In examples where the signal 2355 is sufficiently large for display or detection, the amplifier 2360 may be omitted. In certain examples, the amplifier 2360 is a photomultiplier tube configured to receive signals from the detector 2350. Other suitable devices for amplifying signals, however, will be selected by the person of ordinary skill in the art, given the benefit of this disclosure. It will also be within the ability of the person of ordinary skill in the art, given the benefit of this disclosure, to retrofit existing OES devices with the generator 2335 and to design new OES devices using the generators disclosed here. The OES device 2300 may further include autosamplers, such as AS90 and AS93 autosamplers commercially available from PerkinElmer Health Sciences or similar devices available from other suppliers.

Figure 24:
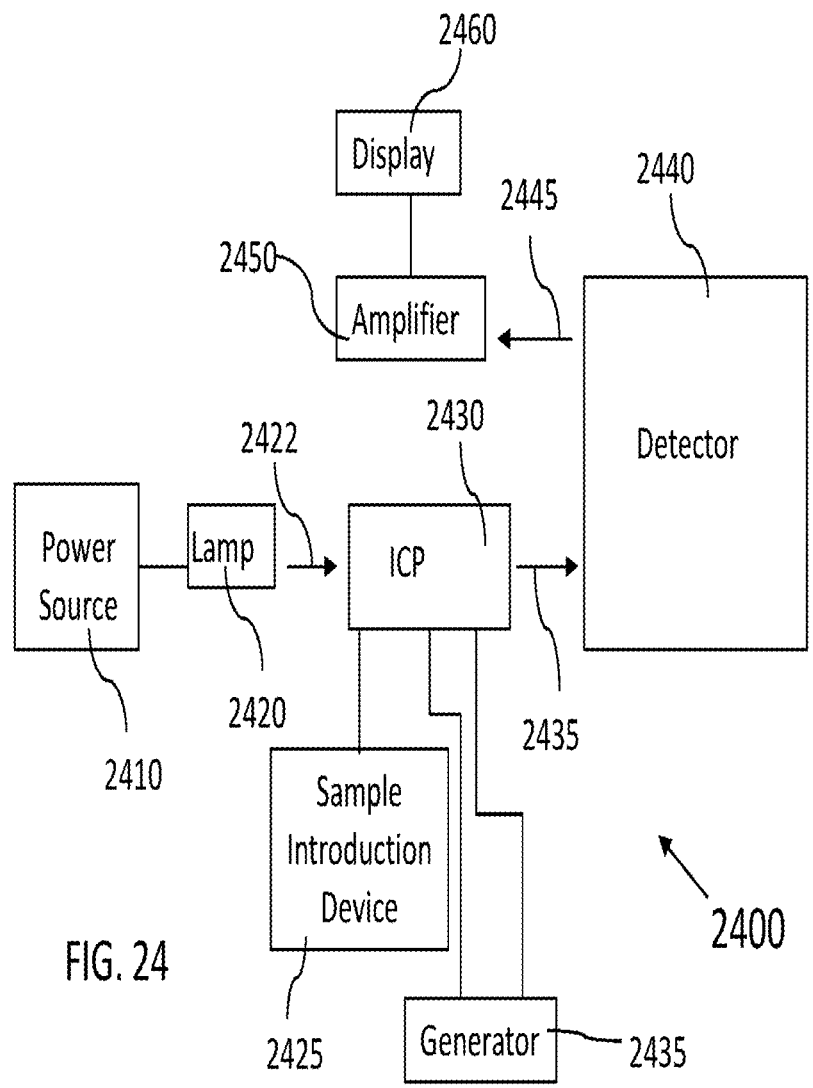
FIG. 24 is a block diagram of an atomic absorption system, in accordance with certain examples.

In certain embodiments, the generators described herein can be used in an instrument designed for absorption spectroscopy (AS). Atoms and ions may absorb certain wavelengths of light to provide energy for a transition from a lower energy level to a higher energy level. An atom or ion may contain multiple resonance lines resulting from transition from a ground state to a higher energy level. The energy needed to promote such transitions may be supplied using numerous sources, e.g., heat, flames, plasmas, arc, sparks, cathode ray lamps, lasers, etc., as discussed further below. In some examples, the generator described herein can be used to power an ICP to provide the energy or light that is absorbed by the atoms or ions. In certain examples, a single beam AS device is shown in FIG. 24. The single beam AS device 2400 includes a power source 2410, a lamp 2420, a sample introduction device 2425, an ICP device 2430 electrically coupled to a hybrid generator 2435, a detector 2440, an optional amplifier 2450 and an optional display 2460. The power source 2410 may be configured to supply power to the lamp 2420, which provides one or more wavelengths of light 2422 for absorption by atoms and ions. If desired the power source 2410 may also be electrically coupled to the generator 2435. Suitable lamps include, but are not limited to, mercury lamps, cathode ray lamps, lasers, etc. The lamp may be pulsed using suitable choppers or pulsed power supplies, or in examples where a laser is implemented, the laser may be pulsed with a selected frequency, e.g. 5, 10, or 20 times/second. The exact configuration of the lamp 2420 may vary. For example, the lamp 2420 may provide light axially along the ICP 2430 or may provide light radially along the ICP device 2430. The example shown in FIG. 24 is configured for axial supply of light from the lamp 2420. There can be signal-to-noise advantages using axial viewing of signals. The ICP 2430 may be sustained using any of the induction devices and torches described herein or other suitable induction devices and torches that may be readily selected or designed by the person of ordinary skill in the art, given the benefit of this disclosure. As sample is atomized and/or ionized in the ICP 2430, the incident light 2422 from the lamp 2420 may excite atoms. That is, some percentage of the light 2422 that is supplied by the lamp 2420 may be absorbed by the atoms and ions in the ICP 2430. The remaining percentage of the light 2435 may be transmitted to the detector 2440. The detector 2440 may provide one or more suitable wavelengths using, for example, prisms, lenses, gratings and other suitable devices such as those discussed above in reference to the OES devices, for example. The signal may be provided to the optional amplifier 2450 for increasing the signal provided to the display 2460. To account for the amount of absorption by sample in the ICP 2430, a blank, such as water, may be introduced prior to sample introduction to provide a 100% transmittance reference value. The amount of light transmitted once sample is introduced into the ICP or exits from the ICP may be measured, and the amount of light transmitted with sample may be divided by the reference value to obtain the transmittance. The negative $\log_{in}$ of the transmittance is equal to the absorbance. The AS device 2400 may further include suitable electronics such as a microprocessor and/or computer and suitable circuitry to provide a desired signal and/or for data acquisition. Suitable additional devices and circuitry may be found, for example, on commercially available AS devices such as AAnalyst series spectrometers commercially available from PerkinElmer Health Sciences. It will also be within the ability of the person of ordinary skill in the art, given the benefit of this disclosure, to retrofit existing AS devices with the generators disclosed here and to design new AS devices using the generators disclosed herein. The AS devices may further include autosamplers known in the art, such as AS-90A, AS-90plus and AS-93plus autosamplers commercially available from PerkinElmer Health Sciences.

Figure 25:
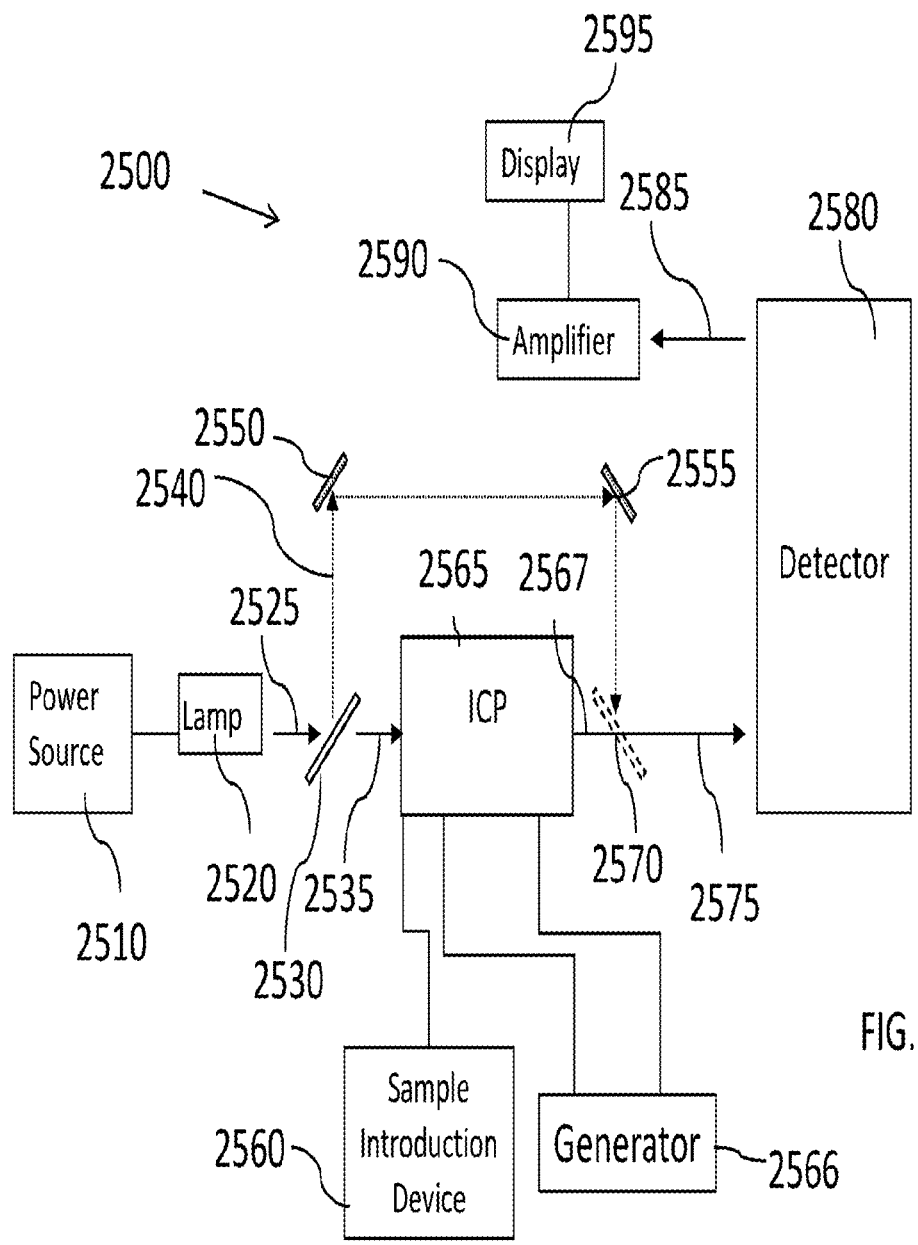
FIG. 25 is a block diagram of another atomic absorption system, in accordance with certain examples.

In certain embodiments and referring to FIG. 25, the generators described herein can be used in a dual beam AS device 2500 includes a power source 2510, a lamp 2520, a ICP 2565, a generator 2566 electrically coupled to an induction device (not shown) of the ICP 2565, a detector 2580, an optional amplifier 2590 and an optional display 2595. The power source 2510 may be configured to supply power to the lamp 2520, which provides one or more wavelengths of light 2525 for absorption by atoms and ions. Suitable lamps include, but are not limited to, mercury lamps, cathode ray lamps, lasers, etc. The lamp may be pulsed using suitable choppers or pulsed power supplies, or in examples where a laser is implemented, the laser may be pulsed with a selected frequency, e.g. 5, 10 or 20 times/second. The configuration of the lamp 2520 may vary. For example, the lamp 2520 may provide light axially along the ICP 2565 or may provide light radially along the ICP 2565. The example shown in FIG. 25 is configured for axial supply of light from the lamp 2520. There may be signal-to-noise advantages using axial viewing of signals. The ICP 2565 may be any of the ICPs discussed herein or other suitable ICPs that may be readily selected or designed by the person of ordinary skill in the art, given the benefit of this disclosure. As sample is atomized and/or ionized in the ICP 2565, the incident light 2525 from the lamp 2520 may excite atoms. That is, some percentage of the light 2525 that is supplied by the lamp 2520 may be absorbed by the atoms and ions in the ICP 2565. The remaining percentage of the light 2567 is transmitted to the detector 2580. In examples using dual beams, the incident light 2525 may be split using a beam splitter 2530 such that some percentage of light, e.g., about 10% to about 90%, may be transmitted as a light beam 2535 to the ICP 2565 and the remaining percentage of the light may be transmitted as a light beam 2540 to mirrors or lenses 2550 and 2555. The light beams may be recombined using a combiner 2570, such as a half-silvered mirror, and a combined signal 2575 may be provided to the detection device 2580. The ratio between a reference value and the value for the sample may then be determined to calculate the absorbance of the sample. The detection device 2580 may provide one or more suitable wavelengths using, for example, prisms, lenses, gratings and other suitable devices known in the art, such as those discussed above in reference to the OES devices, for example. Signal 2585 may be provided to the optional amplifier 2590 for increasing the signal to provide to the display 2595. The AS device 2500 may further include suitable electronics known in the art, such as a microprocessor and/or computer and suitable circuitry to provide a desired signal and/or for data acquisition. Suitable additional devices and circuitry may be found, for example, on commercially available AS devices such as AAnalyst series spectrometers commercially available from PerkinElmer Health Sciences, Inc. It will be within the ability of the person of ordinary skill in the art, given the benefit of this disclosure, to retrofit existing dual beam AS devices with the generators disclosed here and to design new dual beam AS devices using the generators disclosed herein. The AS devices may further include autosamplers known in the art, such as AS-90A, AS-90plus and AS-93plus autosamplers commercially available from PerkinElmer Health Sciences, Inc.

Figure 26:
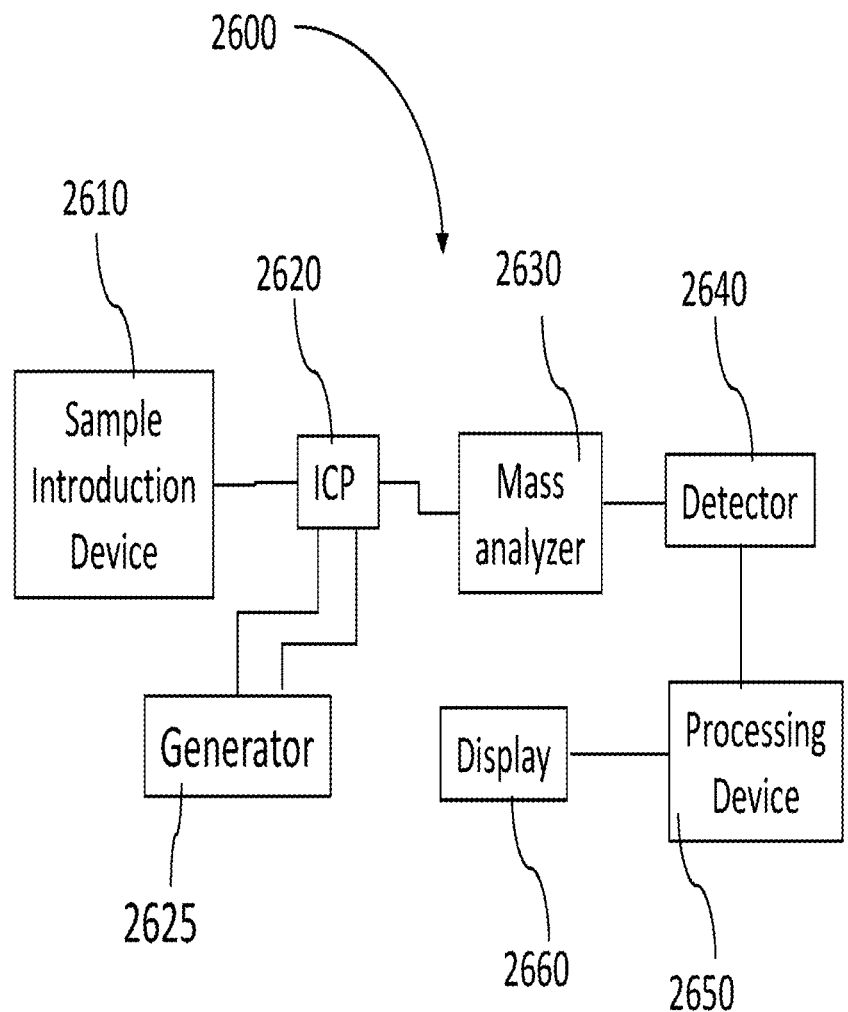
FIG. 26 is a block diagram of a mass spectrometer, in accordance with certain examples.

In certain embodiments, the generators described herein can be used in a mass spectrometer. An illustrative MS device is shown in FIG. 26. The MS device 2600 includes a sample introduction device 2610, an ionization device 2620 (labeled as ICP) electrically coupled to a generator 2625, a mass analyzer 2630, a detection device 2640, a processing device 2650 and an optional display 2660. The sample introduction device 2610, ionization device 2620, the mass analyzer 2630 and the detection device 2640 may be operated at reduced pressures using one or more vacuum pumps. In certain examples, however, only the mass analyzer 2630 and the detection device 2640 may be operated at reduced pressures. The sample introduction device 2610 may include an inlet system configured to provide sample to the ionization device 2620. The inlet system may include one or more batch inlets, direct probe inlets and/or chromatographic inlets. The sample introduction device 2610 may be an injector, a nebulizer or other suitable devices that may deliver solid, liquid or gaseous samples to the ionization device 2620. The ionization device 2620 may be an inductively coupled plasma generated and/or sustained using the generator 2625, e.g., using a hybrid generator as described herein. If desired, the ionization device can be coupled to another ionization device, e.g., another device which can atomize and/or ionize a sample including, for example, plasma (inductively coupled plasmas, capacitively coupled plasmas, microwave-induced plasmas, etc.), arcs, sparks, drift ion devices, devices that can ionize a sample using gas-phase ionization (electron ionization, chemical ionization, desorption chemical ionization, negative-ion chemical ionization), field desorption devices, field ionization devices, fast atom bombardment devices, secondary ion mass spectrometry devices, electrospray ionization devices, probe electrospray ionization devices, sonic spray ionization devices, atmospheric pressure chemical ionization devices, atmospheric pressure photoionization devices, atmospheric pressure laser ionization devices, matrix assisted laser desorption ionization devices, aerosol laser desorption ionization devices, surface-enhanced laser desorption ionization devices, glow discharges, resonant ionization, thermal ionization, thermospray ionization, radioactive ionization, ion-attachment ionization, liquid metal ion devices, laser ablation electrospray ionization, or combinations of any two or more of these illustrative ionization devices. The mass analyzer 2630 may take numerous forms depending generally on the sample nature, desired resolution, etc., and exemplary mass analyzers can include one or more collision cells, reaction cells or other components as desired. The detection device 2640 may be any suitable detection device that may be used with existing mass spectrometers, e.g., electron multipliers, Faraday cups, coated photographic plates, scintillation detectors, etc., and other suitable devices that will be selected by the person of ordinary skill in the art, given the benefit of this disclosure. The processing device 2650 typically includes a microprocessor and/or computer and suitable software for analysis of samples introduced into MS device 2600. One or more databases may be accessed by the processing device 2650 for determination of the chemical identity of species introduced into MS device 2600. Other suitable additional devices known in the art may also be used with the MS device 2600 including, but not limited to, autosamplers, such as AS-90plus and AS-93plus autosamplers commercially available from PerkinElmer Health Sciences, Inc.

In certain embodiments, the mass analyzer 2630 of the MS device 2600 may take numerous forms depending on the desired resolution and the nature of the introduced sample. In certain examples, the mass analyzer is a scanning mass analyzer, a magnetic sector analyzer (e.g., for use in single and double-focusing MS devices), a quadrupole mass analyzer, an ion trap analyzer (e.g., cyclotrons, quadrupole ions traps), time-of-flight analyzers (e.g., matrix-assisted laser desorbed ionization time of flight analyzers), and other suitable mass analyzers that may separate species with different mass-to-charge ratio. In some examples, the MS devices disclosed herein may be hyphenated with one or more other analytical techniques. For example, MS devices may be hyphenated with devices for performing liquid chromatography, gas chromatography, capillary electrophoresis, and other suitable separation techniques. When coupling an MS device with a gas chromatograph, it may be desirable to include a suitable interface, e.g., traps, jet separators, etc., to introduce sample into the MS device from the gas chromatograph. When coupling an MS device to a liquid chromatograph, it may also be desirable to include a suitable interface to account for the differences in volume used in liquid chromatography and mass spectroscopy. For example, split interfaces may be used so that only a small amount of sample exiting the liquid chromatograph may be introduced into the MS device. Sample exiting from the liquid chromatograph may also be deposited in suitable wires, cups or chambers for transport to the ionization devices of the MS device. In certain examples, the liquid chromatograph may include a thermospray configured to vaporize and aerosolize sample as it passes through a heated capillary tube. Other suitable devices for introducing liquid samples from a liquid chromatograph into a MS device will be readily selected by the person of ordinary skill in the art, given the benefit of this disclosure. In certain examples, MS devices can be hyphenated with each other for tandem mass spectroscopy analyses.

In certain embodiments, the systems and devices described herein may include additional components as desired. For example, it may be desirable to include a photosensor in an optical path of the plasma so the system can detect when the plasma has been ignited. It may be desirable to switch from the driven mode to the oscillation mode as soon as the presence of the plasma is detected by the photosensor. In certain examples, the components of the generators described herein may be air cooled, liquid cooled or cooled with thermoelectric devices such as Peltier coolers. One or more fans may be present where air cooling. A chiller or circulator may be present to circulate a fluid through the system to absorb heat from the electronic components.

In some examples, the generators described herein can be used in non-instrumental applications including, but not limited to, vapor deposition devices, ion implantation devices, welding torches, molecular beam epitaxy devices or other devices or systems that use an atomization and/or ionization source to provide a desired output, e.g., ions, atoms or heat, may be used with the generators described herein. In addition, the generators described herein can be used in chemical reactors to promote formation of certain species at high temperature. For example, radioactive waste can be processed using devices including the generators described herein.

In certain examples, the generators described herein may be used to ignite a plasma in a torch body by providing power to an induction device from the generator in a driven mode, and switch the generator from the driven mode to an oscillation mode once the plasma is ignited. In some instances, the generator may remain in the driven mode for some period to power the induction device.

In certain embodiments, the generators described herein may be used in quality control application or in field service application to provide information regarding various components of the system. For example, a technician can use the generator as a means of determining which component(s) of the system may need replaced. In operation, torches and induction devices can fail from continued heat exposure, or electronic components may fail from overheating, overuse or other reasons. In some instances, a control signal (or signal of known amplitude, shape, waveform, etc.) can be provided in the driven mode of the generator and used to determine if the electronics of the generator are the cause of poor performance of the system. If the control signal detected represents an anticipated control signal, then the electronics may be removed as a cause of poor system performance. If desired, the control signal may be sent remotely by a technician so the technician can be provided remote feedback as to which of the components of the system may need replacing. For example, the control signal can be used to provide the technician information about the fidelity of the electronics, so they can take the desired components with them on a service call to repair the system.

In certain configurations, even though the hybrid generators described herein may be operated in a driven mode, an oscillation mode and a hybrid mode, an end user may operate the generator in only one of these modes. For example, the user may disable the driven mode and operate the generator exclusively in the oscillating mode. Similarly, the user may operate the generator exclusively in the driven mode or the hybrid mode if desired. Switching between the modes is not required for proper operation of an inductively coupled plasma or other suitable atomization/ionization device sustained using the hybrid generator, though depending on the conditions used switching between modes can provide better performance.

In certain instances, the generators described herein can be used to provide RF power to drive an induction device, e.g., load coil or other induction device, at one end. For example, a single-ended transistor, e.g., power transistor in the same phase, can be used to drive a load coil at one end of the load coil and the other end of the load coil may be grounded. Where two or more induction devices are present, one may be driven differentially by a pair of transistors in opposite polarities, e.g., out of phase, and the other may be driven by a power transistor to drive the load coil at one end. Any of the various induction devices and configurations described herein may use the single-ended design where the load coil is driven at one end by the generator.

In certain configurations, it may be desirable to operate the generator in an oscillation mode without switching to the driven mode. In some instances, this oscillation operation can be performed by disabling the driven mode circuit components as noted herein. In other configurations, the generator itself may comprise only the oscillation circuit components, e.g., the driven mode circuitry can be omitted entirely from the generator. For example, the driven mode circuits in various schematics described herein can be omitted entirely so that the circuit used in the oscillation only mode is configured without any driven mode circuitry. Without wishing to be bound by any particular theory, power transistors in a generator circuit can be near the breakdown limit because their output power is near their maximum rated power. A voltage spike at the input of transistors may damage the transistors themselves. In the oscillation design, the feedback is derived directly from the plasma load coil terminals (e.g., see between 260 and 232, and between 260 and 234 of FIG. 2B via feedback capacitors 242 and 244). This configuration enables fast adjustment in the frequency for optimal impedance matching, e.g., within about three RF cycles, which is an advantage when the plasma load resonant frequency, is subject to change by the liquid sample (sample could have soil, solids, harsh mixture of elements, etc.). The plasma load coil terminals have voltage fluctuation and frequency instability (high phase noise) because it is load sample dependent. With a positive feedback in an oscillator, the voltage fluctuation derived from the plasma output terminals may escalate to destructive voltage spikes. The feedback signals from capacitors 242 and 244, if fed to the power transistors 222 and 224 without protection, may damage the devices 222 and 224 operating near the breakdown limit.

Figure 36:
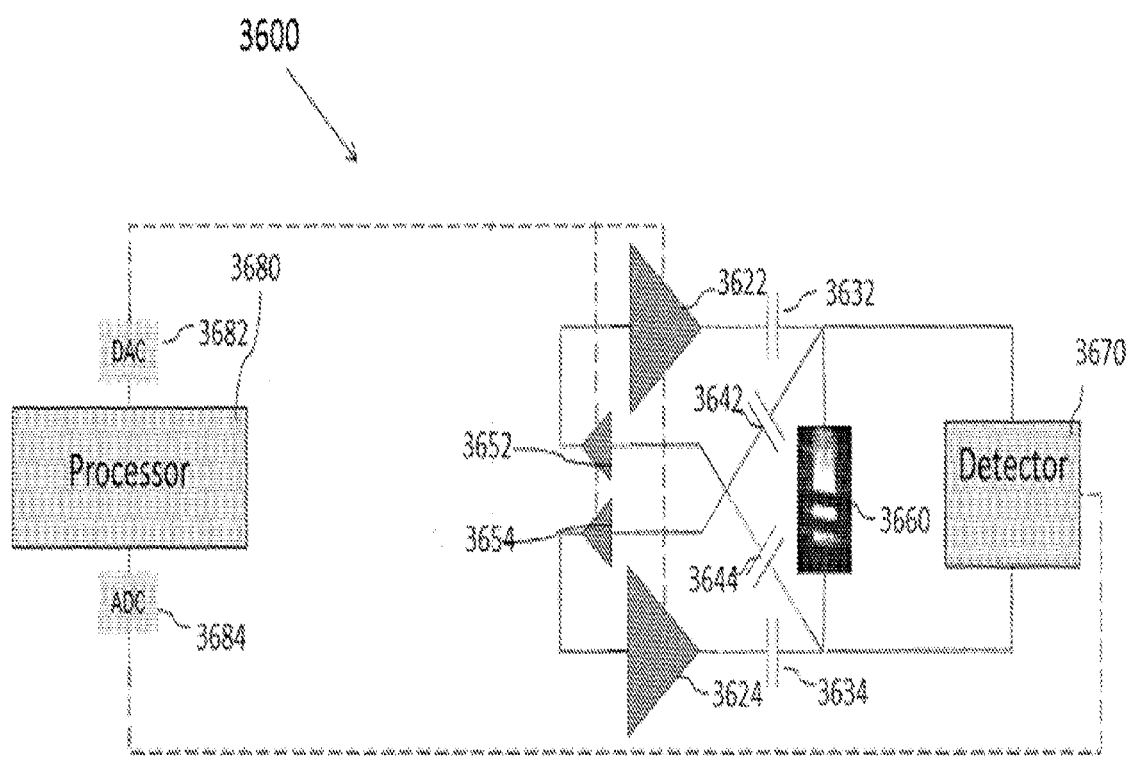
FIG. 36 is an illustration showing an oscillation circuit, in accordance with certain examples.

To limit damage to the transistors, several possible oscillation circuits or circuit configurations can be used. Referring to FIG. 36, which shows an oscillation only circuit 3600 (e.g., one without any driven mode circuit), the frequency provided to the load coil 3660 is scanned and tuned to a frequency which permits successful plasma ignition, e.g., a frequency which may maximize the coil voltage if desired. Alternatively, a fixed, lower supply voltage VDD (e.g., 9 V) can be selected for a larger transistor drain capacitance to lower the frequency during ignition in the oscillation only mode of operation. A detector 3670, which is electrically coupled to a processor 3680 through signal converters 3682, 3684, may be used to monitor the plasma. For example, the detector 3670 may be configured as an RF detector that can be used to monitor RF signals provided to the load coil 3660. In other configurations, the detector 3670 may be configured as an optical detector, e.g., a light sensor, fiber optic sensor or other device, that can receive light emissions from the plasma once the plasma is ignited. In some embodiments, the detector 3670 may be omitted and the power levels for a particular load coil (or other induction device) may be fixed and be set at a level to avoid transistor breakdown. In operation, the determined power level is provided to the load coil 3660, which surrounds some portion of a torch body (not shown), and plasma gas provided to the torch body is ignited while the power is being applied. A plasma is generated and sustained by continued application of RF power from the load coil 3660. During sample introduction, sample is typically sprayed or nebulized into the plasma along with a carrier such as a solvent. The plasma is operative to desolvate the sample and atomize and/or ionize the chemical species in the plasma.

The power gain of drivers 3652, 3654 can reduce the required amplitude of the feedback signal (i.e., smaller) at the input of drivers 3652, 3654. Without drivers 3652, 3654, a larger feedback signal may be required to drive the power devices 3622, 3624. By selecting devices 3652 and 3654 which have similar input breakdown limit as the power transistors 3622 and 3624, the higher voltage spikes in the already reduced feedback signal are less likely to damage 3652 and 3654. For example, power devices 3622 and 3624 can be selected to comprise a gate breakdown limit from +6V to −11V. The protection devices 3652 and 3654 can also be selected to comprise the same gate breakdown limit (+6V to −11V), but the input feedback signal is now smaller. By selecting or matching the breakdown limits of the devices 3622, 3624, 3652 and 3654, there is reduced risk that the power transistors 3622, 3624 are damaged due to overly high input power. If desired, to further protect against fast, transient spikes, the devices 3652 and 3654, despite their smaller rated output power, can be selected to have a high output breakdown limit (e.g., similar to the power transistors 3622 and 3624, rated to DC power supply VDD=50V operation at a maximum breakdown limit of 110V). However, the VDD supply of 3652 and 3654 are reduced in actual operation (e.g., rated to 50V operation, but use VDD=15V in practice), so that the fast, transient voltage spikes at the feedback signal are clipped off at the output of drivers 3652, 3654 by the much reduced voltage supply rail and will not over-drive power transistors 3622, 3624. Also, drivers 3652, 3654 will not suffer from output breakdown because of the large margin in VDD (e.g. 15V operation for a 50V capable device).

In other configurations where the generator is an oscillation mode only generator, the generator may comprise suitable circuitry to provide harmonic emission control. Modern power transistors often have substantial power gain at high frequencies (e.g., hundreds of MHz), where the fundamental plasma frequency is typically at a low frequency (e.g., tens of MHz). It may be desirable to include one or more low pass filters to eliminate RF emission at the high harmonics (multiples of RF frequencies). In a high power oscillator (kilo-watt power), the feedback signal is often at a moderately large power, ranging from 5 Watt to 100 Watts. As a result, a low-pass filter can be used to filter the feedback signal to suppress high harmonics at the input of the power transistors. For example and referring to FIG. 37, low-pass filters 3657, 3659 can be used to filter the feedback signal to suppress high harmonics at the input of the power transistors 3622 and 3624, respectively. Due to the large feedback signal, bulky passive components with high power ratings may be needed. The large physical size is a penalty to the required component space and efficiency. By inserting drivers 3652 and 3654, the feedback signal amplifier is reduced so that small, surface mount passive components (e.g., 1206 package) can be used to make an efficient, high-order low pass filter to effectively cut-off the emission at the harmonic frequencies. This configuration protects the power transistors 3622, 3624 while permitting oscillation mode operation.

Figure 38:
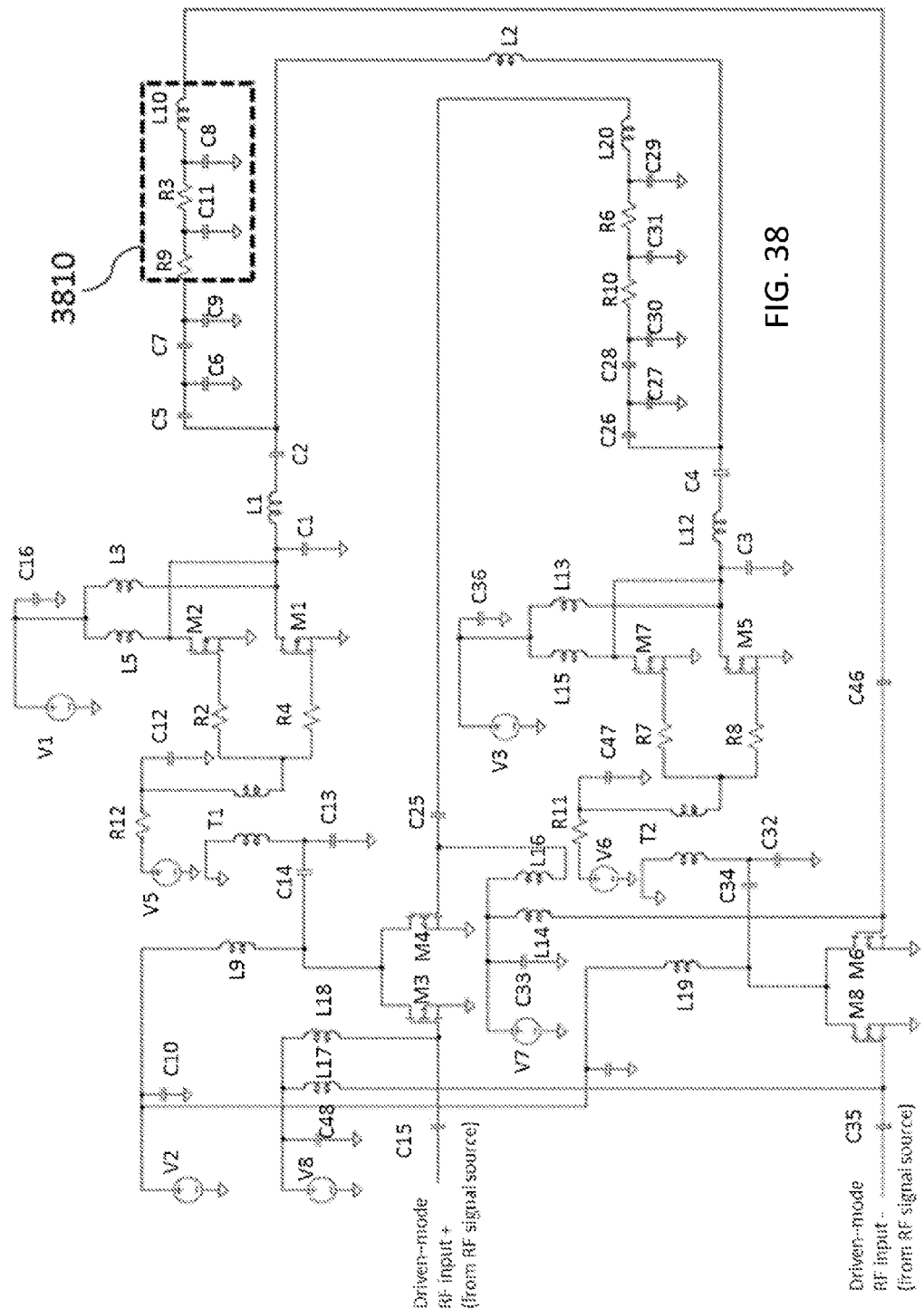
FIG. 38 is an illustration showing a suitable circuit for harmonic emission control, in accordance with certain embodiments.

One illustration of a suitable circuit for harmonic emission control is shown in FIG. 38. The L-R-C components R9, C11, R3, C8, L10 (shown in the dotted box labelled 3810) form a high-order low-pass filter to suppress the harmonics. All these components can be small surface mount components (e.g., 1206 packages). L10 can also be replaced with a small 1206 package high-order ceramic low-pass filter, which offers 20 dB cut off at 200 MHz or higher frequencies.

In some instances, the feedback of the oscillator can be designed or selected such that the open loop gain>1, close loop gain=1, and the phase shift is zero or an integer multiple of 360 degrees. (i.e., no change to the signal phase). The feedback oscillator can be designed to oscillate at one main frequency with good stability. In practice, the oscillator can run at any frequency, or frequencies, or with a lot of frequency fluctuation (high phase noise), as long as it satisfies the phase shift criteria noted above. In the designs described herein, the phase-shift of the feedback loop is contributed by both the plasma load coil and also the low-pass filter phase shift. As a result, the free-running frequency of the oscillator is determined partially (i.e., not entirely) by the plasma sample load and partially by the low-pass filter. The fixed phase shift of the low-pass filter made of stable passive R-L-C components desensitizes the sample load dependent phase-shift of the plasma at a high phase noise. Effectively, it can reduce the phase noise of the plasma oscillator and can improve its stability.

Figure 39:
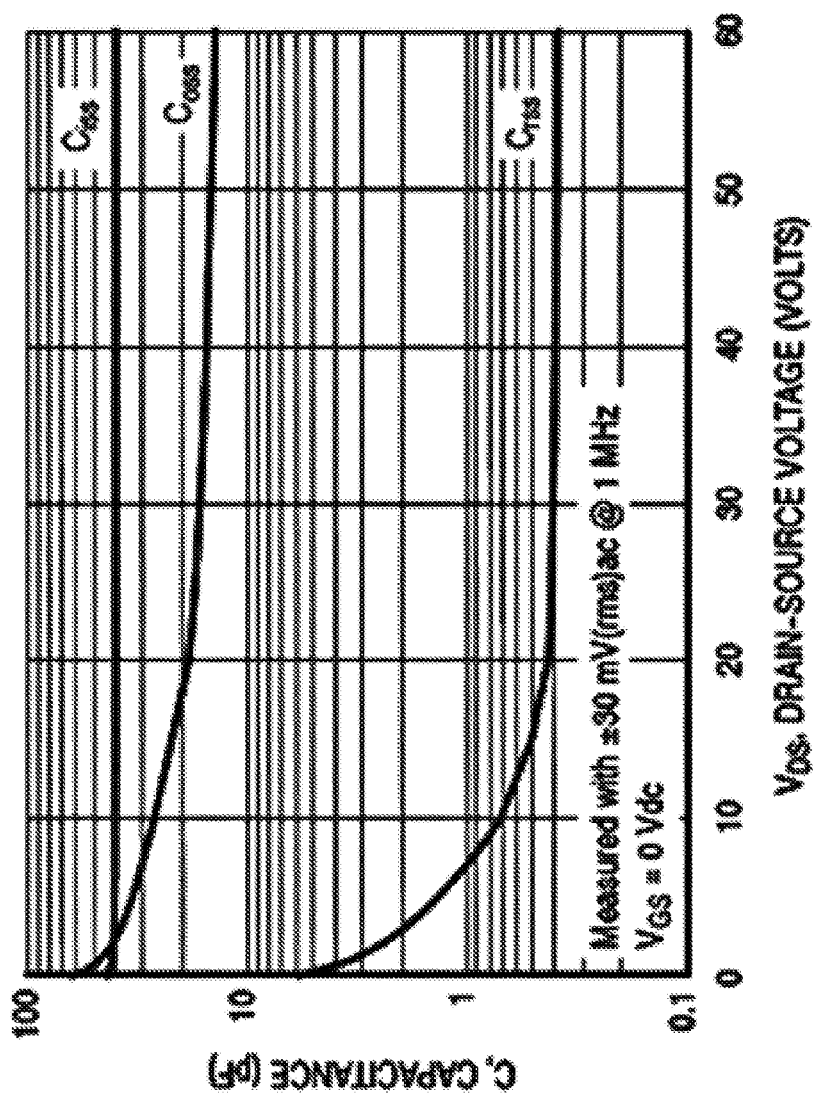
FIG. 39 is a graph showing the output capacitance of a typical device suitable for use as a driver, in accordance with certain embodiments.

In certain instances, it may be desirable to provide for fine frequency control to permit adjustment of the generator frequency instead of using a free-running oscillator. For example, during plasma ignition, when the plasma load coil is known to oscillate at a lower frequency (prior to a lighted plasma), the oscillator can be selectively adjusted to a lower frequency. The output parasitic capacitance of the devices 3652 and 3654, which are typically MOSFET or LDMOS devices, are voltage dependent (i.e., capacitance varies with the VDD DC supply voltage, or VDS, the drain-source voltage). The output capacitance of a typical device suitable for use as drivers 3652, 3654 is shown in the plot of FIG. 39, marked by label "COSS". Since VDD in these devices is only for protection, a lower or higher VDD provided to these devices is not so important as long as it provides a sufficient limit to clip off the output voltage transient. Therefore, the VDD can be adjusted to fine tune the frequency (e.g., lower VDD to 9V to obtain a high capacitance for a lower oscillation frequency at plasma ignition, and use a higher VDD=13V after the plasma is lighted). This frequency adjustment permits both lighting of the plasma and running the plasma in an oscillation only mode, e.g., without the need to use a driven mode or to use a generator circuit including any driven mode circuitry.

In certain configurations and referring again to FIG. 37, to maximize the neutral voltage potential, and to maximize the transistor lifetime, the pair of feedback signals from the plasma load coil 3660 may have different voltage amplitudes due to the power from driver amplifiers 3652, 3654 and can be divided evenly between the push-pull power transistors 3622, 3624. In contrast, if one transistor (e.g., 3622) is driven with a larger input signal than the other transistor (e.g., 3624), the transistor 3622 will conduct more current than 3624, and its lifetime will be reduced. It may be desirable to evenly distribute the feedback signal power to the push-pull transistors 3622, 3624 so their lifetimes are about the same. Such even distribution can be accomplished in numerous manners. For example, to ensure that the feedback signal power from the driver amplifiers 3652 and 3654 is divided evenly between power transistors 3622 and 3624, the feedback signals can be cross-coupled such that the feedback derived from the power transistor 3622 will eventually drive 3624, and the feedback signal derived from the power transistor 3624 will eventually drive 3622. Driver amplifiers 3652 and 3654 drive the primary coil of a transformer (not shown) in a push pull fashion. The secondary coil of the transformer drives the power transistor 3622 and 3624. The center-tap of the secondary coil can be grounded as an option. If desired, a negative feedback resistor can be used to lower the output impedance of the amplifiers 3652 and 3654. A feedback resistor (from the output to the input) will lower the output impedance of the amplifier at the expense of some gain reduction. A lower device gain (due to the addition of the negative feedback resistors) is not important if these devices have high open-loop gain as the closed-loop gain should still be large enough for oscillation. If the feedback signal pair from the output of driver 3652 or 3654 is unequal, this circuit scheme will reduce the power unbalance substantially, so as to drive the power transistor 3622 and 3624 with substantially equal power. In the extreme unbalanced case when there is no voltage on one of the feedback signals (e.g., 3652), but a strong feedback signal on the other side (e.g., 3654) the low impedance of the driver amplifier 3652 output will resemble a low-impedance ground. The driver 3654 that provides a strong output feedback will drive the primary coil of the transformer on one side, and the other side of the primary coil terminated by a low-impedance ground at 3652. The overall current in the primary coil will generate a magnetic flux which will be shared by the secondary coil, and drives the power transistors 3622, 3624 evenly.

Figure 40:
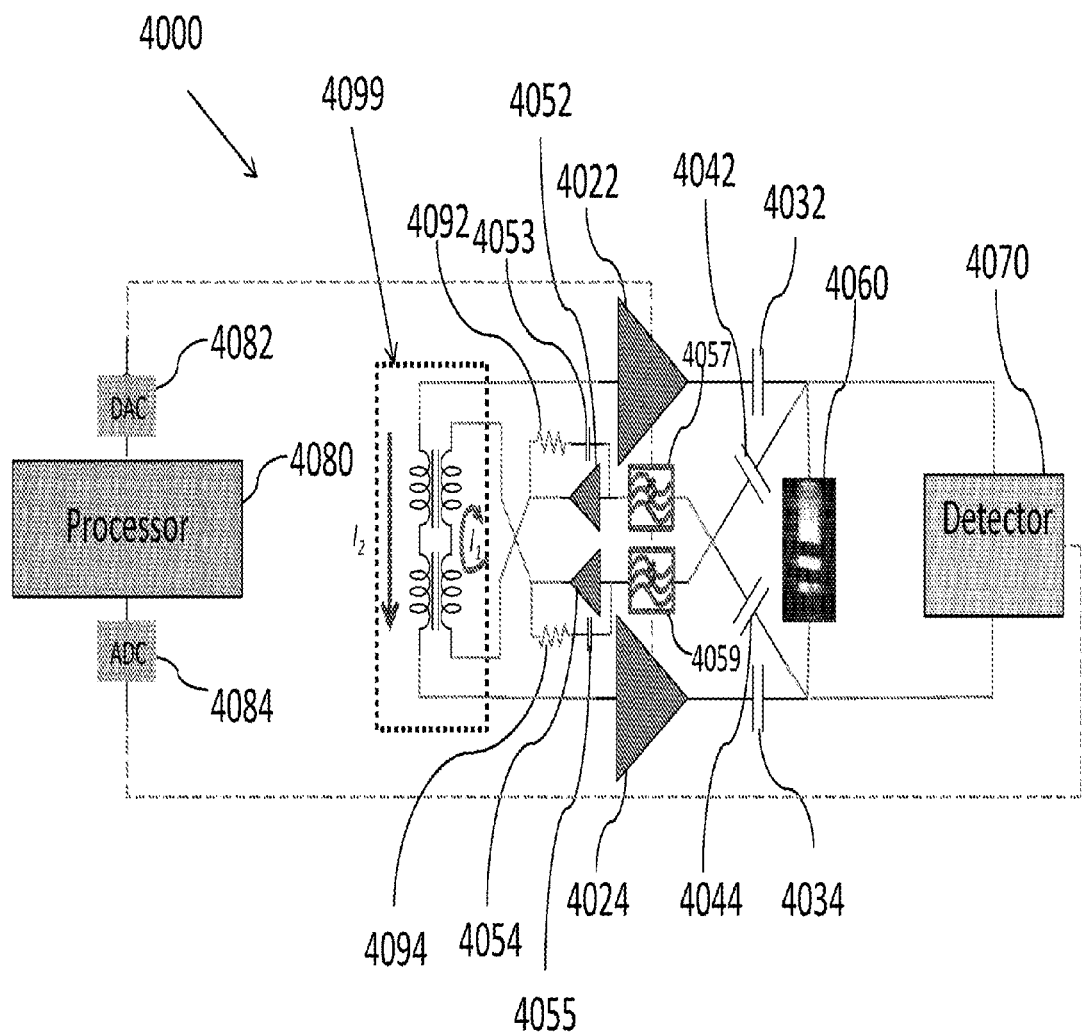
FIG. 40 is an illustrative circuit configuration for balancing the input power to the power devices, in accordance with certain examples.

One circuit configuration for balancing the input power to the power devices is shown in FIG. 40. The circuit 4000 comprises amplifiers 4022, 4024, respectively, and a load coil 4060 coupled to the amplifiers 4022, 4024 through capacitors 4032, 4034, respectively. Additional components, e.g., resistors, amplifiers, etc. may also be present but are not shown to simplify this illustration. The frequency provided to the load coil 4060 can be scanned and tuned to a frequency which permits successful plasma ignition, e.g., a frequency which may maximize the coil voltage if desired. Alternatively, a fixed, lower VDD (e.g., 9 V) can be selected for a larger transistor drain capacitance to lower the frequency during ignition for the oscillation only mode of operation. A detector 4070, which is electrically coupled to a processor 4080 through signal converters 4082, 4084, may be used to monitor the plasma. For example, the detector 4070 may be configured as an RF detector that can be used to monitor RF signals provided to the load coil 4060. In other configurations, the detector 4070 may be configured as an optical detector, e.g., a light sensor, fiber optic sensor or other device, that can receive light emissions from the plasma once the plasma is ignited. In some embodiments, the detector 4070 may be omitted and the power levels for a particular load coil (or other induction device) may be fixed and be set at a level to avoid transistor breakdown. DC block capacitors 4053, 4055 may be present to isolate the output VDD voltage from the gate input bias voltage. The DC block capacitors 4053, 4055 can be electrically coupled to the load coil 4060 through capacitors 4042, 4044, respectively. The DC block capacitors 4053, 4055 can also be electrically coupled to the load coil 4060 through the low-pass filters 4057, 4059, respectively. The drivers 4052 and 4054 are implemented with transistors, where the transistor output is inverted from the transistor input (e.g., about a 180 degrees phase shift). Resistors 4092, 4094 may be electrically coupled between the input and output of the drivers 4052, 4054, respectively, to lower their output impedances by negative feedback, and together with the transformer 4099, to balance the input power in the power transistors 4022, 4024. As noted herein, this balancing can maximize the neutral voltage potential and increase transistor lifetime. Many types of transformers can be used including ferrite core transformers, for example.

In certain configurations, the output power of the power transistor is typically a product of DC supply voltage (VDD) and DC drain current (ID) multiplied by the efficiency. The same amount of output power can be generated by a combination of a higher voltage and a lower current or a lower voltage and a higher current. An excessively high voltage can cause transistor breakdown failure, and an overly high current can cause transistor meltdown failure. In certain instances, the voltage and current of the power devices can be independently adjustable to maximize the safety margin from voltage breakdown or current meltdown. While not required, it may be simpler to change the voltage rather than changing the current as current is dependent on the variable plasma impedance which is dependent on the sample, the input power to the power devices, and the device bias voltage (e.g., gate bias voltage at the input). In the circuits described herein, the bias current and voltage of the driver devices can each be adjusted to increase or decrease the feedback signal amplitude (i.e., input power to the power devices). As a result, by controlling both the voltage and currents of the power transistors in the RF generator desirable attributes can be achieved including, but not limited to, controlling voltage and currents to operate optimally and/or to compensate for over-voltage or over-current operation due to the changes of the plasma impedance. In many configurations, the driver devices are operating at a much smaller signal level compared to the power devices, so changing the current and voltage of the driver devices will not typically affect the overall efficiency of the plasma generator, which can be as high as 75% or more.

Certain specific examples are described below to illustrate further some of the novel aspects, embodiments and features described herein.

EXAMPLE 1

Figure 27:
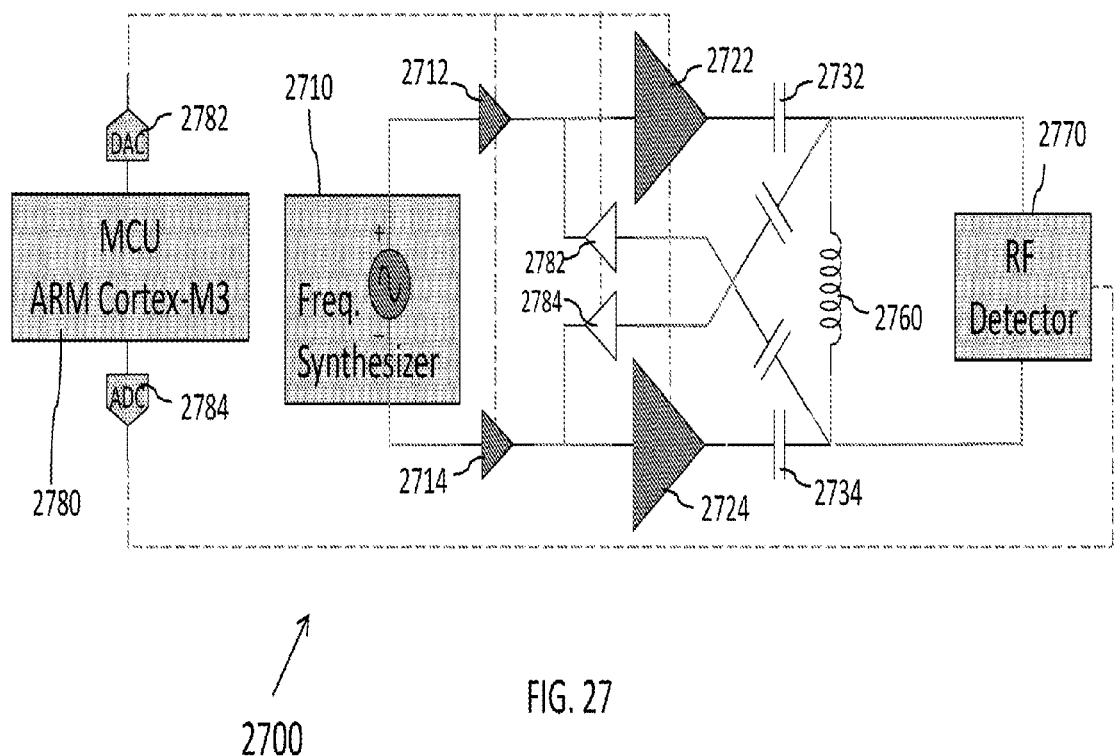
FIG. 27 is a circuit of a generator suitable for operation in a driven mode and in an oscillation mode and being operated in the driven mode, in accordance with certain examples.

A circuit was constructed as shown in FIG. 27 to test driven and oscillation modes. The circuit 2700 includes a signal source 2710, e.g., a frequency synthesizer, a VCO, a phase locked loop, a numeric control oscillator (NCO), or an NCO that is part of a phase locked loop. The source 2710 is electrically coupled to a pair of amplifiers 2712, 2714. The amplifiers 2712, 2714 are each electrically coupled to another set of power amplifiers 2722, 2724, respectively, and a load coil 2760 through capacitors 2732, 2734, respectively. The power amplifiers 2722, 2744 were designed with sufficient RF output power for generating/sustaining the plasma. Control signals were present between the processor 2780 and the amplifiers 2722, 2724. The frequency provided to the load coil 2760 from the frequency synthesizer 2710 was scanned and tuned to a frequency which maximized the coil voltage. A RF detector 2770, which is electrically coupled to a processor 2780 through signal converters 2782, 2784, may be used to monitor the RF signals provided to the load coil 2760. As noted herein, the RF detector 2770 may be replaced with a photosensor to monitor plasma ignition. The plasma was ignited by enabling the signal source 2710 and the amplifiers 2712, 2714, 2722 and 2724 to power the coil 2760 in a driven mode. The RF detector 2770 was used to monitor the plasma. A microcontroller 2780 (MCU ARM Cortex-M3) was used to receive signals from the RF detector through an analog-to-digital converter 2784 and to send control signals to the amplifiers 2712, 2712, 2722 and 2744 through a digital-to-analog converter 2782.

Figure 28:
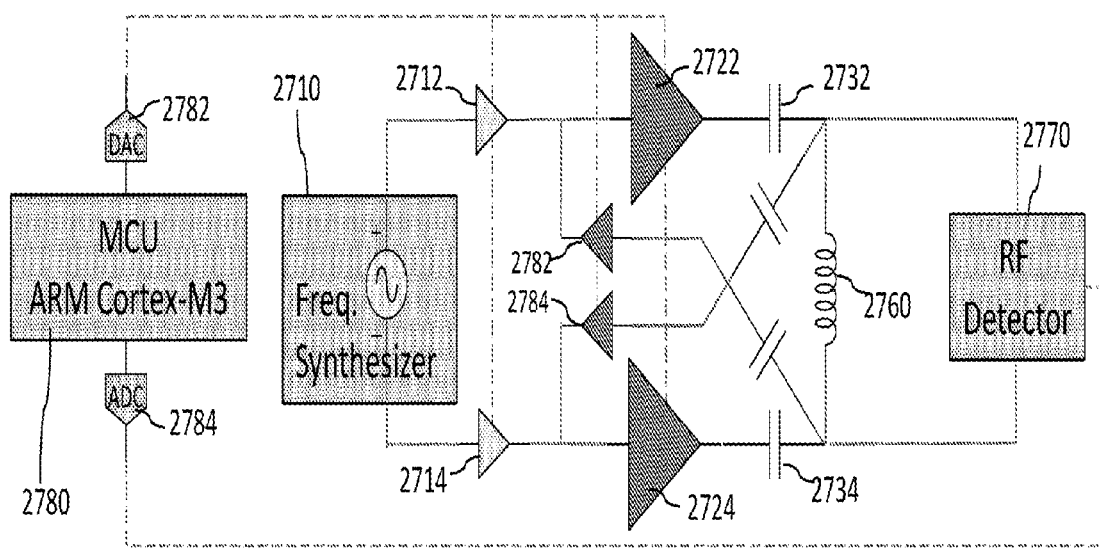
FIG. 28 is the circuit of FIG. 27 being operated in the oscillation mode, in accordance with certain examples.

After the plasma was ignited and a desired voltage level is detected using the RF detector 2770, the generator was switched from the driven mode to the oscillation mode as shown in FIG. 28. The processor 2780 disabled the amplifiers 2712, 2714 and enabled the feedback amplifiers 2782, 2784 to switch from the driven mode to the oscillation mode. At some period (in a hybrid mode), all of the amplifiers were enabled during transition from the driven mode to the oscillation mode. Once in the oscillation mode, the impedance of the circuit may be adjusted rapidly to match impedance changes in the plasma, which becomes parts of the circuit, as sample and solvent is introduced into the plasma.

EXAMPLE 2

The generator of Example 1 was used in combination with a single quadrupole mass filter spectrometer to measure the peak shapes of various elements. A copper load coil from a NexION instrument was used as the induction device. The other components of the NexION system were also used to perform the measurements. A frequency of 40 MHz was used.

Figure 29:
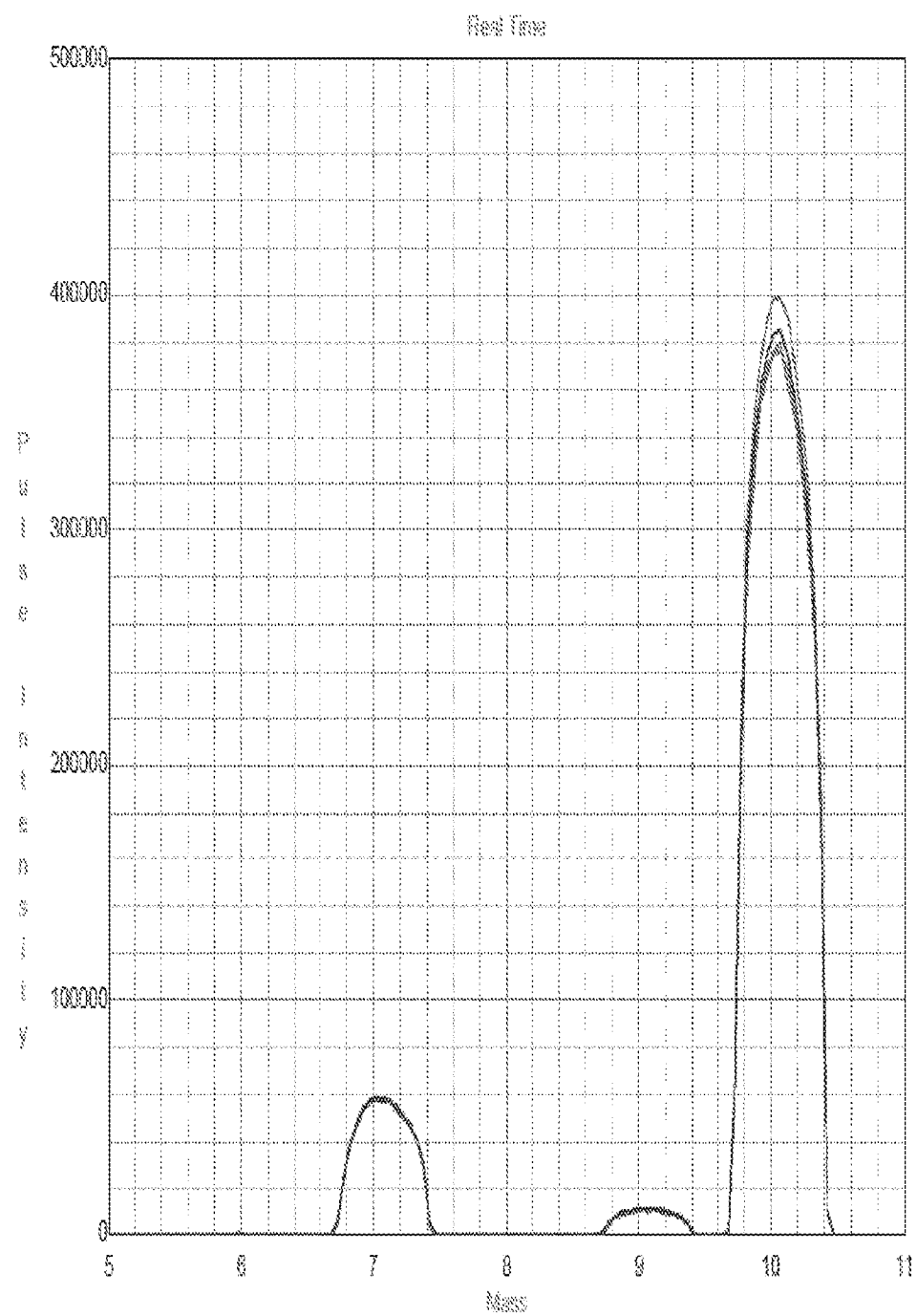
FIG. 29 shows a spectrum for lithium and beryllium obtained using the generator and the mass spectrometer, in accordance with certain examples.

FIG. 29 shows a spectrum for lithium and beryllium obtained using the generator and the mass spectrometer using lithium and beryllium standards.

Figure 30:
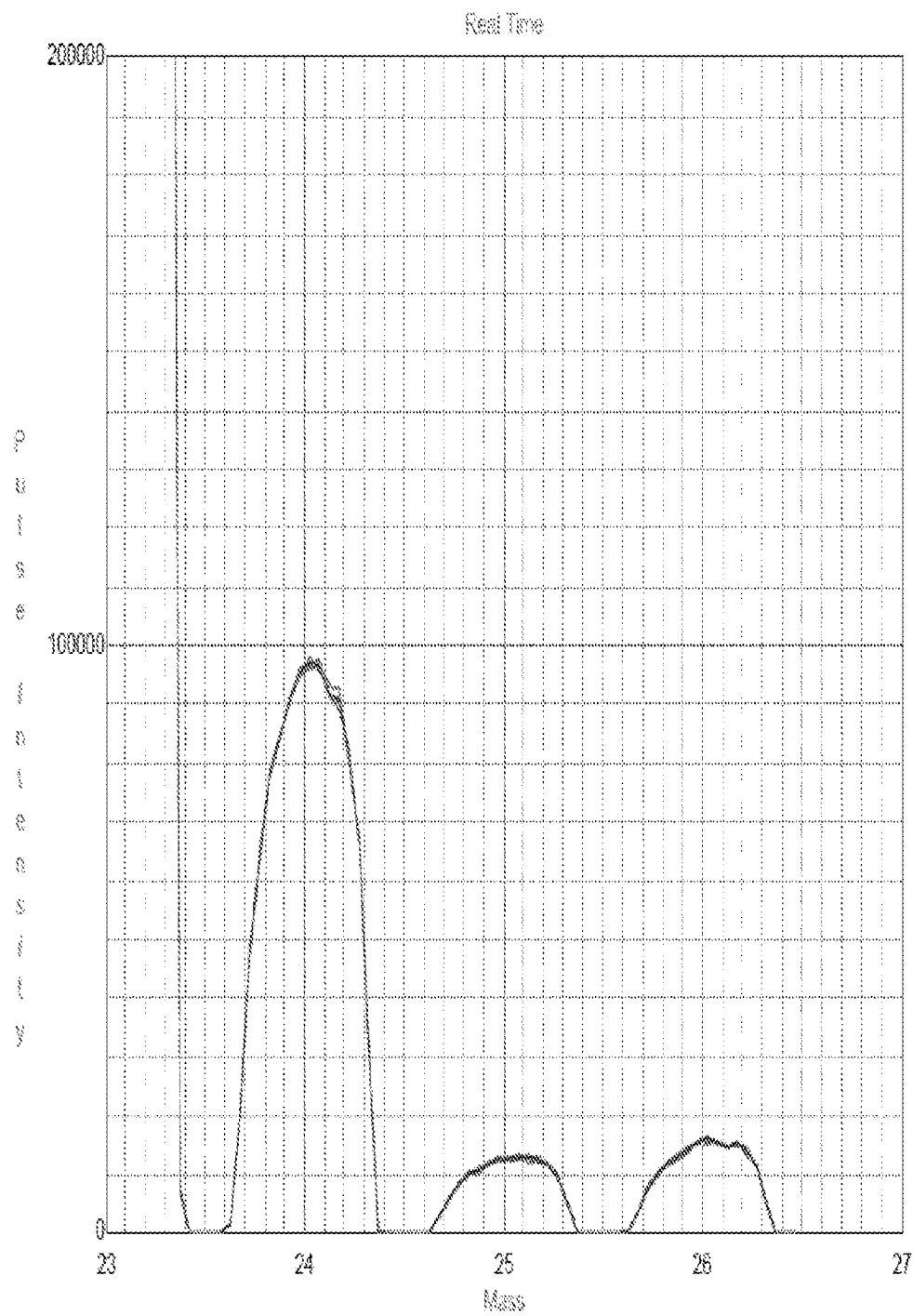
FIG. 30 shows a spectrum for magnesium obtained using the generator and the mass spectrometer, in accordance with certain examples.

FIG. 30 shows a spectrum for magnesium obtained using the generator and the mass spectrometer using a magnesium standard.

Figure 31:
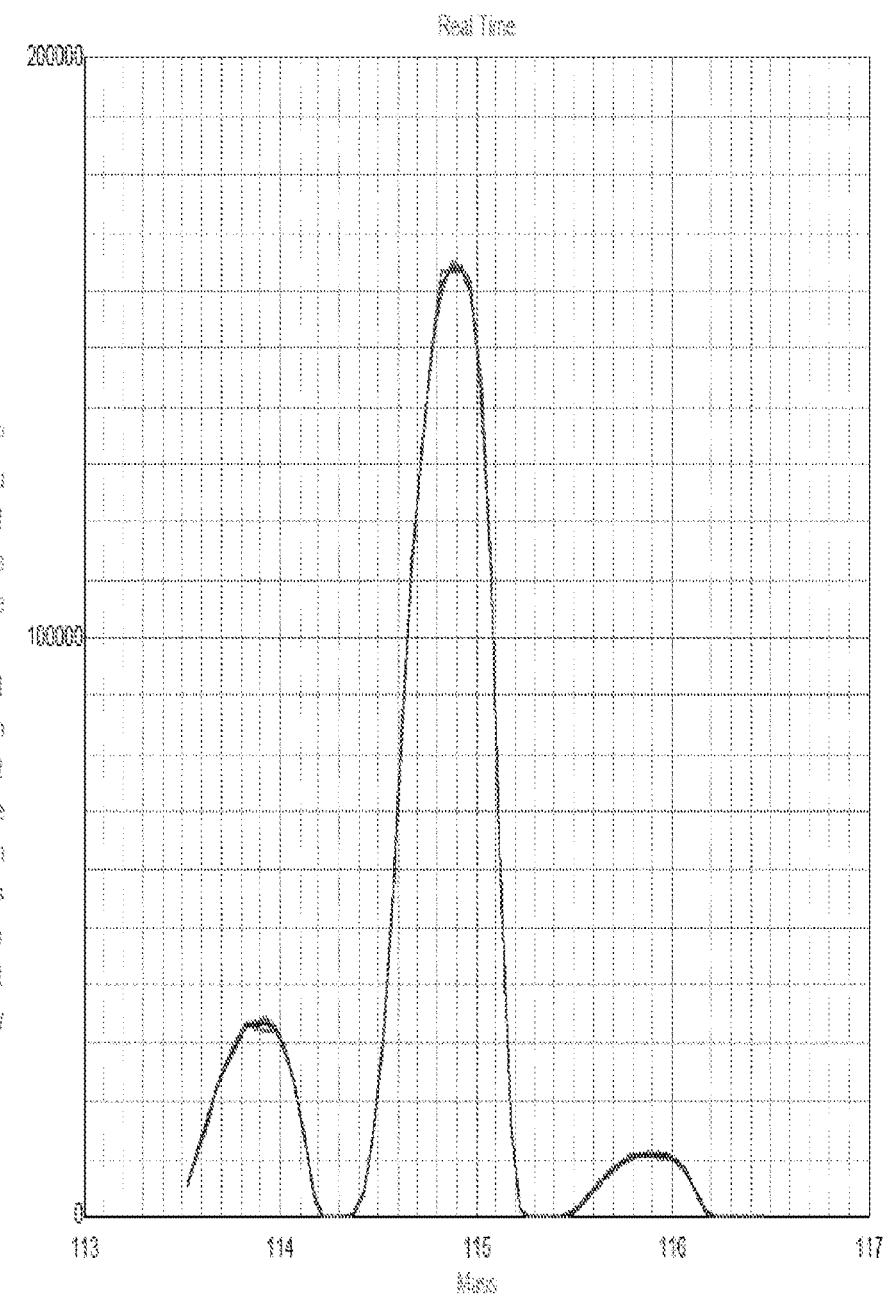
FIG. 31 shows a spectrum for indium obtained using the generator and the mass spectrometer, in accordance with certain examples.

FIG. 31 shows a spectrum for indium obtained using the generator and the mass spectrometer using a indium standard.

Figure 32:
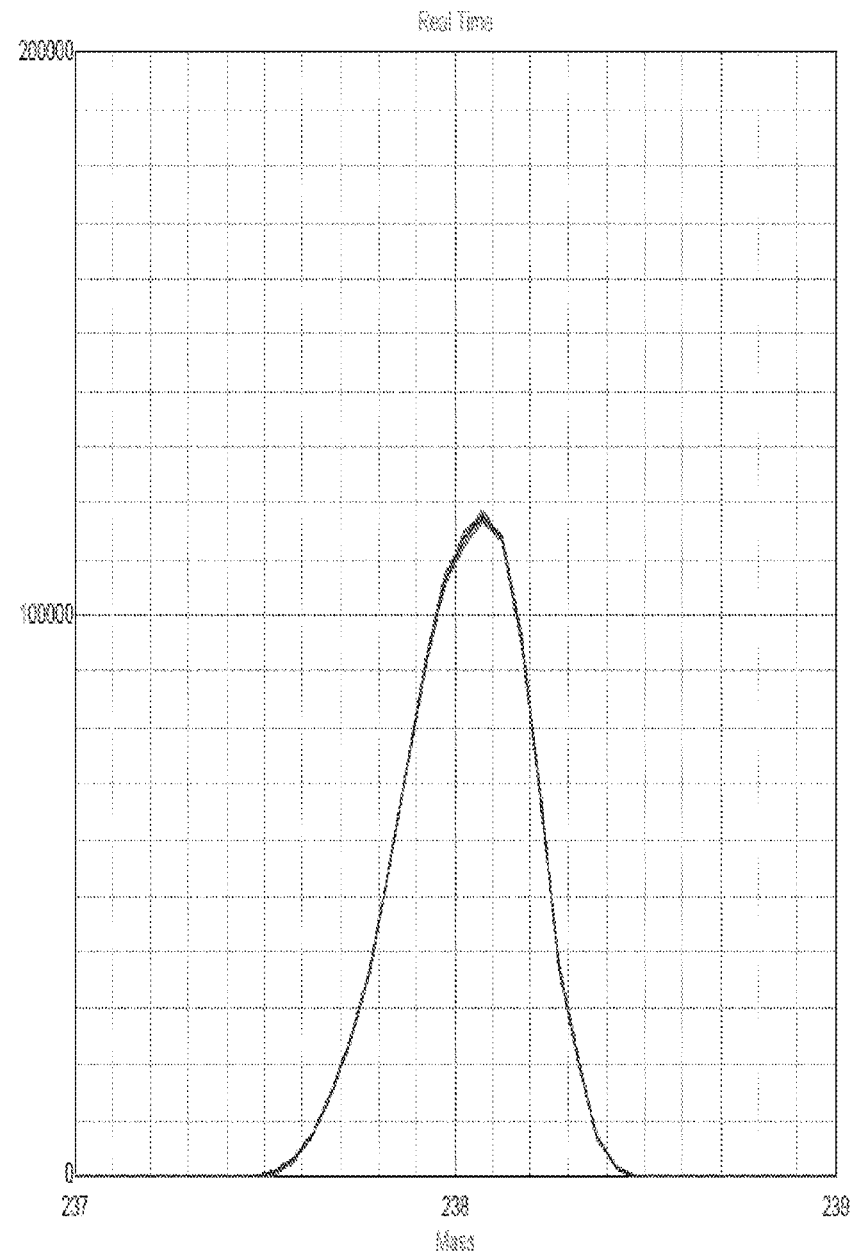
FIG. 32 shows a spectrum for uranium-238 obtained using the generator and the mass spectrometer, in accordance with certain examples.

FIG. 32 shows a spectrum for uranium-238 obtained using the generator and the mass spectrometer using a U-238 standard.

Figure 33:
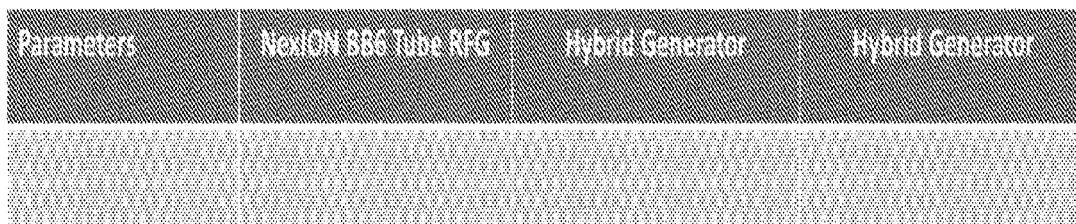
FIG. 33 is a table comparing the results obtained using the hybrid generator (driven mode and oscillation mode) and a standard NexION instrument, in accordance with certain examples.

FIG. 33 includes a table comparing the measurements of the elements using the standard NexION instrument to those of the hybrid generator in a driven mode and in an oscillation mode. The oscillation measurements using the hybrid generator are similar to or better than those obtained with the NexION generator. For certain elements (Be, Mg), the driven mode using the hybrid generator provided better results than the oscillation mode.

EXAMPLE 3

Figure 34:
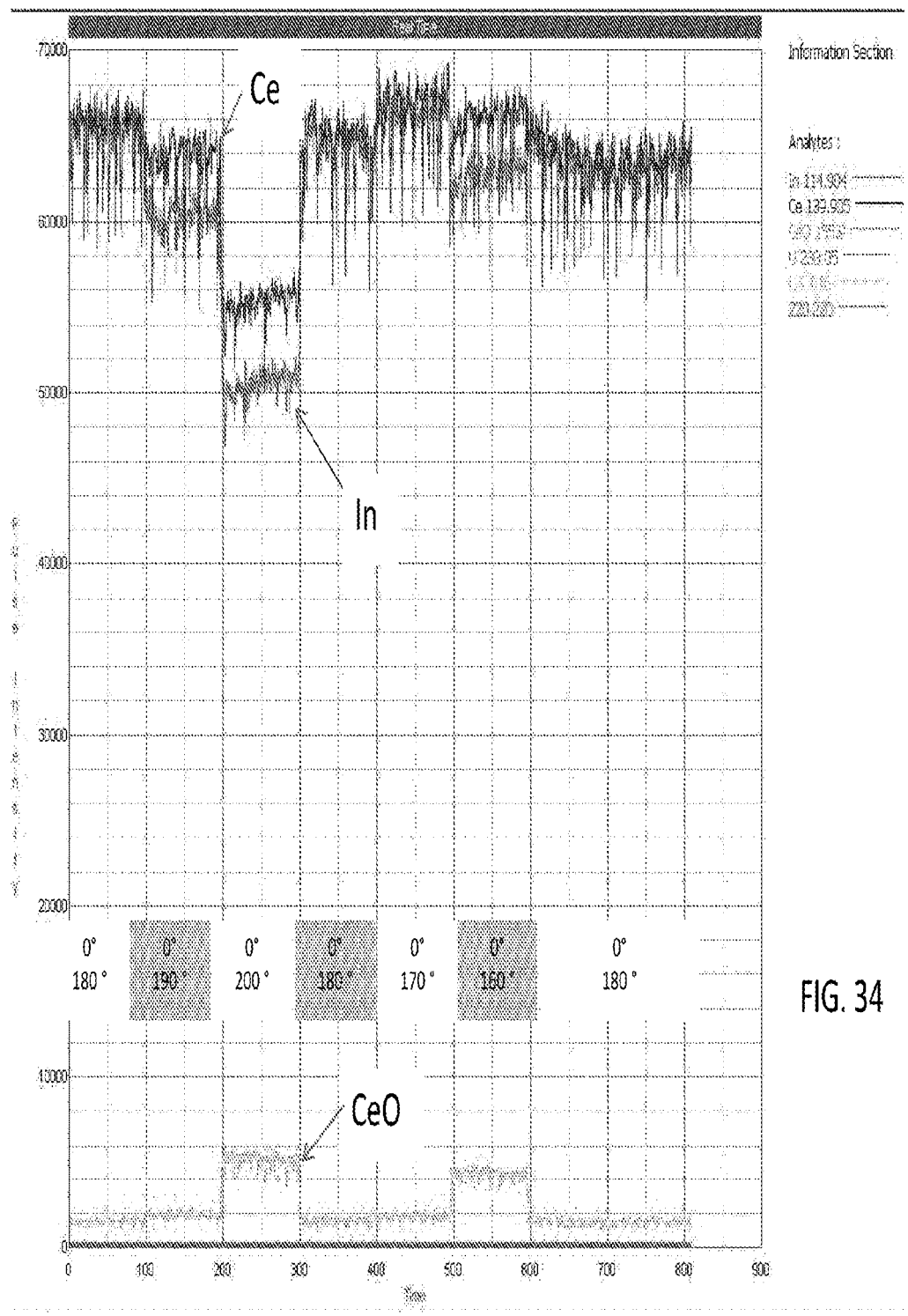
FIG. 34 is a graph of intensity versus time for indium, cerium, cerium oxide and uranium as the differential phase is imbalanced, in accordance with certain examples.

The hybrid generator was imbalanced to test its stability. The null point (virtual ground was electronically moved along the load coil by unbalancing the driven differential signal amplitude and phase at 34.44 MHz using the processor. Phase balance can affect sensitivity, including the oxide ratio, and amplitude balance can also affect sensitivity. The various phases used at different times are shown in FIG. 34.

The best signal was observed when the generator was differentially driven (0, 180 degrees) with a phase mirror within about 5 degrees (see top two curves in FIG. 34, which represent the Ce signal (top curve) and the In signal (curve below top curve)). A phase error of about 20 degrees increased the oxide ratio substantially (see CeO curve toward the bottom of the chart above the x-axis).

EXAMPLE 4

The measurements performed in Example 2 were repeated using slightly different frequencies. The results are shown in the table of FIG. 35. The oscillation mode of the hybrid generator provides results similar to those of the standard NexION generator. The slight increase in frequency used (35.96 MHz) in the oscillation mode compared to that frequency (34.7 MHz) used to obtain the measurements of FIG. 33 results in the oscillation mode providing better results than the driven mode for all elements measured.

EXAMPLE 5

Figure 37:
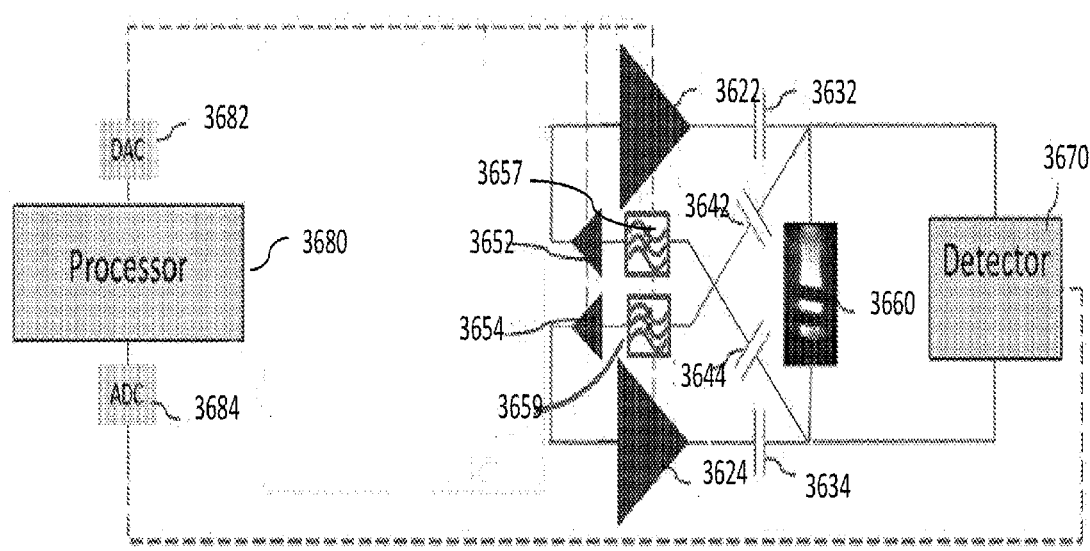
FIG. 37 is an illustration showing low-pass filters that can be used, for example, to filter the feedback signal to suppress high harmonics, in accordance with certain configurations.
Figure 41:
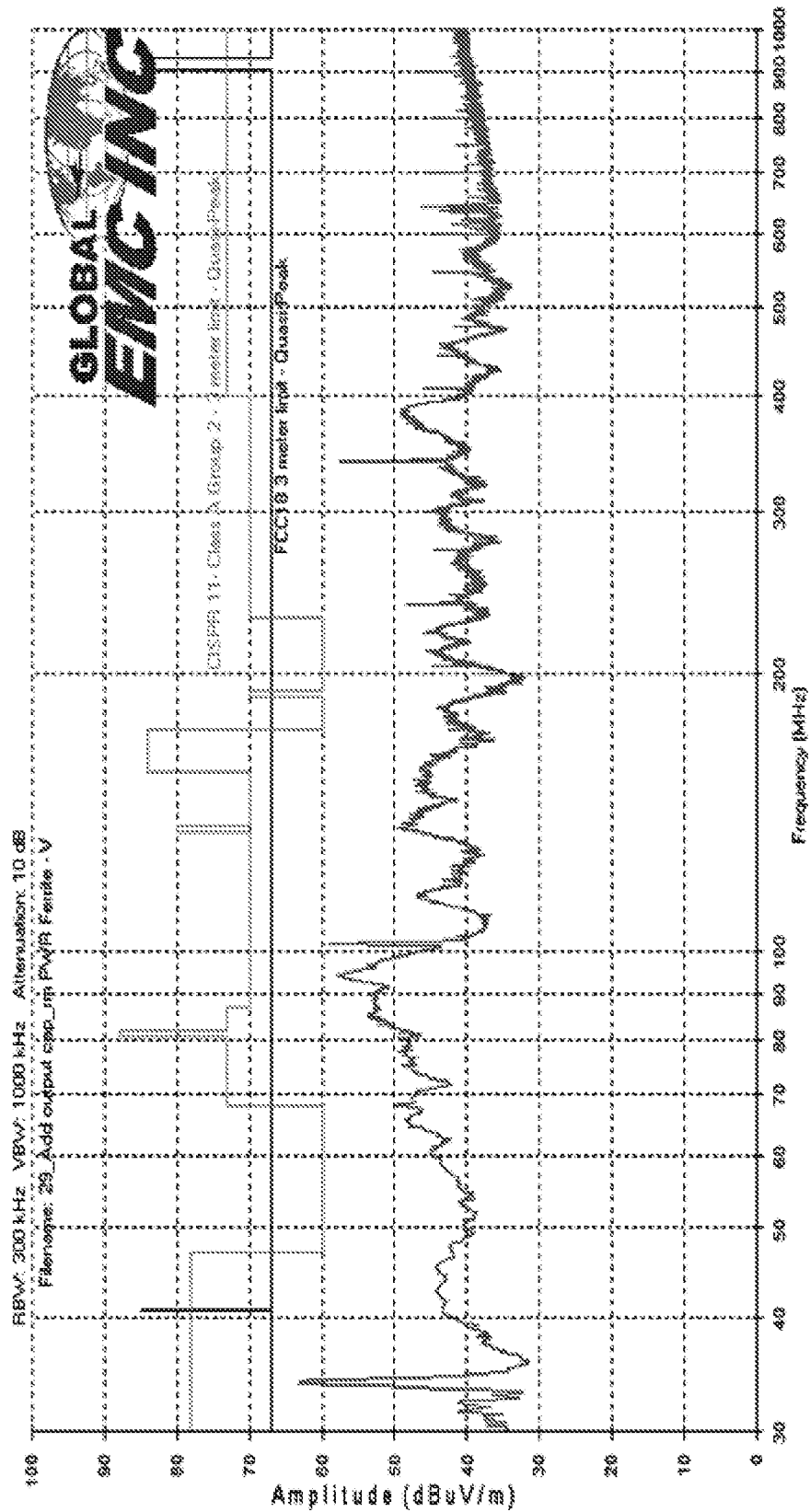
FIG. 41 is a graph showing the emission of a 34 MHz plasma generator at the harmonics (multiples of 34 MHz), in accordance with certain configurations.

A generator comprising an oscillation circuit as shown in FIGS. 37 and 38 was tested. The generator did not include a driven mode or any driven mode circuitry. Power transistors capable of 1 Kw power output at 230 MHz were used. As shown in FIG. 41, the emission of a 34 MHz plasma generator at the harmonics (multiples of 34 MHz) is relatively clean across a wide spectrum up to 1 GHz.

EXAMPLE 6

The generator of Example 5 was tested to verify its ability to balance the power. One of the feedback signals was removed entirely by removing capacitor 3642 from the circuit. Both power transistors 3622, 3624 were still driven due to the power balancing, and the plasma could still be sustained. The circuit can provide for excellent power matching typically to within about 4% current difference.

When introducing elements of the examples disclosed herein, the articles "a," "an," "the" and "said" are intended to mean that there are one or more of the elements. The terms "comprising," "including" and "having" are intended to be open-ended and mean that there may be additional elements other than the listed elements. It will be recognized by the person of ordinary skill in the art, given the benefit of this disclosure, that various components of the examples can be interchanged or substituted with various components in other examples.

Although certain aspects, examples and embodiments have been described above, it will be recognized by the person of ordinary skill in the art, given the benefit of this disclosure, that additions, substitutions, modifications, and alterations of the disclosed illustrative aspects, examples and embodiments are possible.

The invention claimed is:

1. A system comprising:
an induction device; and
a generator electrically coupled to the induction device and configured to sustain an inductively coupled plasma in a torch body, the generator comprising a processor and an oscillation circuit electrically coupled to the processor, the oscillation circuit configured to provide power to the induction device in an oscillation mode to sustain the inductively coupled plasma in the torch body, wherein the circuit is further configured to provide harmonic emission control during sustaining of the inductively coupled plasma in the torch body in the oscillation mode of the generator.

2. The system of claim 1, in which the circuit comprises a first transistor and a second transistor each electrically coupled to the induction device.

3. The system of claim 2, in which the circuit further comprises a first driver electrically coupled to the first transistor and electrically coupled to the induction device.

4. The system of claim 3, in which the first driver is electrically coupled to the induction device through a first low pass filter.

5. The system of claim 4, in which the circuit further comprises a second driver electrically coupled to the second transistor and electrically coupled to the induction device.

6. The system of claim 5, in which the second driver is electrically coupled to the induction device through a second low pass filter.

7. The system of claim 6, in which each of the first low pass filter and the second low pass filter is configured to filter a feedback signal provided to the first power transistor and the second power transistor.

8. The system of claim 7, in which each of the first low pass filter and the second low pass filter comprise a high order ceramic low-pass filter.

9. The system of claim 8, in which the high order ceramic low pass filter is configured to provide at least a 20 dB cut off at 200 MHz or higher frequencies.

10. The system of claim 1, in which the circuit is configured to provide impedance matching within about three RF cycles.

11. The system of claim 1, further comprising a detector electrically coupled to the processor and configured to determine when the plasma is ignited.

12. The system of claim 11, in which the processor is configured to disable the oscillation circuit if the plasma is extinguished.

13. The system of claim 11, further comprising a signal converter between the processor and the detector.

14. The system of claim 1, in which the induction device comprises an induction coil or a plate electrode.

15. The system of claim 2, in which the oscillation circuit is configured to divide power evenly to the first transistor and the second transistor.

16. The system of claim 15, in which the oscillation circuit is configured to cross couple feedback signals from the induction device to the first transistor and the second transistor to divide the power evenly.

17. The system of claim 16, in which the oscillation circuit comprises a first feedback resistor electrically coupled to the first transistor.

18. The system of claim 17, in which the oscillation circuit comprises a second feedback resistor electrically coupled to the second transistor.

19. The system of claim 18, in which the oscillation circuit comprises a first DC block capacitor electrically coupled to the first transistor.

20. The system of claim 19, in which the oscillation circuit comprises a second DC block capacitor electrically coupled to the second transistor.

* * * * *